United States Patent [19]
Kishii et al.

[11] Patent Number: 6,159,858
[45] Date of Patent: Dec. 12, 2000

[54] SLURRY CONTAINING MANGANESE OXIDE AND A FABRICATION PROCESS OF A SEMICONDUCTOR DEVICE USING SUCH A SLURRY

[75] Inventors: Sadahiro Kishii; Ko Nakamura; Yoshihiro Arimoto; Akiyoshi Hatada; Rintaro Suzuki, all of Kawasaki; Naruo Ueda, Ageo; Kenzo Hanawa, Ichihara, all of Japan

[73] Assignees: Fujitsu Limited, Kawasaki, Japan; Mitsui Mining & Smelting Co., Ltd., Tokyo, Japan

[21] Appl. No.: 08/884,165

[22] Filed: Jun. 27, 1997

Related U.S. Application Data

[63] Continuation-in-part of application No. 08/763,051, Dec. 10, 1996, abandoned, which is a continuation-in-part of application No. 08/677,455, Jul. 2, 1996, abandoned.

[30] Foreign Application Priority Data

| Jul. 4, 1995 | [JP] | Japan | 7-169057 |
| Jun. 11, 1996 | [JP] | Japan | 8-149526 |

[51] Int. Cl.$^7$ ............................................... H01L 21/302
[52] U.S. Cl. ........................ 438/693; 438/751; 438/697; 134/1.3; 216/89
[58] Field of Search .................... 134/1.3; 438/693, 438/751, 697; 216/89

[56] References Cited

U.S. PATENT DOCUMENTS

| 4,405,419 | 9/1983 | Misawa et al. | 204/96 |
|---|---|---|---|
| 4,585,718 | 4/1986 | Uedaira et al. | 429/224 |
| 5,228,886 | 7/1993 | Zipperian | 51/293 |
| 5,389,194 | 2/1995 | Rostoker et al. | 156/636 |
| 5,453,639 | 9/1995 | Cronin et al. | 257/510 |
| 5,468,682 | 11/1995 | Homma | 437/195 |
| 5,474,583 | 12/1995 | Ceikkaya | 51/309 |
| 5,674,107 | 10/1997 | Graebner et al. | 451/28 |
| 5,728,308 | 3/1998 | Muroyama | 216/88 |
| 5,763,325 | 6/1998 | Kishii et al. | 438/693 |
| 5,877,089 | 3/1999 | Kishii et al. | 438/693 |

FOREIGN PATENT DOCUMENTS

| 0 552 055 | 7/1993 | European Pat. Off. |
| 62-052129 | 3/1987 | Japan |
| 3-193627 | 8/1991 | Japan |
| 8-115892 | 5/1996 | Japan |
| 95-702608 | 7/1995 | Rep. of Korea |
| 94/02560 | 2/1994 | WIPO |

OTHER PUBLICATIONS

Sadahiro Kishii et al.; Completely Planarized W Plugs using $MnO_2$ CMP; IEDM 1995—Abstract.
IEDM—International Electron Devices meeting—1995—Washington DC, program.
S. Kishii et al.; Completely Planarized W Plug suing $Mno_2$ CMP; IEDM 1995, Slides Films.
S. Kishii et al., "Completely Planarized W Plugs Using $MnO_2$ C M P," Technical Digest of the International Electron Devices Meeting (IEDM), IEEE, Washington, Dec. 10, 1995, pp. 465–468.
S. Kishii et al., "Wide Feature Dielectric Planarization Using MNO2 Slurry," Digest of Technical Papers, 1996 Symposium on VLSI Technology, Honolulu, Jun. 11, 1996, pp. 74–75.
S. Kishii et al., "Dielectric Planarization using $Mn_2O_3$ Slurry," Proceedings of the 1997 Symposium on VLSI Technology, June 10–12, pp. 27–28.

*Primary Examiner*—Gregory Mills
*Assistant Examiner*—George Goudreau
*Attorney, Agent, or Firm*—Armstrong, Westerman, Hattori, McLeland & Naughton

[57] ABSTRACT

A slurry contains $MnO_2$ or other manganese oxide as a primary component of abrasive particles. Further, a polishing process using such a manganese oxide abrasive and a fabrication process of a semiconductor device using such a polishing process are disclosed.

25 Claims, 37 Drawing Sheets

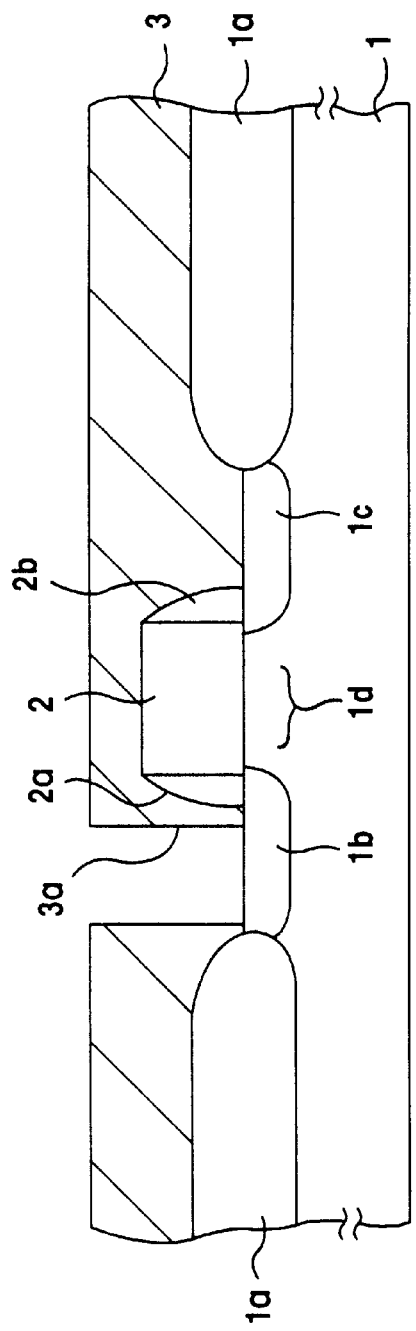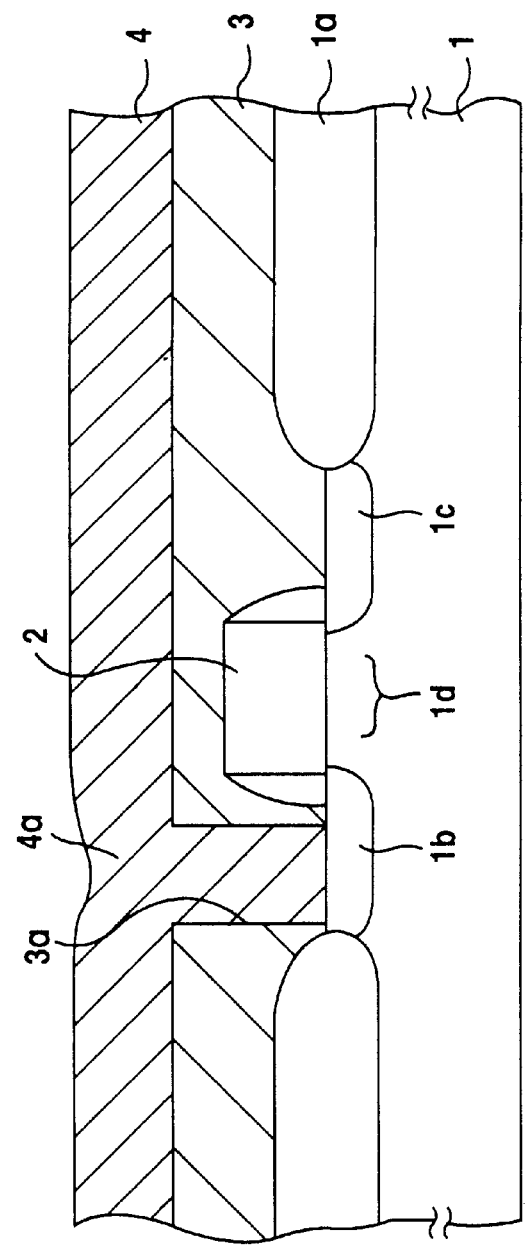

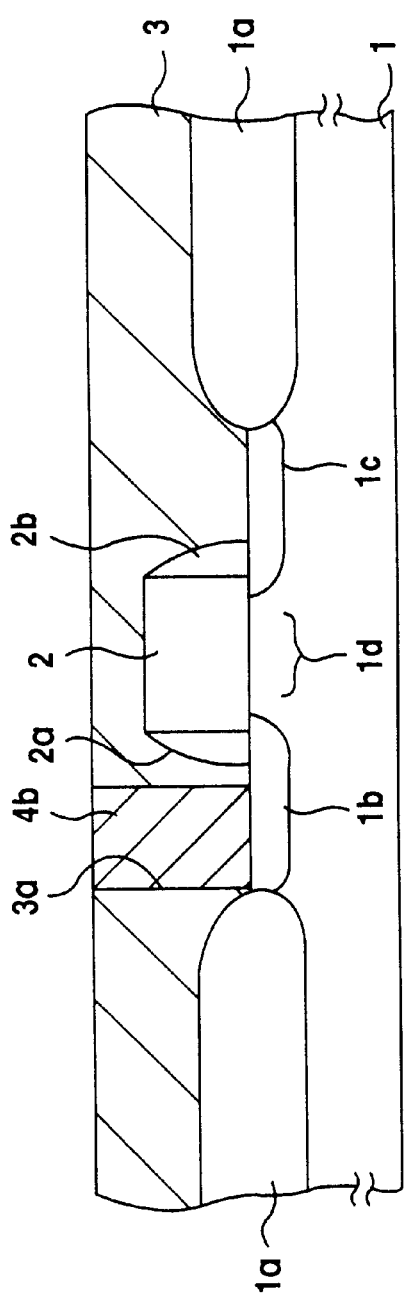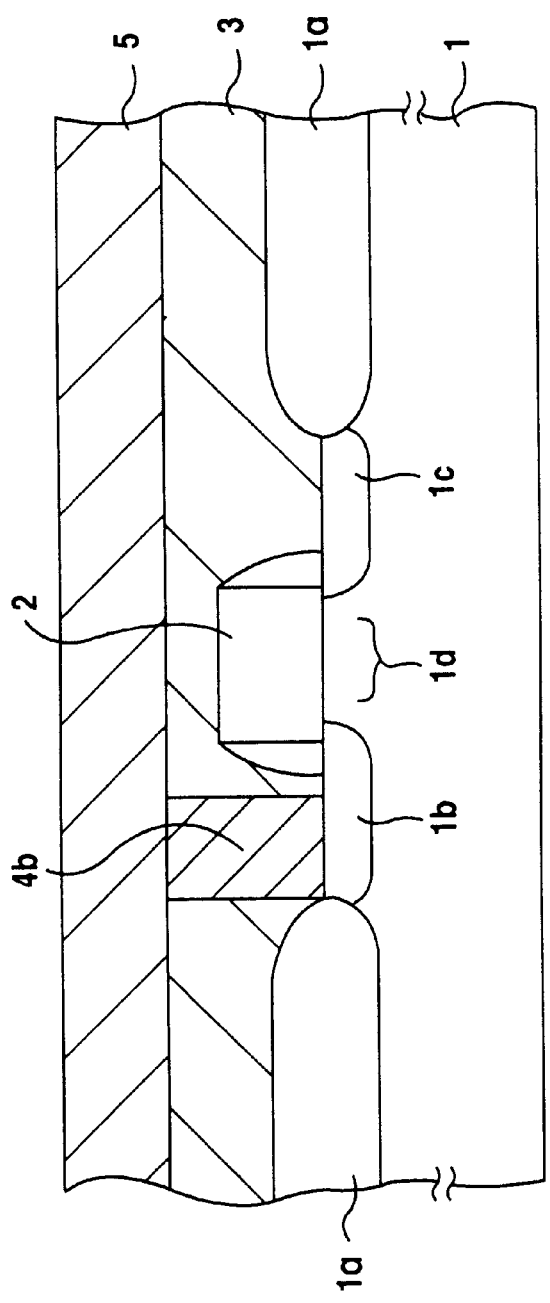
FIG.1E
PRIOR ART
FIG.1F
PRIOR ART

PRIRO ART

PRIRO ART

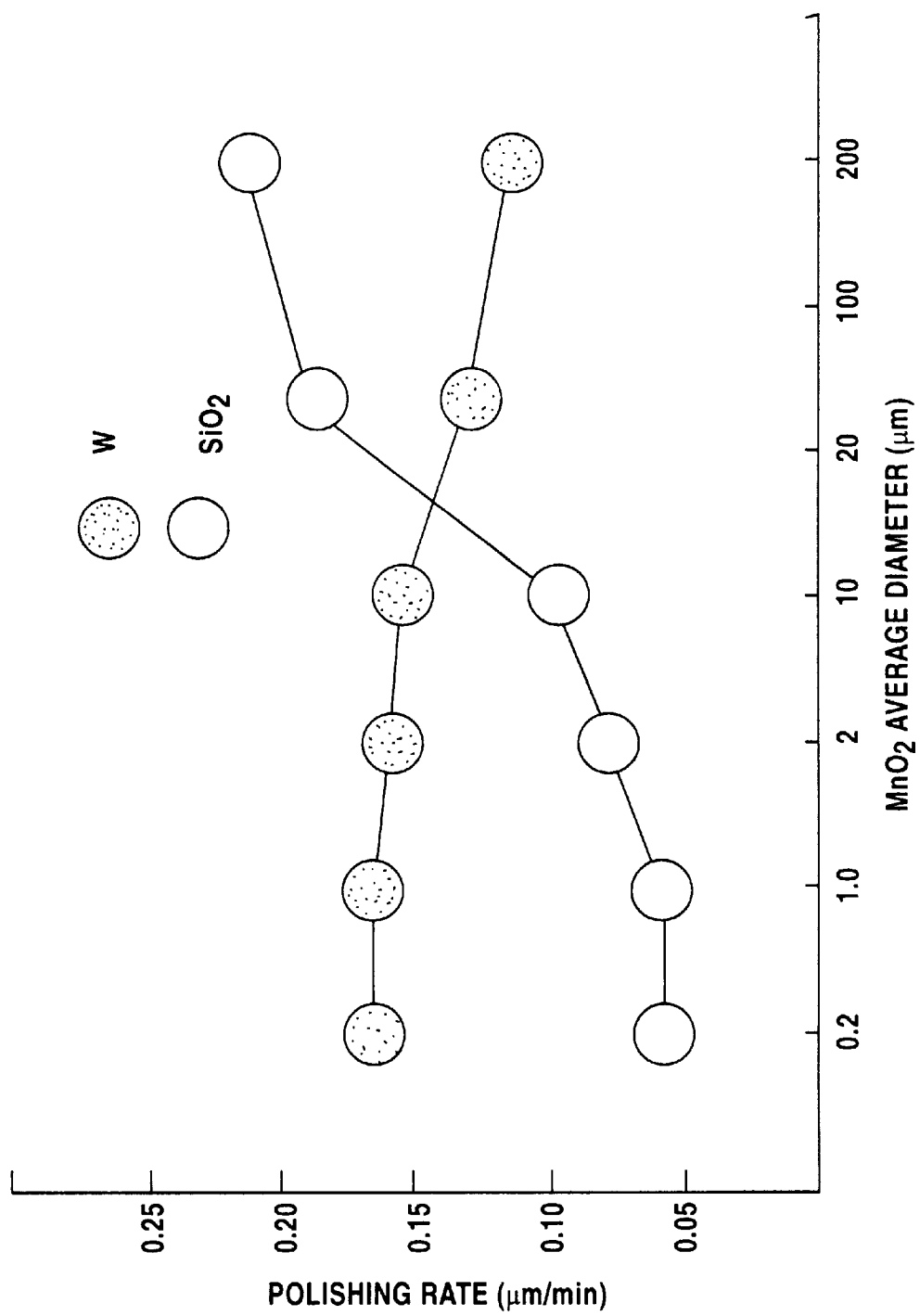

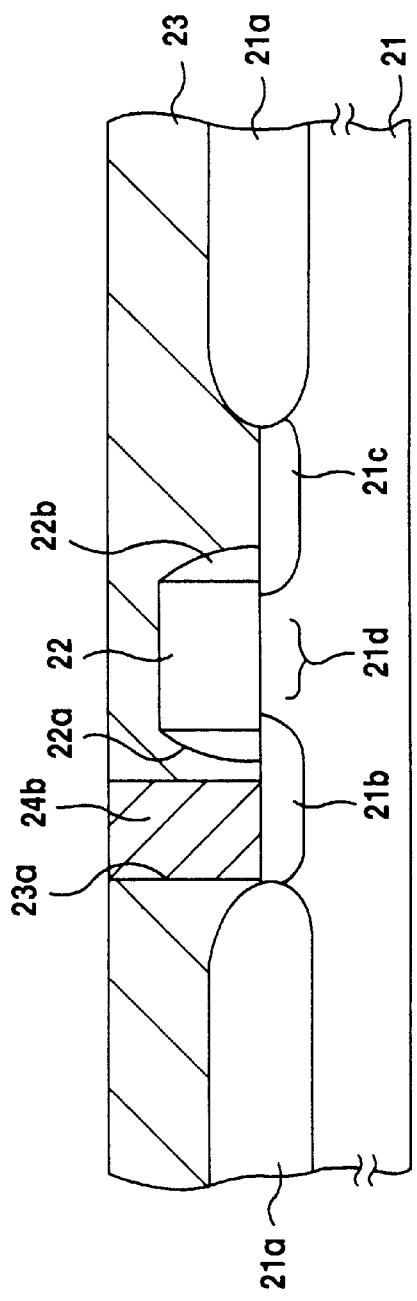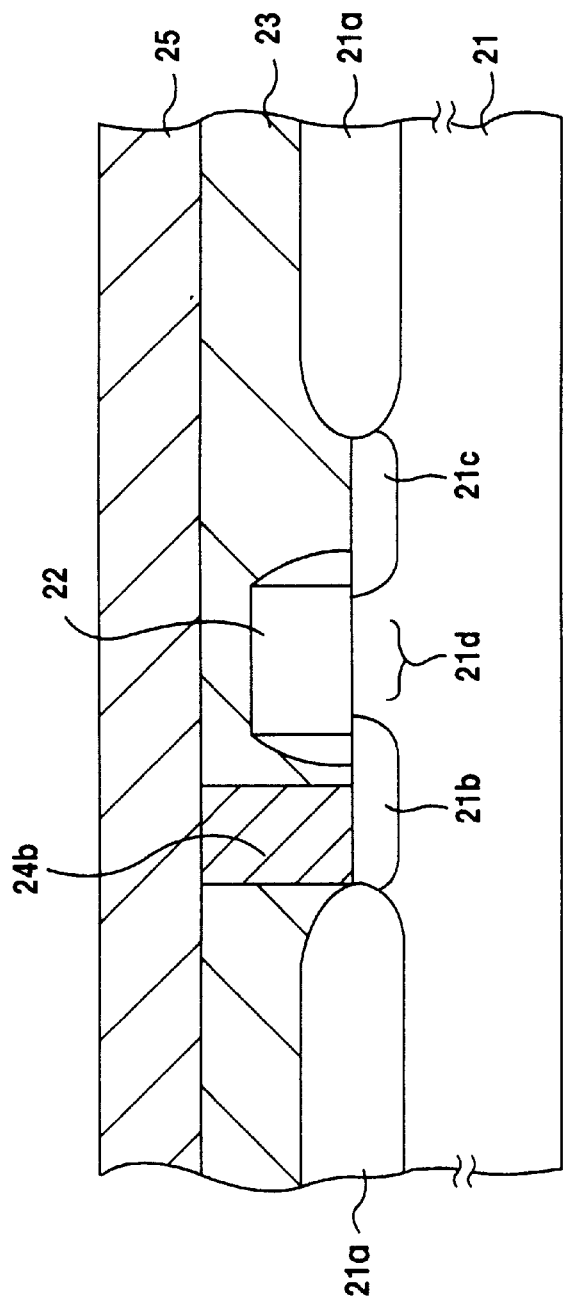
FIG.6E
FIG.6F

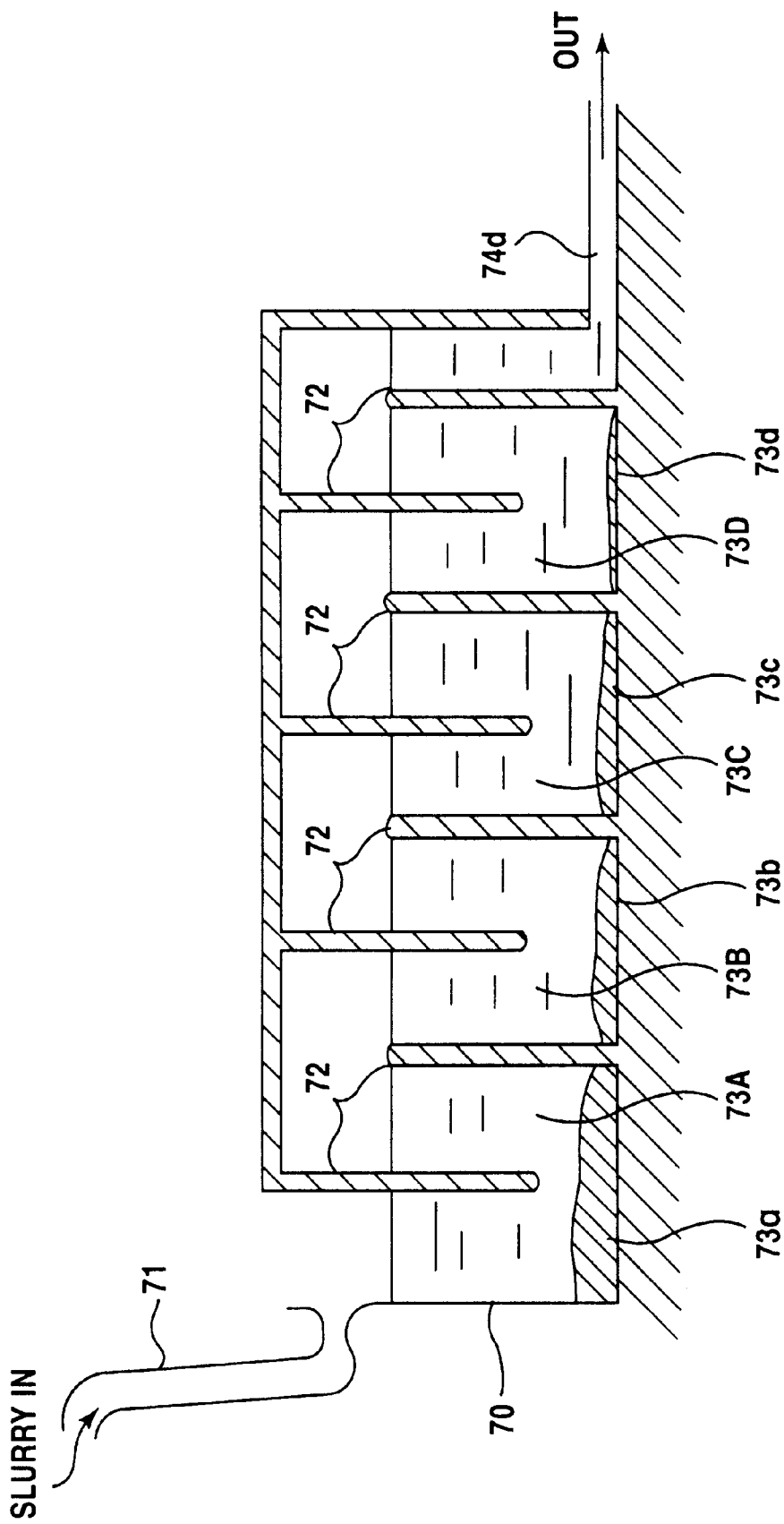

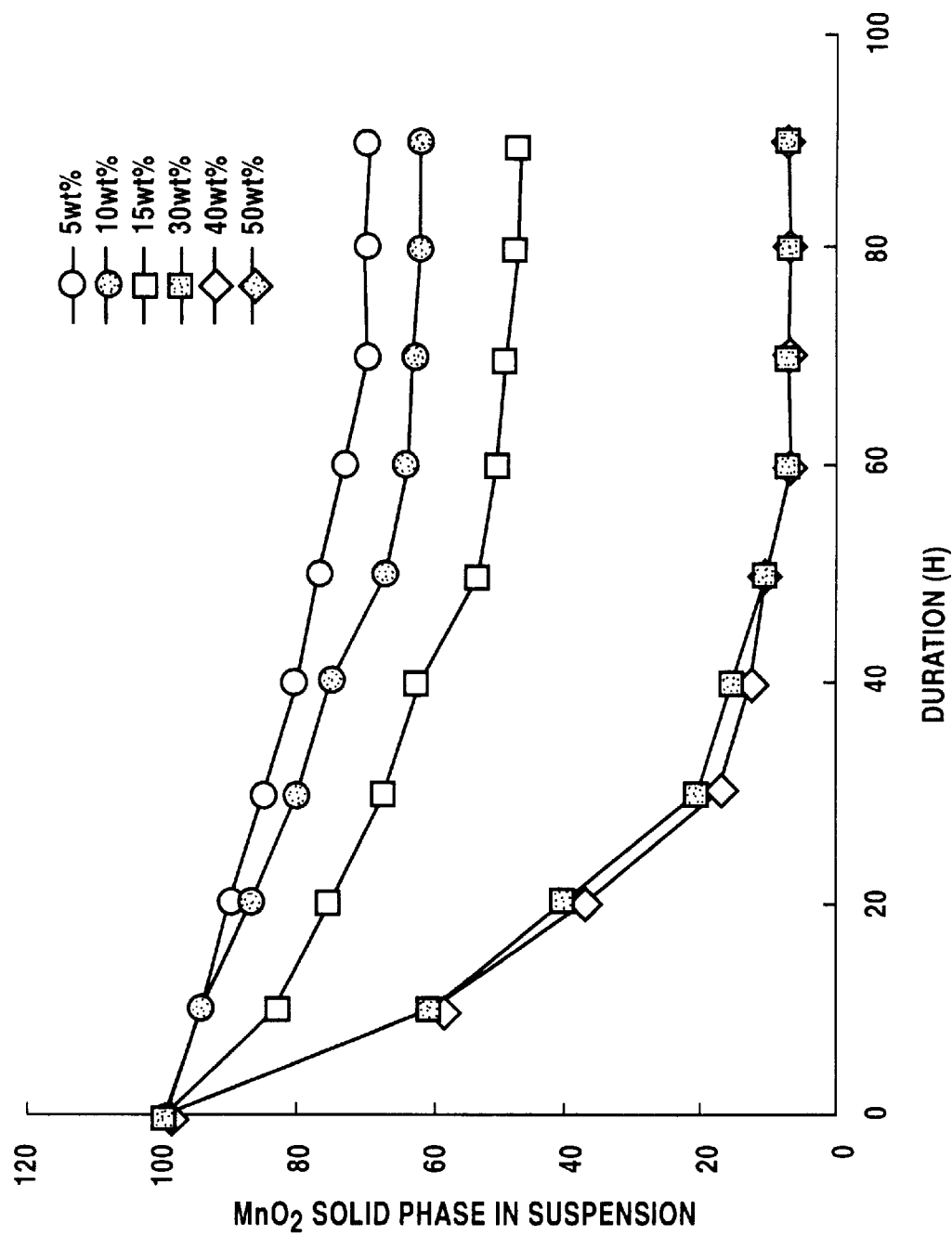

6,159,858

SLURRY CONTAINING MANGANESE OXIDE AND A FABRICATION PROCESS OF A SEMICONDUCTOR DEVICE USING SUCH A SLURRY

CROSS-REFERENCE TO RELATED APPLICATIONS

The present invention is a continuation-in-part application of the U.S. patent application Ser. No. 08/763,051 filed Dec. 10, 1996, now abandoned, which is a continuation-in-part application of the U.S. patent application Ser. No. 08/677,455 filed Jul. 2, 1996, now abandoned.

BACKGROUND OF THE INVENTION

The present invention generally relates to fabrication of semiconductor devices and more particularly to a fabrication method of a semiconductor device including a polishing step as well as a slurry used for such a polishing step.

In semiconductor integrated circuits, a multilayer interconnection structure is used commonly for achieving electric interconnections between various semiconductor devices formed on a common semiconductor substrate. A multilayer interconnection structure generally includes an insulation layer provided on the semiconductor substrate and a wiring pattern embedded in such an insulation layer. As such a multilayer interconnection structure includes a plurality of interconnection layers stacked with each other, it is necessary that each interconnection layer has a flat upper major surface for allowing such a stacking of the interconnection layers thereon.

Thus, it has been practiced conventionally to form such a multilayer interconnection structure by: forming a contact hole or wiring groove on an insulation layer; filling the contact hole or wiring groove by a conductor layer; and polishing the conductor layer until the surface of the insulation layer is exposed. Thereby, a flat surface is guaranteed for each of the interconnection layer, and the formation of another interconnection layer including an insulation layer and a conductor pattern embedded therein, is substantially facilitated.

FIGS. 1A–1J show the process of forming such a multilayer interconnection structure including a polishing step as applied to a fabrication process of a MOS transistor.

Referring to FIG. 1A, the MOS transistor is formed on a Si substrate 1 doped to the p-type in correspondence to an active region 1A defined by a field oxide film 1a. More specifically, the MOS transistor includes a diffusion region 1b of the $n^+$-type formed on the surface of the active region 1A and another diffusion region 1c also of the $n^+$-type formed on the surface of the active region 1A, wherein the diffusion region 1b and the diffusion region 1c are separated from each other by a channel region 1d of the MOS transistor. On the substrate 1, there is provided a gate electrode 2 so as to cover the channel region 1d with an intervening gate oxide film (not shown). Further, the gate electrode 2 carries side wall insulation films 2a and 2b on respective opposing side walls. It should be noted that the diffusion regions 1b and 1c act respectively as a source and a drain of the MOS transistor.

In the step of FIG. 1A, an interlayer insulation film 3 of $SiO_2$ is deposited by a CVD process so as to bury the MOS transistor formed as such, typically with a thickness of about 50 nm. As a result of the deposition of the interlayer insulation film 3, the gate electrode 2 as well as the diffusion regions 1b and 1c are covered by the $SiO_2$ film 3. Thereby, the interlayer insulation film 3 shows a projection and a depression in conformity with the foregoing gate electrode 2 as indicated in FIG. 1A.

Next, in the step of FIG. 1B, the structure of FIG. 1A is planarized by polishing the surface of the insulation film 3 uniformly. Further, in the step of FIG. 1C, the insulation film 3 is subjected to a photolithographic patterning process, in which a contact hole 3a is formed in the interlayer insulation film 3 so as to expose the surface of the diffusion region 1b, and a conductor layer 4 of a metal or alloy such as W, Al or Cu is deposited in the step of FIG. 1D on the structure of FIG. 1C uniformly by a CVD process. As a result, the conductor layer 4 fills the contact hole 3a and the conductor layer 4 contacts with the diffusion region 1b at the foregoing contact hole 3a. As the conductor layer 4 fills the contact hole 3a as noted above, the conductor layer 4 shows a depression on the upper major surface thereof in correspondence to the contact hole 3a.

Next, the conductor layer 4 is polished uniformly, and a structure shown in FIG. 1E is obtained. In the structure of FIG. 1E, it should be noted that a flat surface is obtained in correspondence to the upper major surface of the insulation layer 3. Preferably, the polishing of the conductor layer 4 acts selectively to the metal forming the conductor layer 4 and stops more or less spontaneously upon exposure of the upper major surface of the insulation film 3. As a result of such a polishing, a conductive plug 4b is formed in contact with the diffusion region 1b such that the conductive plug 4b fills the contact hole 3a. As a result of the planarization, achieved by the polishing process, the conductive plug 4b has an upper major surface coincident to the upper major surface of the insulation film 3.

Next, in the step of FIG. 1F, another insulation film 5 of $SiO_2$, and the like, is formed on the planarized structure of FIG. 1E, followed by a photolithographic patterning process, to form a groove 5a as indicated in FIG. 1G, such that the groove 5a exposes the conductive plug 4b. Further, in the step of FIG. 1H, another conductor layer 6, typically formed of a metal or alloy of W, Al, Cu, and the like, is deposited on the structure of FIG. 1G. As a result, a depression 6a is formed on the conductor layer 6 as indicated in FIG. 1H in correspondence to the groove 5a.

Further, the conductor layer 6 is polished in the step of FIG. 1I to form a planarized structure, wherein it will be noted that the groove 5a is filled by a conductor pattern 6b that forms a part of the foregoing conductor layer 6. After the structure of FIG. 1I is thus formed, another insulation film 7 is provided as indicated in FIG. 1J. Thereby, it is possible to form various interconnection patterns on the insulation film 7.

In the foregoing fabrication process, it has been practiced to carry out the polishing steps of FIG. 1E and FIG. 1I on an abrasive cloth of a urethane resin, by using a mixture of $\alpha\text{-}Al_2O_3$ and $H_2O_2$ as the slurry. A typical example of the slurry is MSW-1000 (trade name) supplied from Rodel. When using such a mixture of $\alpha\text{-}Al_2O_3$ and $H_2O_2$ as the slurry, $H_2O_2$ causes an oxidation in the conductor layer to be polished, and the $\alpha\text{-}Al_2O_3$ abrasive particles grind away the oxides formed as a result of the oxidation of the conductor layer.

For example, the grinding of a W layer by means of the foregoing slurry first causes a formation of $W_xO_y$ as a result of the oxidation by $H_2O_2$, while the foregoing oxide ($W_xO_y$) is easily removed by the $\alpha\text{-}Al_2O_3$ grains.

On the other hand, the use of such a conventional slurry, which contains $H_2O_2$, a strong liquid oxidant, causes a problem, when applied to the polishing of a conductor layer such as W or other metal, in that $H_2O_2$ penetrates deeply into the conductor layer 4 filling the contact hole 3a along a seam 4c that is formed in the conductor layer 4 at the time of deposition of the conductor layer 4. Thereby, the polishing of the conductor layer 4, conducted under existence of $H_2O_2$, enlarges the depression from the state of FIG. 2A to the state of FIG. 2B. In other words, there is formed a large and deep depression generally at the center of the conductive plug 4b in correspondence to the foregoing seam 4c as indicated in FIG. 2B, while such a large depression causes a problem of reliability of electrical contact at the contact hole 3a. The problem of formation of the depression in the contact hole as a result of the polishing becomes particularly serious in high density integrated circuits and semiconductor devices in which the diameter of the contact hole 3a is 0.5 $\mu$m or less.

It should be noted that the foregoing seam 4c is formed as a result of abutting of the conductor layers growing from both lateral side walls of the contact hole 3a toward the center of the contact hole when the conductor layer is deposited. Because of the nature of the seam as such, the seam 4c contains a large amount of defects or imperfections and is extremely vulnerable to oxidation by $H_2O_2$. The oxidized part of the plug 4b is easily removed by polishing using abrasive particles such as $\alpha$-$Al_2O_3$.

SUMMARY OF THE INVENTION

Accordingly, it is an object of the present invention to provide a novel and useful process of fabricating a semiconductor device including a polishing step and a slurry used for such a polishing step, wherein the foregoing problems are eliminated.

Another and more specific object of the present invention is to provide a slurry free from fluid oxidant, as well as a fabrication process of a semiconductor device including a polishing step that uses such a slurry.

Another object of the present invention is to provide a slurry comprising:
abrasive particles; and
a solvent in which said abrasive particles are dispersed,
said abrasive particles containing manganese oxide as a primary component.

Another object of the present invention is to provide a fabrication process of a semiconductor device including a step of polishing a conductor layer provided on an insulation layer, comprising a step of:
polishing said conductor layer by using a slurry containing abrasive particles and a solvent,
said abrasive particles containing manganese oxide as a primary component.

According to the present invention, the slurry, which contains manganese oxide as a primary component of the abrasive particles, can successfully and efficiently polish the conductor layer, while the polishing stops spontaneously and exactly upon exposure of the underlying insulation layer.

By using $MnO_2$ for the abrasive particles, in particular, the abrasive particles act as a strong solid oxidant by releasing oxygen, and the conductor layer to be polished is oxidized efficiently. The metal oxide formed as a result of the oxidation is easily removed by a grinding process associated with the polishing process by the abrasive particles.

For example, $MnO_2$ acts upon W according to the reaction

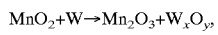

wherein $W_xO_y$ is easily removed as a result of grinding by the $Mn_2O_3$ product or by the unreacted $MnO_2$ abrasive particles. The $M_2O_3$ product or the remaining $MnO_2$ particles, on the other hand, are dissolved later by a cleaning process conducted in hydrogen peroxide and an acid such as HCl, $H_2SO_4$, $HNO_3$, or HF, according to any of the following reactions

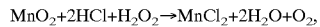

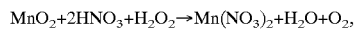

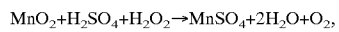

and

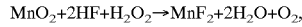

wherein it should be noted that the manganese reaction products such as $MnCl_2$, $Mn(NO_3)_2$, $MnSO_4$ and $MnF_2$, are all soluble in water. Thus, the present invention can effectively minimize the remaining particles and hence the contamination of the semiconductor substrate by Mn.

As the abrasive particles act as an oxidant (solid oxidant) as indicated in the above reaction, the present invention does not require fluid oxidant such as $H_2O_2$ in the solvent. Thereby, the problem of erosion of the seam, caused by the penetration of the fluid oxidant into the seam as in the case of FIG. 2B, is successfully avoided, and a reliable electric contact is achieved. Generally, pure water ($H_2O$) or lower alcohol is used for the solvent. In the foregoing cleaning process, it will be noted that $H_2O_2$ is used, while the concentration of $H_2O_2$ in the cleaning process is less than 2%, which is substantially smaller (about 1/25) than the concentration used conventionally at the time of the polishing process. Thus, no substantial problem of the seam erosion occurs in the cleaning process.

Another object of the present invention is to provide a slurry comprising:
abrasive particles; and
a solvent in which said abrasive particles are dispersed,
said abrasive particles having a composition selected from $Mn_2O_3$, $Mn_3O_4$ and a mixture thereof.

According to the present invention, the slurry acts selectively upon an insulation layer as compared to a conductor or semiconductor layer and is effective for polishing an insulation layer in the fabrication process of a semiconductor device.

Another object of the present invention is to provide a method of fabricating a semiconductor device including a polishing step, comprising the step of:
polishing an insulation layer provided on an underlying layer selectively by a slurry with respect to said underlying layer, said underlying layer being one of a conductor layer and a semiconductor layer;
said slurry comprising: abrasive particles of manganese oxide, selected from a group consisting of $Mn_2O_3$, $Mn_3O_4$ and a mixture thereof; and a solvent in which said abrasive particles are dispersed.

According to the present invention, the polishing step of the insulation layer stops spontaneously upon the exposure of the underlying conductor or semiconductor layer, without using additional polishing stopper layer. The underlying conductor or semiconductor layer itself acts as a polishing stopper. Thereby, the fabrication process such as the fabrication process of shallow trench structure is substantially facilitated.

Another object of the present invention is to provide a method of producing a slurry containing $MnO_2$ as an abrasive, comprising the steps of:

electrolyzing an electrolytic solution containing manganese ions;

pulverizing a body of $MnO_2$ formed on an anode as a result of said electrolyzing step, to form particles of $MnO_2$ as said abrasive.

Another object of the present invention is to provide a method of producing a slurry containing $Mn_2O_3$ as an abrasive, comprising the steps of:

electrolyzing an electrolytic solution containing manganese ions;

heating a body of $MnO_2$ formed on an anode as a result of said step of electrolyzing to a temperature of 500–900° C., to form a body of $Mn_2O_3$; and pulverizing said body of $Mn_2O_3$ to form particles of $Mn_2O_3$ as said abrasive.

Another object of the present invention is to provide a method of producing a slurry containing $Mn_3O_4$ as an abrasive, comprising the steps of:

electrolyzing an electrolytic solution containing manganese ions;

heating a body of $MnO_2$ formed on an anode as a result of said step of electrolyzing to a temperature of 900–1200° C., to form a body of $Mn_3O_4$; and pulverizing said body of $Mn_3O_4$ to form particles of $Mn_3O_4$ as said abrasive.

According to the present invention, high purity abrasives of manganese oxide are obtained by an electrolysis process. Particularly, the $MnO_2$ abrasive particles thus obtained have a $\tau$ (gamma)-phase form of $MnO_2$ and acts as a particularly efficient solid oxidant. Further, the manganese oxide abrasives thus produced can be dissolved into an acid after a use thereof in a CMP process, to reproduce a high purity electrolytic solution. Thereby, the manganese oxide abrasives are reproduced from the electrolytic solution thus reproduced. Further, by applying a heat treatment process to the body of $MnO_2$ obtained as a result of the electrolysis process, it is possible to convert $MnO_2$ to $Mn_2O_3$ or $Mn_3O_4$. By optimizing the pulverizing process, it is possible to maximize the dispersion of the abrasive particles in a solvent in the CMP process.

Other objects and further features of the present invention will become apparent from the following detailed description when read in conjunction with the attached drawings.

BRIEF DESCRIPTION OF THE DRAWINGS

FIGS. 1A–1J are diagrams showing a conventional fabrication process of a semiconductor device including a polishing step;

FIG. 5 is a graph showing the result of the experiment;

FIGS. 6A–6J are diagrams showing a fabrication process of a semiconductor device according to a first embodiment of the present invention;

FIG. 22 is a diagram showing a trap used in the apparatus of FIG. 21 for recovering a slurry after a CMP process; and FIG. 23 is a diagram showing a dispersion of $MnO_2$ abrasives in a slurry for various pulverizing processes of $MnO_2$ according to a ninth embodiment of the present invention.

DETAILED DESCRIPTION OF THE PREFERRED EMBODIMENTS

[First Embodiment]

Figure 3:
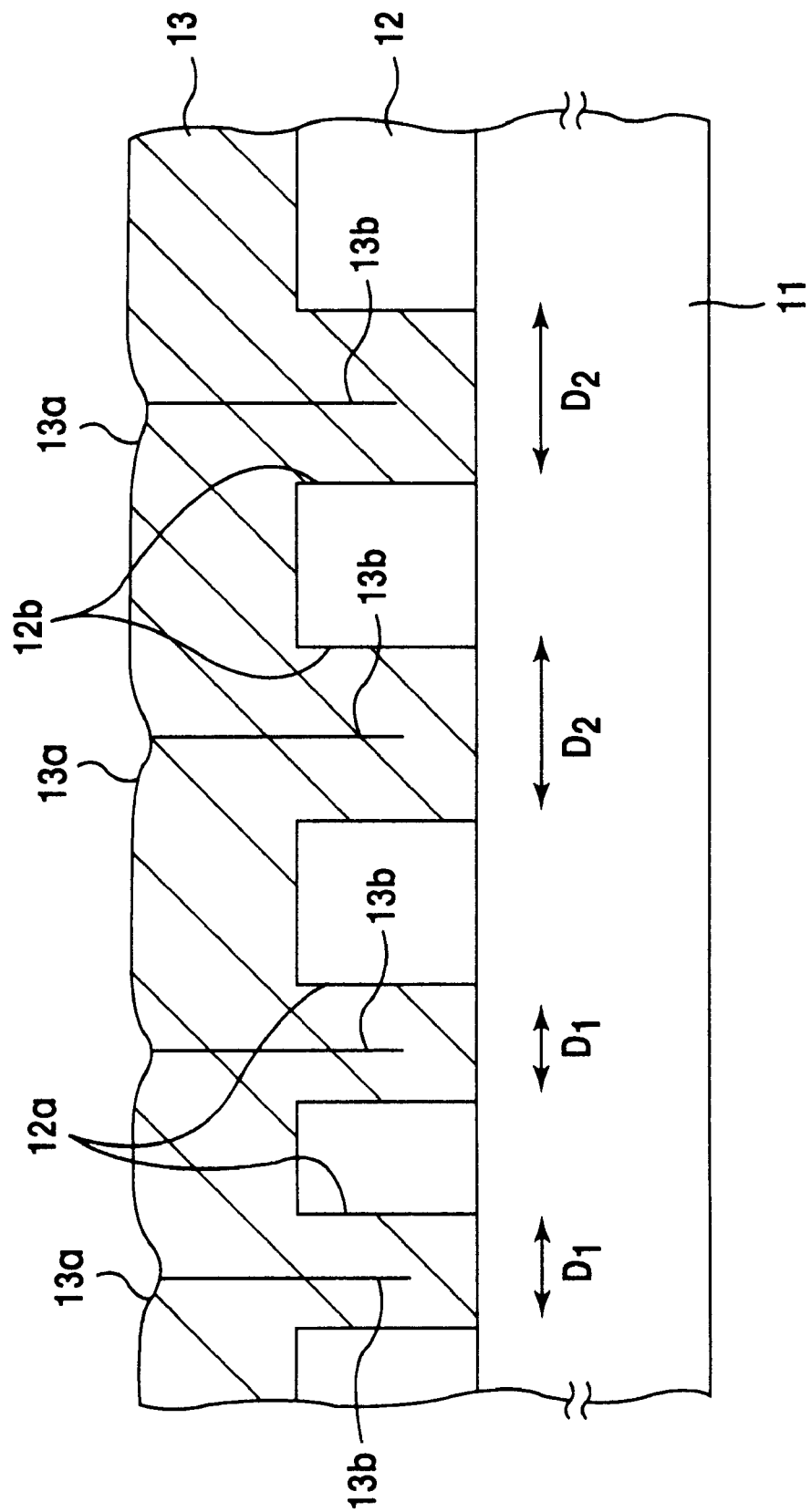
FIG. 3 is a diagram showing the construction of a test piece used in an experiment forming the basis of the present invention for investigating the polishing rate achieved by various slurries.

FIG. 3 shows a test piece used in a first embodiment of the present invention for investigating the performance of various slurries.

Figures 1A, 1B:
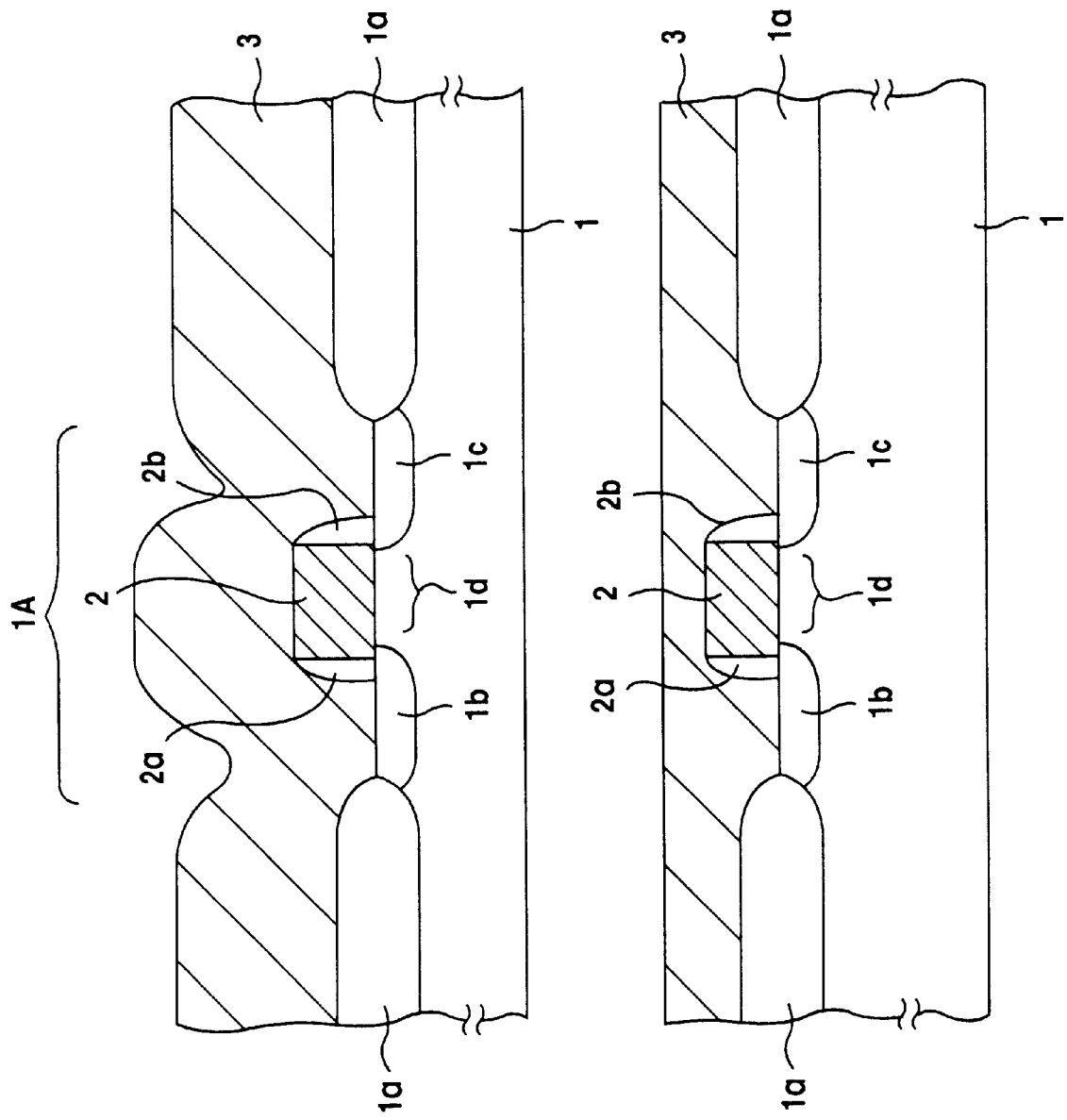
Figure 1G:
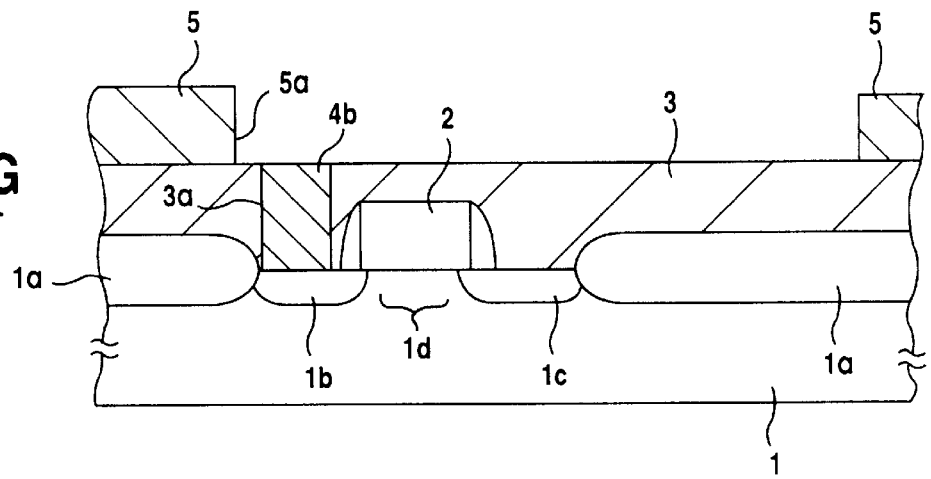
Figure 1H:
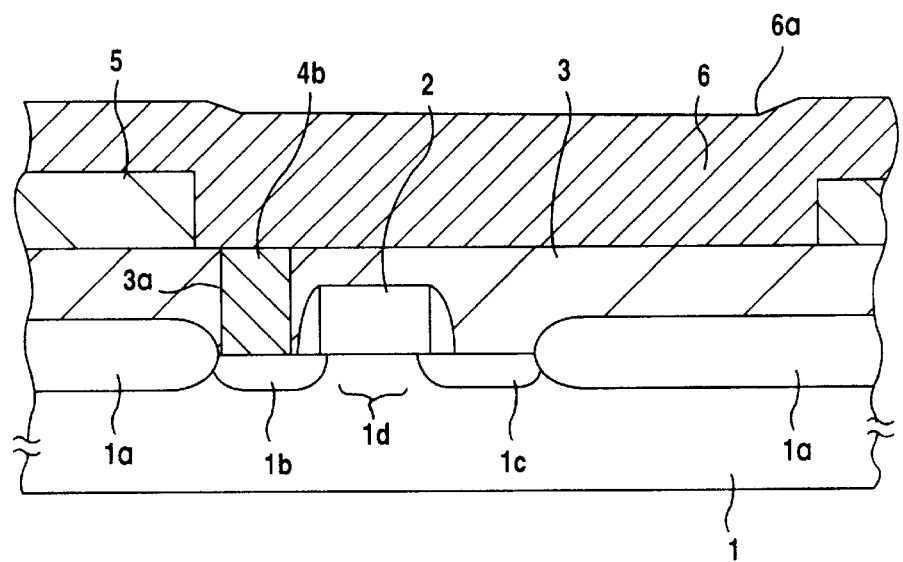
Figure 1I:
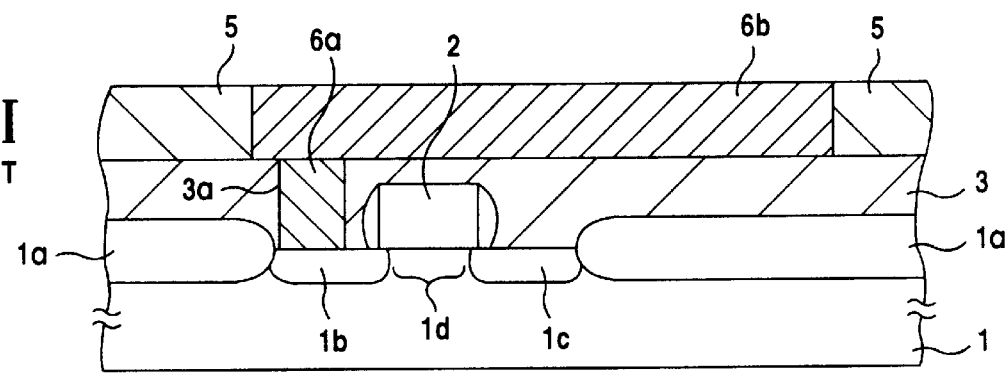
Figure 1J:
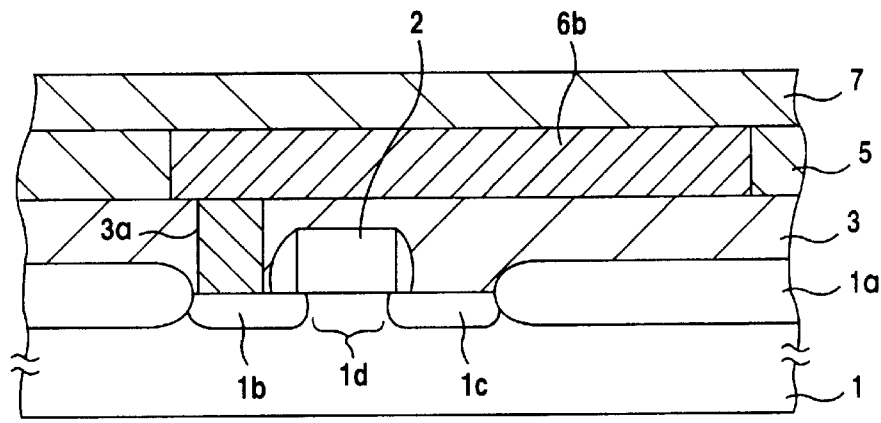
Figure 2A:
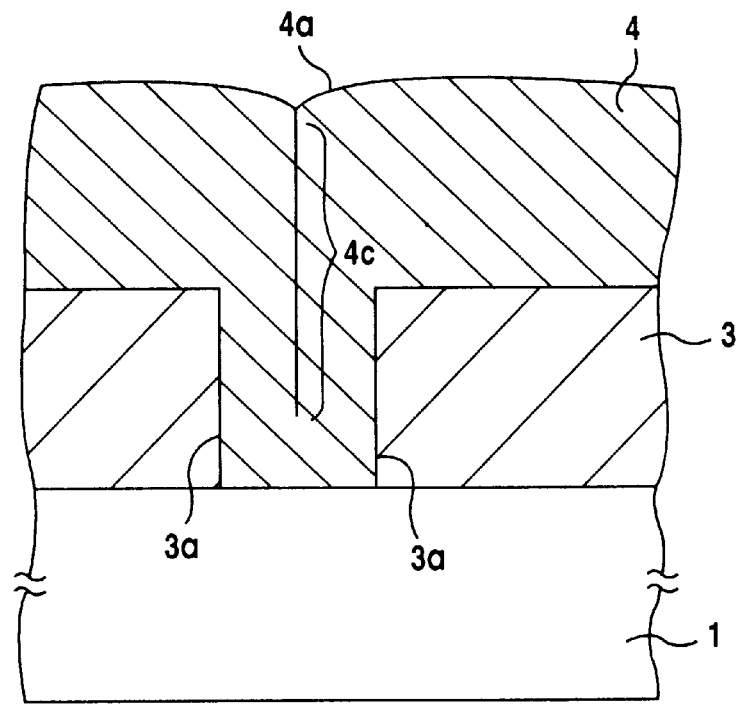
FIGS. 2A and 2B are diagrams showing the problem of erosion of the seam occurring in the conventional polishing process.

Referring to FIG. 3, the test piece is constructed on a Si substrate 11 and includes a $SiO_2$ film 12 deposited on the Si substrate 11 by a CVD process, with a thickness of about 50 nm. The $SiO_2$ film 12 is provided with a plurality of contact holes 12a and 12b with respective inner diameters $D_1$ and $D_2$, and a conductor layer 13 of W is deposited on the $SiO_2$ film 12 so as to fill the contact holes 12a and 12b with a thickness of about 50 nm. The conductor layer 13 is deposited by a CVD process, and depressions 13a are formed on the upper major surface thereof in correspondence to the contact holes 12a and 12b. As already explained with reference to FIGS. 2A and 2B, the W layer 13 includes a seam 13b in each of the depressions 13a as a result of abutting of growing W layers that occurs when the W layer 13 fills the contact hole 12a. Because of the nature of the seam as such, the seams 13b inevitably contain a large amount of crystal imperfections or defects.

Figure 4:
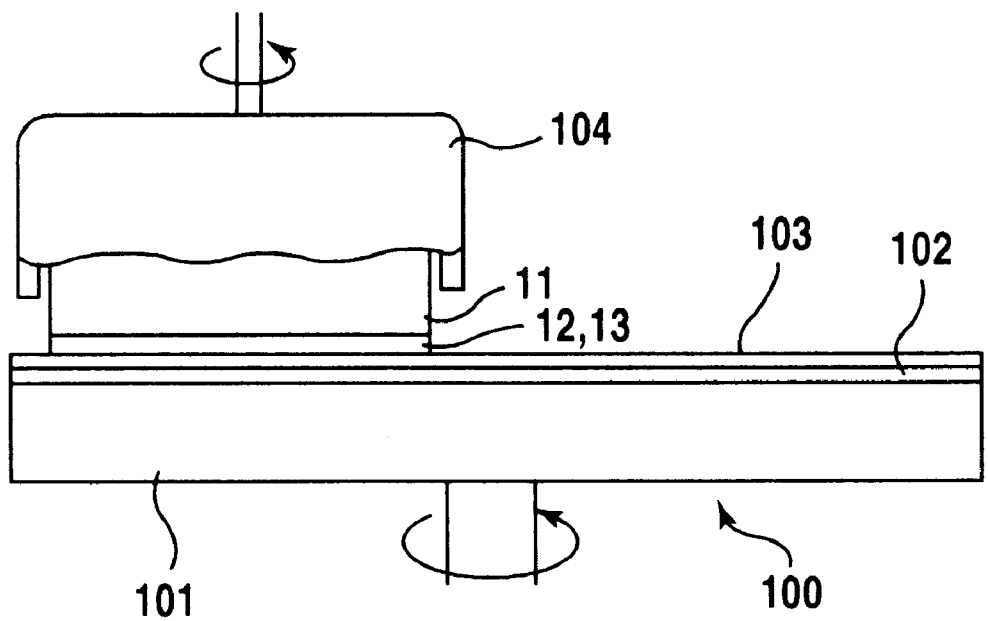
FIG. 4 is a diagram showing the construction of the polishing apparatus used in the present invention schematically.

In the experiment, the test piece of FIG. 3 was subjected to a polishing process conducted by an apparatus 100 shown in FIG. 4.

Referring to FIG. 4, the polishing apparatus 100 includes a turntable 101 covered by a urethane cloth 102 supplied from Rodel-Nitta with a trade name SUBA400. The test piece of FIG. 3 is held by a polishing head 104 that revolves in a direction identical to the rotating direction of the turntable 101, and the polishing is applied upon the W layer 13 on the foregoing urethane cloth 102 while urging the test piece against the turntable 101 with a pressure of 200–700 g/cm$^2$.

In the experiment, a slurry containing $MnO_2$ as the abrasive particles and $H_2O$ as the solvent was used on the cloth 102 as indicated schematically by a reference numeral 103, wherein the concentration of the $MnO_2$ abrasive particles was adjusted to be about 20 percent by weight in one example.

Figure 2B:
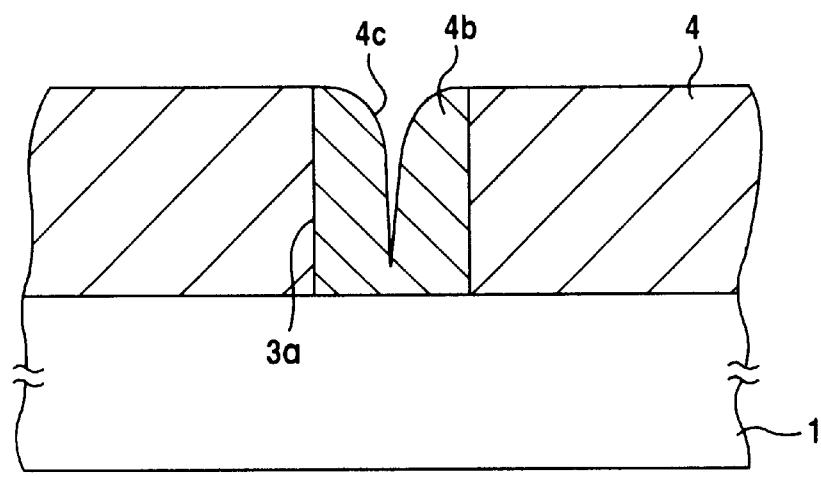

After the polishing, an over-etching was applied to the polished surface, and the evaluation was made by measuring the depth of the depressions such as the one shown in FIG. 2B, by observing the cross section of the test piece under an electron microscope.

FIG. 5 shows the polishing rate of the W layer 13 in comparison with an $SiO_2$ layer that is provided on the test piece of FIG. 3 in place of the W layer 13, wherein the polishing rate observed for the W layer 13 is designated by solid circles while the polishing rate observed for the $SiO_2$ layer is designated by open circles.

Referring to FIG. 5, it will be noted that the polishing rate for the W layer exceeds the polishing rate for the $SiO_2$ layer substantially, as long as the grain size of the $MnO_2$ abrasive is smaller than about 10 μm. This means that the $MnO_2$ abrasive particles act upon a W layer selectively and efficiently, while the polishing stops immediately when the $SiO_2$ layer is exposed. In other words, an $SiO_2$ layer acts as a polishing stopper in the polishing process of a W layer.

When the grain size of the $MnO_2$ particles exceeds 10 μm, on the other hand, the polishing rate for the $SiO_2$ layer exceeds the polishing rate for the W layer. Thus, in order to polish a W layer while using a $SiO_2$ layer as an etching stopper, it is necessary or preferable to adjust the grain size of the $MnO_2$ abrasive particles well below 10 μm.

Hereinafter, the first embodiment of the present invention for fabricating a semiconductor device including a polishing step conducted by such a $MnO_2$ slurry will be explained with reference to FIGS. 6A–6J.

Figure 6A:
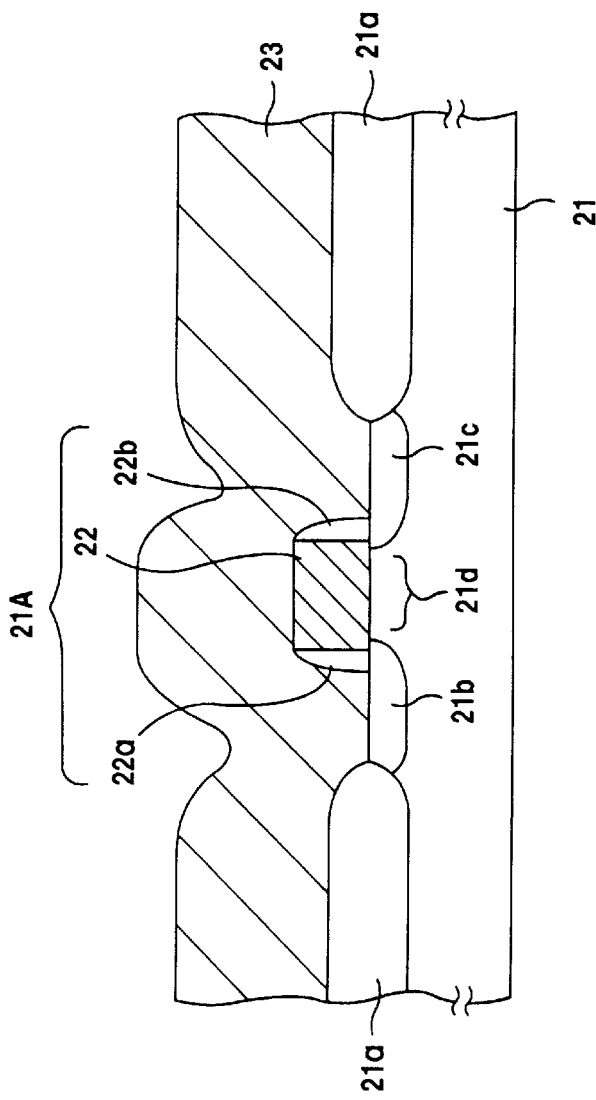

Referring to FIG. 6A, the MOS transistor is formed on a Si substrate 21 doped to the p-type in correspondence to an active region 2A defined by a field oxide film 21a. More specifically, the MOS transistor includes a diffusion region 21b of the n$^+$-type formed on the surface of the active region 21A and another diffusion region 21c also of the n$^+$-type formed on the surface of the active region 21A, wherein the diffusion region 21b and the diffusion region 21c are separated from each other by a channel region 21d of the MOS transistor. On the substrate 21, there is provided a gate electrode 22 so as to cover the channel region 21d with an intervening gate oxide film (not shown). Further, the gate electrode 22 carries side wall insulation films 22a and 22b on respective opposing side walls. It should be noted that the diffusion regions 21b and 21c act respectively as a source and a drain of the MOS transistor.

In the step of FIG. 6A, an interlayer insulation film 23 of $SiO_2$ is deposited so as to bury the MOS transistor, typically with a thickness of about 50 nm. As a result of deposition of the interlayer insulation film 23, the gate electrode 22 as well as the diffusion regions 21b and 21c are covered by the $SiO_2$ film 23. Thereby, the interlayer insulation film 23 shows a projection and a depression in conformity with the foregoing gate electrode 22 as indicated in FIG. 6A.

Figure 6B:
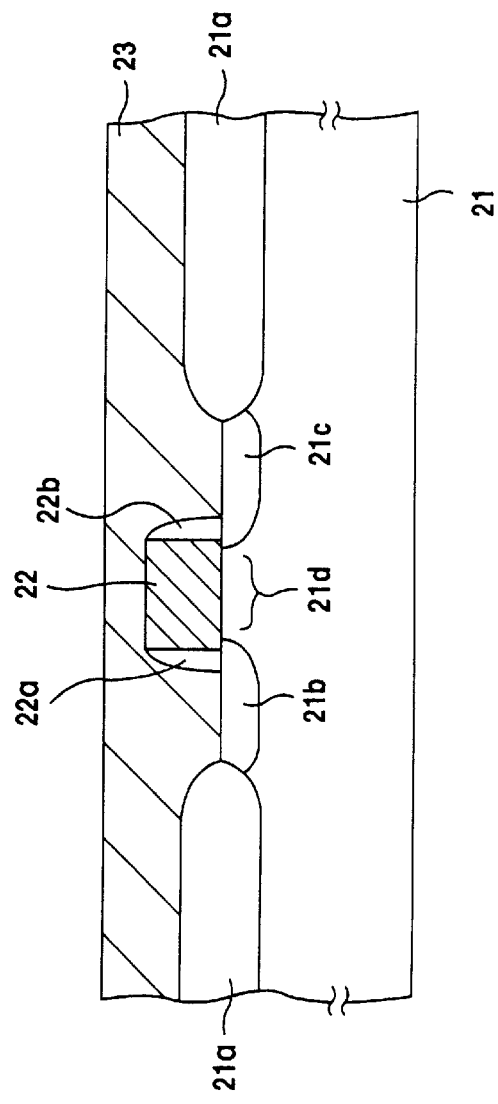

Next, in the step of FIG. 6B, the structure of FIG. 6A is planarized by polishing the surface of the insulation film 23 uniformly by using a polishing apparatus such as the one shown in FIG. 4. Further, in the step of FIG. 6C, the insulation film 23 is subjected to a photolithographic patterning process, in which a contact hole 23a is formed in the interlayer insulation film 23 so as to expose the surface of the diffusion region 21b, and a conductor layer 24 of a metal or alloy such as W, Al or Cu, is deposited in the step of FIG. 6D on the structure of FIG. 6C uniformly by a CVD process. As a result, the conductor layer 24 fills the contact hole 23a and the conductor layer 24 contacts the diffusion region 21b at the foregoing contact hole 23a. As the conductor layer 24 fills the contact hole 23a as noted above, the conductor layer 24 shows a depression on the upper major surface thereof in correspondence to the contact hole 23a.

Next, the conductor layer 24 is polished uniformly by using a slurry containing $MnO_2$ abrasives and $H_2O$ (pure water), and a structure shown in FIG. 6E is obtained. In the structure of FIG. 6E, it should be noted that a flat surface is obtained in correspondence to the upper major surface of the insulation layer 23 due to the selectivity of polishing that is achieved when using the $MnO_2$ abrasive particles. More specifically, the polishing acts selectively to the metal forming the conductor layer 24 and stops more or less spontaneously when the upper major surface of the insulation film 23 is exposed. As a result of such a polishing, a conductive plug 24b is formed in contact with the diffusion region 21b such that the conductive plug 24b fills the contact hole 23a. As a result of the planarization, achieved by the polishing process, the conductive plug 24b has an upper major surface coincident to the upper major surface of the insulation film 23.

Figure 6C:
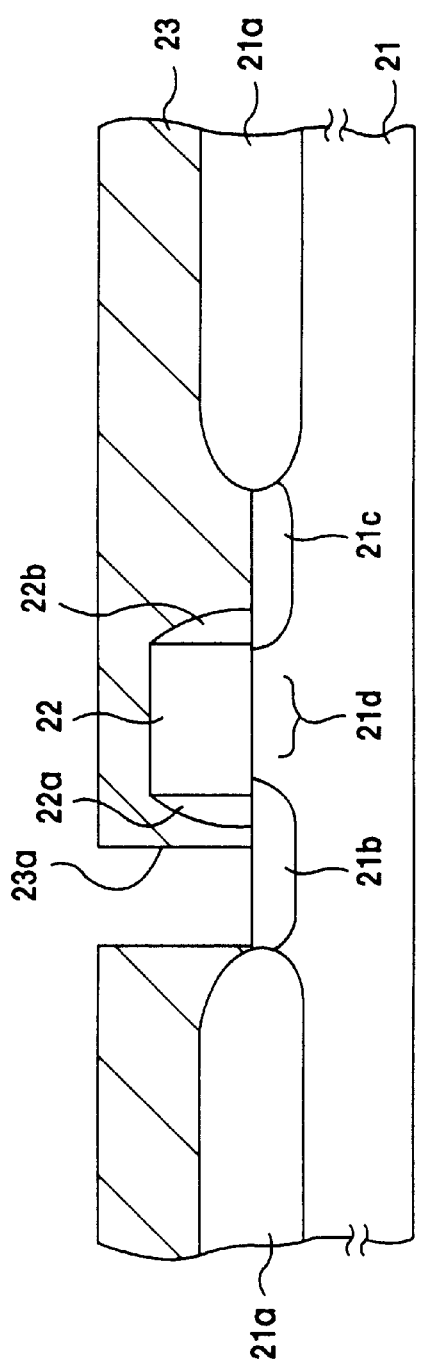
Figure 6D:
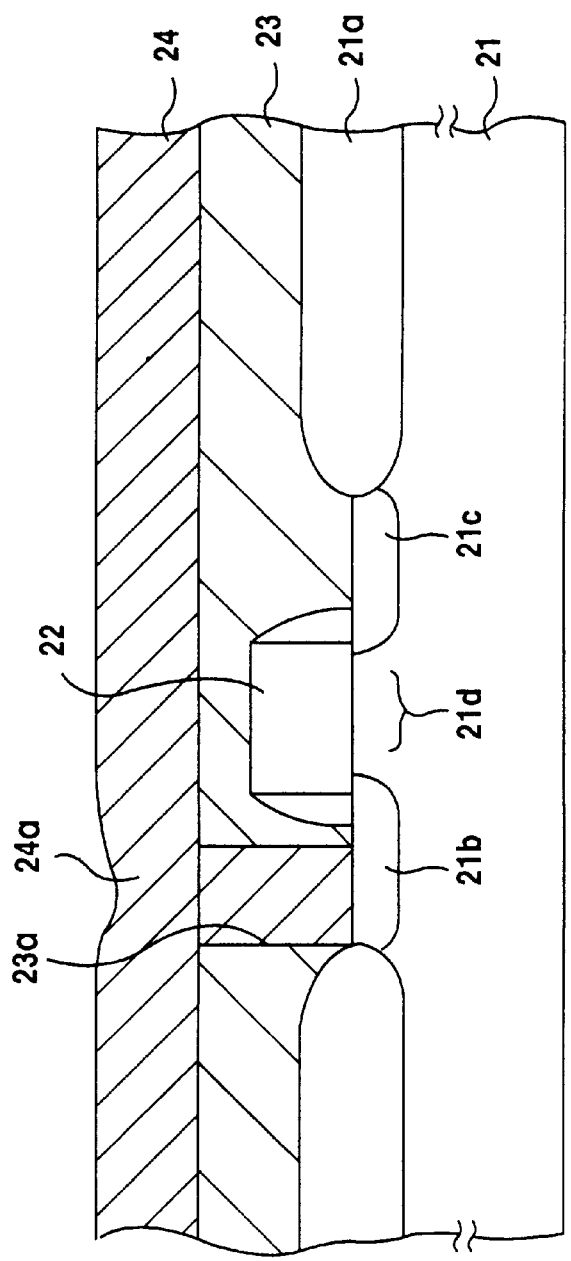
Figure 6G:
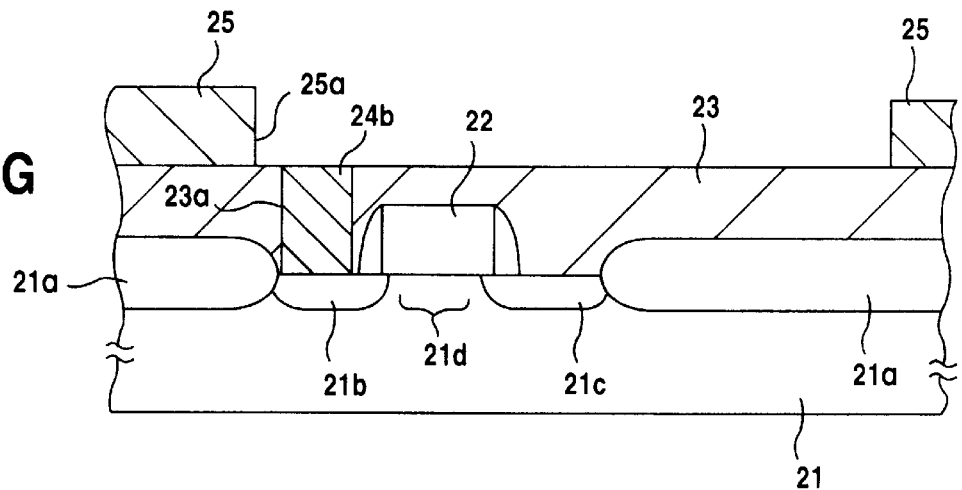
Figure 6H:
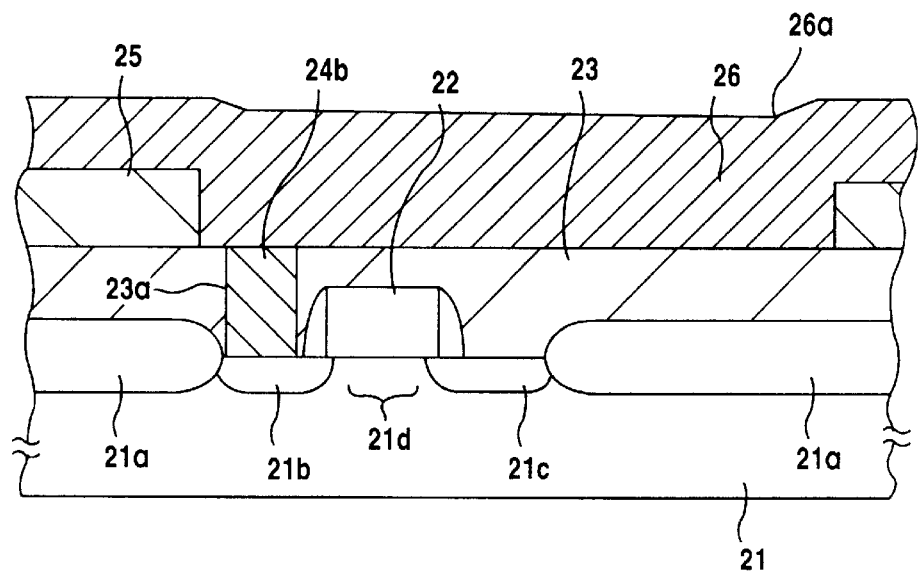

Next, in the step of FIG. 6F, another insulation film 25 of $SiO_2$, and the like, is formed on the planarized structure of FIG. 6E, followed by a photolithographic patterning process, to form a groove 25a as indicated in FIG. 6G, such that the groove 25a exposes the conductive plug 24b. Further, in the step of FIG. 6H, another conductor layer 26, typically formed of a metal or alloy of W, Al, Cu, and the like, is deposited on the structure of FIG. 6G. As a result, a depression 26a is formed on the conductor layer 26 as indicated in FIG. 6H in correspondence to the groove 25a.

Figure 6I:
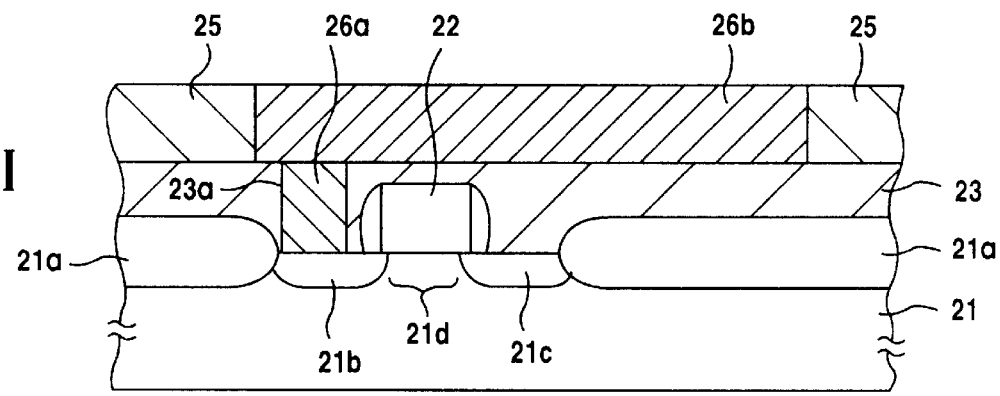
Figure 6J:
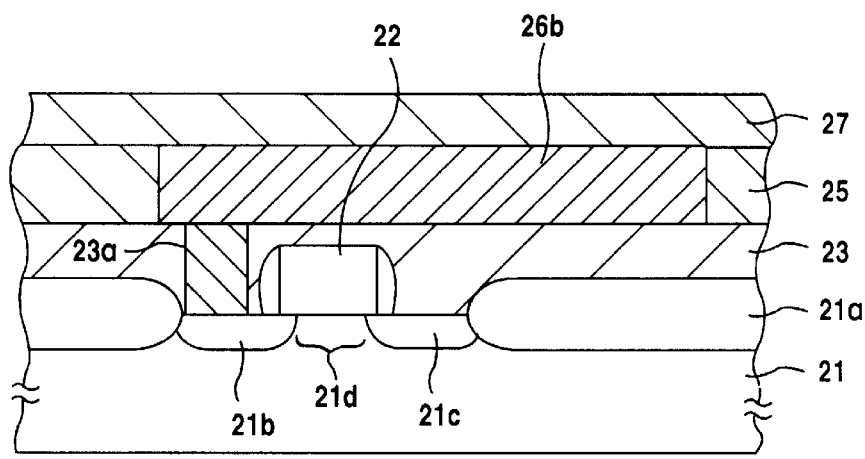

Further, the conductor layer 26 is polished in the step of FIG. 6I to form a planarized structure, wherein it will be noted that the groove 25a is filled by a conductor pattern 26b that forms a part of the foregoing conductor layer 26. After the structure of FIG. 6I is thus formed, another insulation film 27 is provided as indicated in FIG. 6J. Thereby, it is possible to form various interconnection patterns further on the insulation film 27.

In the foregoing process, the conductive plug 24b is substantially free from depression, as the polishing step employed in the step of FIG. 6E does not use a fluid oxidant. As already noted, $MnO_2$ forming the abrasive particles act as a solid oxidant and releases oxygen at the time of polishing. The oxygen thus released causes an oxidation of the W layer 24 to be polished. A similar polishing step may be applied also to the step of FIG. 6I.

In any of the steps of FIG. 6E and FIG. 6I, it is preferable to set the grain size of the $MnO_2$ abrasive particles to be less than 10 µm, in conformity with the discovery indicated in FIG. 5.

After the polishing step of FIG. 6E or FIG. 6I, the $MnO_2$ abrasive particles have to be removed substantially completely from the substrate by a cleaning process, in order to avoid metal contamination of the device.

In the present invention, experiments were conducted for dissolving the remaining $MnO_2$ abrasive particles into various acids.

More specifically, the inventors have immersed the polished test piece described before into the solutions of:

(A) $HCl+H_2O_2+H_2O$ (1:1:48)*;
(B) $HNO_3+H_2O_2+H_2O$ (1:1:48)*;
(C) $H_2SO_4+H_2O_2+H_2O$ (1:1:48)*;
(D) $HF+H_2O_2+H_2O$ (1:1:48)*;
* volumetric ratio:

respectively for 30 seconds, followed by a scrubbing process. The samples obtained as a result of the treatment in the foregoing solutions (A)–(D) are designated as A, B, C and D, respectively.

In the samples A, B, C and D, there occur following reactions:

(A) $MnO_2+2HCl+H_2O_2 \rightarrow MnCl_2+2H_2O+O_2$
(B) $MnO_2+2HNO_3+H_2O_2 \rightarrow Mn(NO_3O_2+2H_2O+)_2$
(C) $MnO_2+H_2SO_4+H_2O_2 \rightarrow MnSO_4+2H_2O+O_2$
(D) $MnO_2+2HF+H_2O_2 \rightarrow MnF_2+2H_2O+O_2$, wherein each of the reactions produces a water-soluble product such as $MnCl_2$, $Mn(NO_3)_2$, $MnSO_4$, and $MnF_2$.

For the sake of comparison, a reference test piece was prepared as a sample E, wherein, in the sample E, the test piece was directly subjected to the scrubbing process after polishing, without carrying out an acid treatment. Further, another reference test piece was prepared as a sample F, wherein, in the sample F, the test piece was polished by a commercially available slurry that uses $\alpha$-$Al_2O_3$ (MSW-1000). In the sample F, the test piece was directly subjected to a scrubbing process after the polishing, without an acid treatment.

All of the samples A–F were then immersed in a HF solution of 0.5% concentration level for 20 seconds before evaluating the metal contamination and counting-up of the residual particles. The results are summarized in the following TABLE I.

TABLE I

| | metal contamination ($10^{10}$ atoms/cm$^2$) | | particle/wafer |
|---|---|---|---|
| | Al | Mn | (0.2 µm<) |
| A | <4 | ≈5 | ≈500 |
| B | <4 | ≈5 | ≈500 |
| C | <4 | ≈5 | ≈500 |
| D | <4 | ≈5 | ≈500 |
| E | <4 | 11 | ≈1000 |
| F | 100 ≈ 1000 | <4 | ≈3000 |

As is clearly seen in TABLE I, the contamination by Mn is ignorable for the samples A–D in which the cleaning process of the present invention is applied. Further, the samples A–D show a reduced number of residual particles as compared with the case in which the conventional polishing process is applied (sample F). Further, it will be seen that the Mn contamination for the samples A–D is reduced as compared with the sample E in which the acid treatment is omitted. This clearly indicates that the foregoing acid treatment dissolves the residual $MnO_2$ particles.

It should be noted that foregoing polishing process by the $MnO_2$ abrasive particles is not limited to a W layer as described heretofore but is also applicable to other metal layers such as Al, Cu or an alloy thereof.

Figure 7:
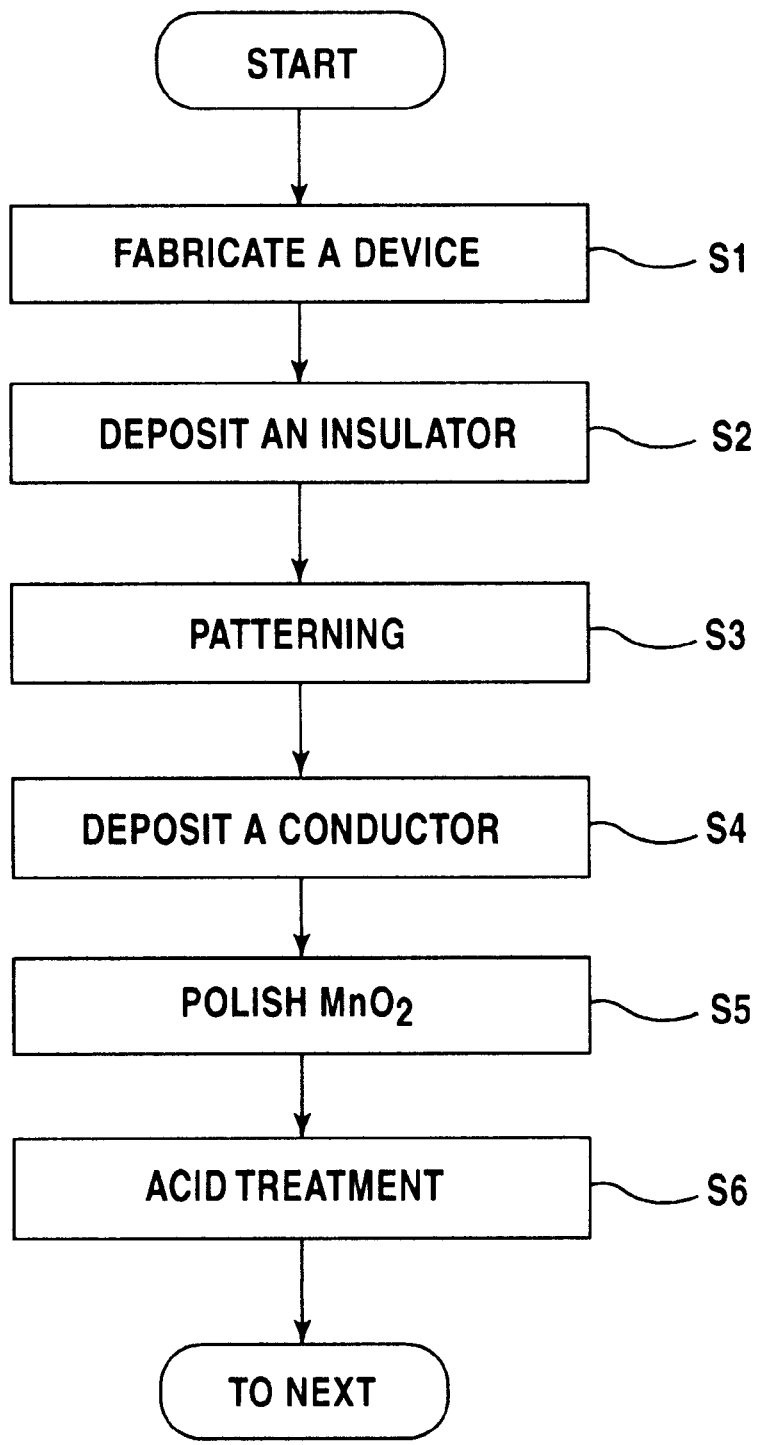
FIG. 7 is a flowchart showing the fabrication process of a semiconductor device according to the first embodiment of the present invention.

FIG. 7 shows the fabrication process of a semiconductor device including a polishing step in the form of a flowchart.

Referring to FIG. 7, a step S1 is conducted in which a device structure is formed on a substrate or a wafer, and a step S2 is conducted subsequently in which an insulation film is deposited so as to cover the device structure. The insulation film may be a CVD-deposited $SiO_2$ film as indicated in FIG. 6B, while an insulation film of other composition such as BSG, BPSG, or SOG may be used.

In a step S3, the insulation film thus deposited is patterned to form therein a depression, which may be a contact hole similar to the contact hole 23a of FIG. 6C or a wiring groove, and a step S4 is conducted in which a conductor layer corresponding to the conductor layer 24 is deposited so as to fill the foregoing depression. The conductor layer may be a W layer as in the embodiment described previously or a conductor material such as Cu or Al Next, in a step S5, the conductor layer 24 is polished on a polishing cloth while using the abrasive particles of $MnO_2$ dispersed in a solvent such as $H_2O$. In the present invention, no fluid oxidant is added to the solvent, contrary to the conventional chemical mechanical polishing processes. As a result, the problem of erosion of the seam does not occur in the conductor layer filling the depression.

After the polishing step S5, a step S6 is conducted in which the substrate thus polished is treated in an acid for dissolving the remaining $MnO_2$ particles into the acid. In this acid treatment process, an oxidant is added to the acid such as HCl, $H_2SO_4$, $HNO_3$, HF, and the like, as already noted. As a result of such an acid treatment, the metal contamination of the substrate is eliminated, and the remaining particles are reduced substantially.

After the step S6, one may form another structure as desired on the structure thus formed, as the structure obtained as a result of the foregoing steps S1–S6 is characterized by a clean planarized upper major surface suitable for construction of further structures thereon.

Further, the slurry containing $MnO_2$ abrasive particles as disclosed in the present invention is by no means limited to the fabrication of semiconductor devices, but is applicable to other general polishing processes.

[Second Embodiment]

In the course of the investigation of the slurry containing $MnO_2$ as abrasive particles, the inventors of the present invention have further discovered that oxide of manganese such as $Mn_2O_3$ can polish an $SiO_2$ film with a rate of at least three or four times as large as the polishing rate achieved by conventional colloidal silica slurries. Further, it was discovered that the polishing substantially stops upon exposure of a conductor material such as W or a semiconductor material such as Si as a result of the polishing.

TABLE II below summarizes the result of the experiment conducted by the inventors for the slurry containing $Mn_2O_3$ particles, while TABLE III summarizes the condition of the polishing experiment.

TABLE II

|  | $SiO_2$ | Si | W |
|---|---|---|---|
| $Mn_2O_3$ | 0.2–0.25 μm/min | 0.045–0.050 μm/min | 0.048 μm/min |
| colloidal silica | 0.065 μm/min | 0.13 μm/min | |

TABLE III

| $MnO_2$ | grain size 0.2 μm |
|---|---|
| concentration in slurry | 10 wt % |
| abrasive cloth | IC1000/SUBA400 |
| flow rate | 150 cc/min |
| urging pressure | 0.21 kg/cm² |
| platen diameter | 12 inches |
| rotational speed | head 60 rpm, platen 60 rpm |

As can be seen clearly from TABLE II, a polishing rate of 200–250 nm/min is obtained for an $SiO_2$ film when a slurry that uses the $Mn_2O_3$ abrasives is employed, while this polishing rate is about three or four times as large as the polishing rate of 65 nm/min, which is obtained by a conventional colloidal silica slurry for the same $SiO_2$ film.

TABLE II further indicates that the polishing rate achieved for Si or W by the slurry that uses the $Mn_2O_3$ abrasives is very small; about 45 nm/min and 48 nm/min respectively. In other words, a metal layer or a Si layer can be used in combination with an $SiO_2$ film as an efficient polishing stopper when the slurry that uses the $Mn_2O_3$ abrasives is used for polishing the $SiO_2$ film. A similar effect is obtained also for a slurry that uses $Mn_3O_4$ abrasives.

In contrast, it should be noted that the polishing rate achieved for a Si layer or substrate by a conventional colloidal silica slurry is very large, in the order of as much as 120 nm/min. This indicates that a Si layer cannot be used as an effective polishing stopper as long as the colloidal silica slurry is used for polishing a $SiO_2$ or silicate glass film.

Further, the inventors of the present invention discovered that an excellent selectivity of polishing similar to that obtained by the $Mn_2O_3$ abrasives, can be achieved also when abrasives of $MnO_2$ are used under a condition that induces a formation of $Mn_2O_3$ or $Mn_3O_4$ on the surface of the $MnO_2$ abrasives.

It should be noted that a metal element such as Mn that takes different valence states can form various different oxides as a result of oxidation-reduction reaction, which changes the valence state.

Figure 8:
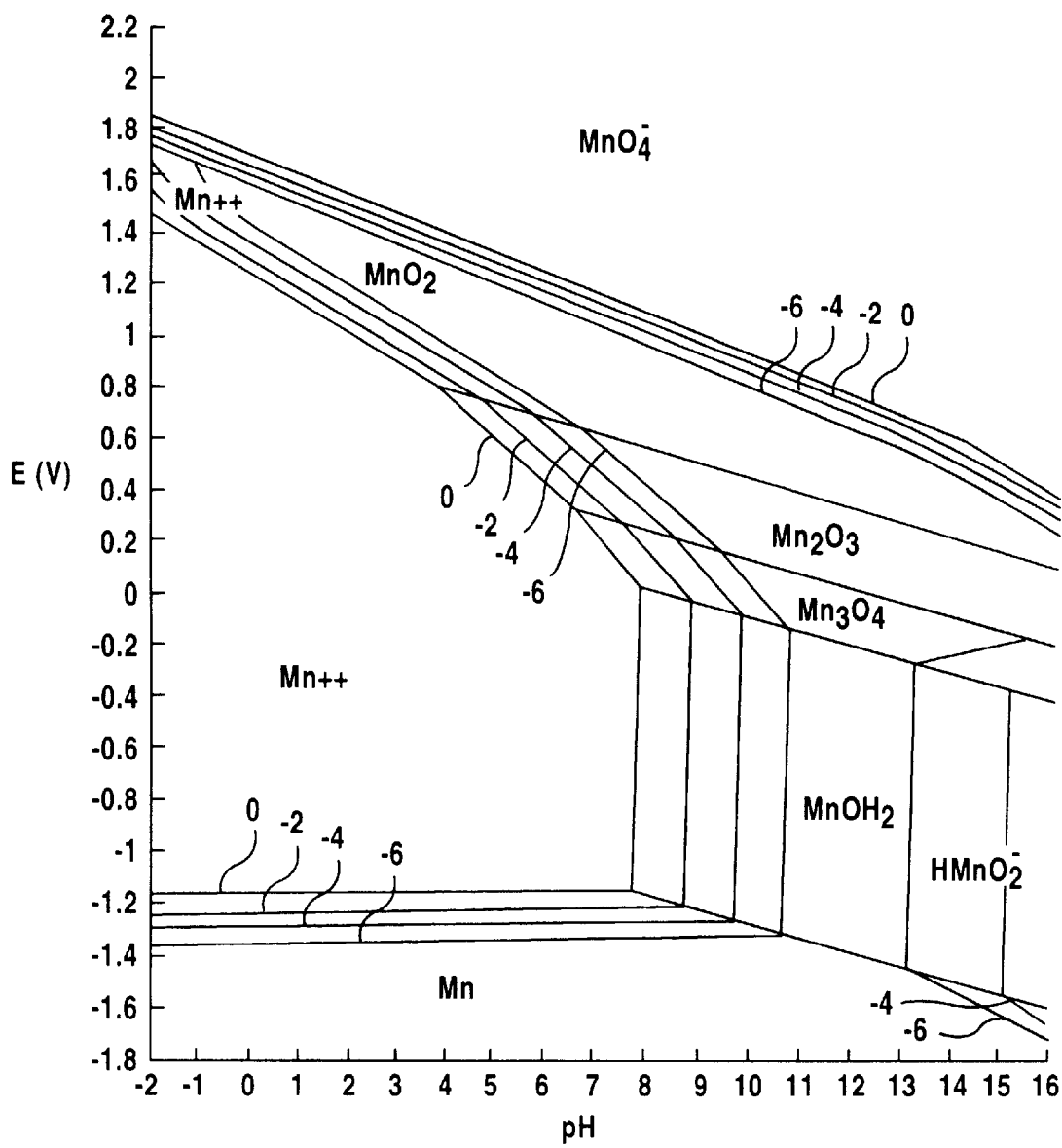
FIG. 8 is a phase diagram of a manganese oxide used in a second embodiment of the present invention.

FIG. 8 shows a phase diagram of an oxidation-reduction reaction of Mn taking place in an aqueous solution.

Referring to FIG. 8, the vertical axis represents the oxidation-reduction potential E while the horizontal axis represents the pH. In FIG. 8, it will be noted that the E-pH field of FIG. 8 is divided into a plurality of regions by phase boundaries each corresponding to an oxidation-reduction reaction of Mn. For example, $MnO_2$ appears as the oxide of Mn when the oxidation-reduction potential E is in the range of 0.8–1 V and the pH is in the range of 6–7. On the other hand, in the region where the pH is higher and the potential E is lower, $Mn_2O_3$ or $Mn_3O_4$ appears as the oxide of Mn. In FIG. 8, the boundaries designated by "0," "–2," "–4," and "–6" represent the cases in which the concentration of $Mn^{2+}$ is 1 M/l, 0.01 M/l, 0.0001 M/l and 0.000001 M/l.

Thus, the inventors of the present invention used the $MnO_2$ particles described previously in a solvent in which the pH and the oxidation-reduction potential E are adjusted such that $Mn_2O_3$ appears as the oxide of Mn. By using the $MnO_2$ abrasive particles under such a condition, $Mn_2O_3$ covers the surface of the $MnO_2$ particle, while such $MnO_2$ particles covered by a layer of $Mn_2O_3$ show an excellent polishing rate of $SiO_2$. On the other hand, the abrasive particles thus processed show a remarkably reduced polishing rate for a conductor such as W or a semiconductor such as Si.

It should be noted that the oxidation-reduction reaction of Mn aqueous solution is easily controlled. For example, one can control the pH by admixing an acid such as HCl or alkali such as KOH, while the oxidation-reduction potential E can be controlled by admixing of ozone water or bubbling of $H_2$. The oxidation reduction potential increases when ozone water is added and decreases by the bubbling of $H_2$.

Figure 9A:
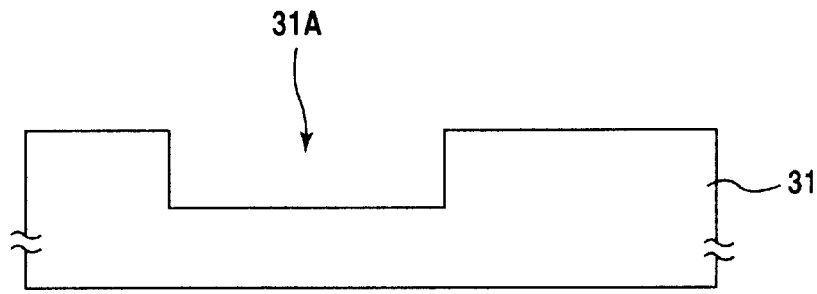
FIGS. 9A–9C are diagrams showing a fabrication process of a semiconductor device according to the second embodiment of the present invention.
Figure 9B:
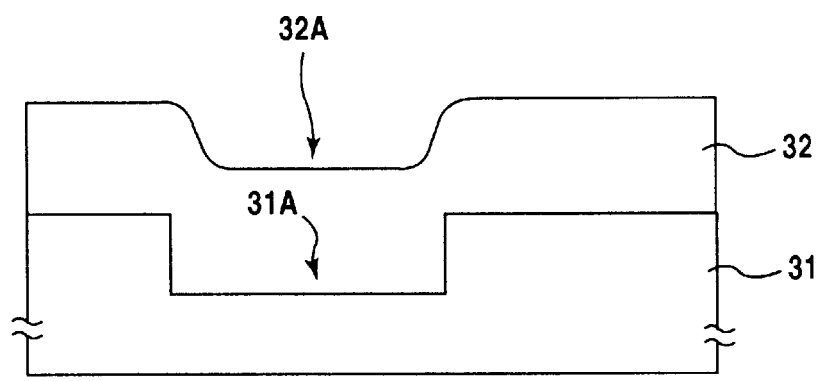
Figure 9C:
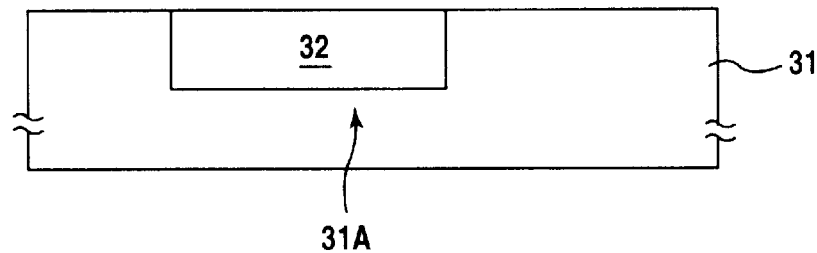

FIGS. 9A–9C show the process for forming an shallow isolation trench structure on a Si substrate according to a second embodiment of the present invention.

Referring to FIG. 9A, an isolation trench 31A is formed on a surface of a Si substrate 31 with a depth of about 400 nm, followed by a step of FIG. 9B in which an $SiO_2$ film 32 is deposited on the structure of FIG. 9A so as to fill the isolation trench 31A. The $SiO_2$ film 32 thereby shows a depression 32A on the upper major surface thereof in correspondence to the isolation trench 31A.

Next, in the step of FIG. 9C, the $SiO_2$ film 32 is subjected to a polishing by using $Mn_2O_3$ particles as the abrasive together with $H_2O$ acting as a solvent. Thereby, the $SiO_2$ film 32 is efficiently polished, until the upper major surface of the substrate 31 is exposed. In other words, the Si substrate 31 itself acts as a polishing stopper, wherein, in view of the result of TABLE II, one can secure a selectivity of polishing rate exceeding four times for the $SiO_2$ film with respect to the Si substrate 31.

According to the process of FIGS. 9A–9C, one can reduce the number of the steps conventionally necessary for forming a shallow trench structure including the deposition and patterning of a polishing stopper layer. Further, the resultant structure of FIG. 9C has a completely flat upper major surface in which the upper major surface of the Si substrate 31 and the upper major surface of the $SiO_2$ film 32 filling the shallow trench 31A coincides each other exactly.

In the polishing step of FIG. 9C, one may use the $MnO_2$ as the abrasive particles, together with a solvent in which the oxidation-reduction potential E and pH are adjusted as indicated in FIG. 8. In such a process, too, it is possible to obtain an efficient polishing of the $SiO_2$ film 31 as well as the spontaneous stop of the polishing at the upper major surface of the substrate 31.

According to the latter process, one can use the same slurry used for the polishing of a conductor layer such as a W layer, without changing the slurry. Only the composition of the solvent is adjusted at the time of polishing the $SiO_2$ film 31. Thereby, the fabrication process of the semiconductor device is significantly simplified. For example, it is possible to form a layer of $Mn_2O_3$ on the surface of the $MnO_2$ particles by setting the oxidation-reduction potential E to be 0 V and the pH to be 12 or higher.

After the polishing step, the structure of FIG. 9C is cleaned by immersing in a cleaning solution in which HCl, $H_2O_2$ and $H_2O$ are mixed with a volumetric ratio of 1:1:48, for 1 minute, followed by a further immersion into a HF solution of 0.5% concentration level for 1 minute. After the cleaning, it was confirmed that most of the elements (Na, K, Fe, Mn) show a concentration level of lower than $5\times10^{10}$ atoms/cm². Further, no defects or scars were observed on the polished surface of the Si substrate 31 or the $SiO_2$ film 32.

Figure 10:
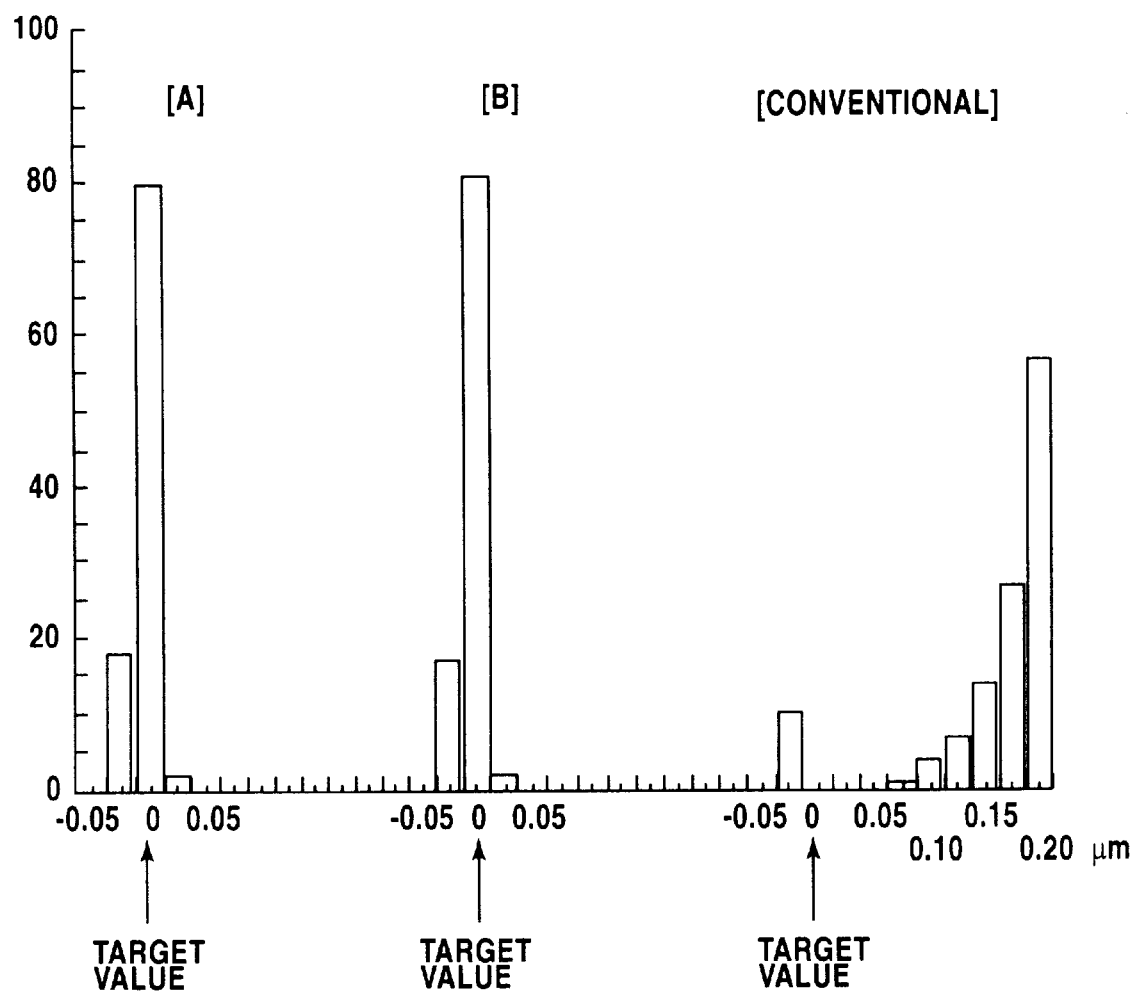
FIG. 10 is a diagram comparing the step height remaining on a semiconductor surface after various polishing processes including the process according to the second embodiment of the present invention.

FIG. 10 shows the result of measurement for the step height formed on the substrate 31 in the structure of FIG. 9C. In FIG. 10, the horizontal axis represents the step height while the vertical axis represents the frequency of occurrence of the step height. Ideally, the step height should be zero.

When the polishing is made according to the conventional process using a colloidal silica abrasive as indicated in TABLE II, it will be noted that the there appears a substantial step on the surface of the Si substrate 31 with a step height exceeding 0.1 $\mu$m, wherein the step height varies substantially. When the slurry that contains $Mn_2O_3$ abrasives is employed, on the other hand, it will be noted that the step height is almost 0.00 $\mu$m, with very small variation. This result indicates that a nearly completely flat surface is realized on the surface of the substrate 31 including the $SiO_2$ film 32 filling the isolation trench 31A.

In the polishing step of FIG. 9C, it should be noted that one may use $Mn_3O_4$ in place of the $Mn_2O_3$ particles. Further, one may use a mixture of $Mn_2O_3$ and $Mn_3O_4$ for the polishing step of FIG. 9C.

Further, one may adjust the oxidation-reduction potential E and the pH of the solvent also in the case when the $Mn_2O_3$ particles are used for the polishing process.

[Third Embodiment]

FIGS. 11A–11L are diagrams showing the fabrication process of a semiconductor device including a multilayer interconnection structure according to a third embodiment of the present invention.

Figure 11A:
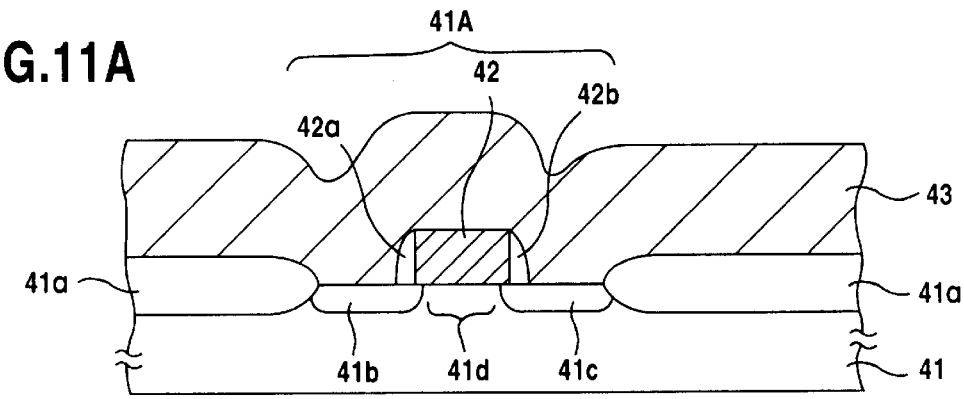
FIGS. 11A–11L are diagrams showing a fabrication process of a semiconductor device according to a third embodiment of the present invention.

Referring to FIG. 11A, a Si substrate 41 is defined with an active region 41A by a field oxide film 41a, and a gate electrode 42 is provided on the substrate 41 in the active region 41A, with a gate insulation film (not shown) intervening between the substrate 41 and the gate electrode 42. Further, the substrate 41 is formed with diffusion regions 41a and 41b at both sides of the gate electrode 42 and a channel region 41d is defined in the substrate 41 immediately below the gate electrode 42. The gate electrode 42 carries side wall oxide films 42a and 42b at both lateral side walls thereof, and an interlayer insulation film 43 typically of $SiO_2$ is provided on the substrate 41 by a CVD process such that the interlayer insulation film 43 covers the gate electrode 42 including the side wall oxide films 42a and 42b.

Figure 11B:
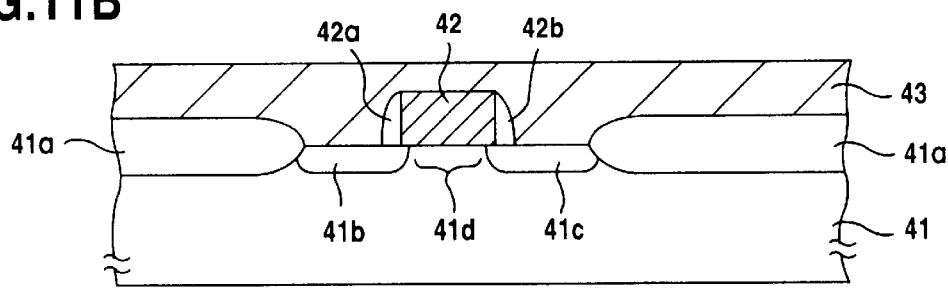

As will be noted from FIG. 11A, the interlayer insulation film 43 thus formed has a projection and depression at a top surface thereof in correspondence to the gate electrode 42, and thus, the structure of FIG. 11A is planarized in the step of FIG. 11B by polishing the interlayer insulation film 43 by a CMP process that uses a slurry, in which abrasives of $Mn_2O_3$ or $Mn_3O_4$ are dispersed in a suitable solvent such as $H_2O$. As explained already with reference to TABLE II, a polishing rate of more than three times as large as the conventional polishing rate is achieved by using a slurry that contains $Mn_2O_3$ abrasives for this purpose. Further, a polishing rate of more than twice as large as the conventional polishing rate is obtained when a slurry that contains $Mn_3O_4$ abrasives is used for the same purpose.

Figure 11C:
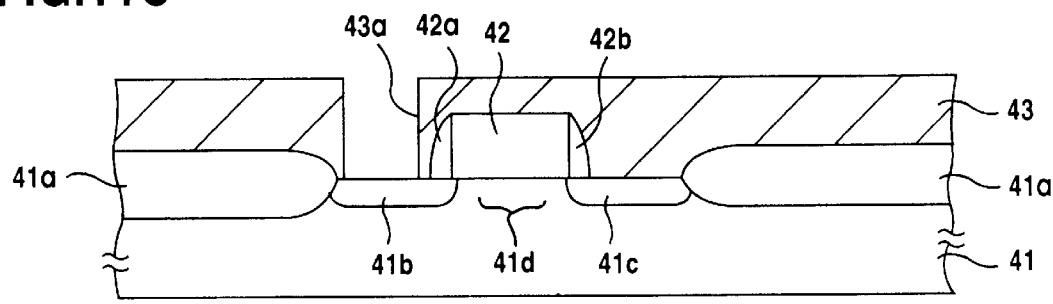
Figure 11D:
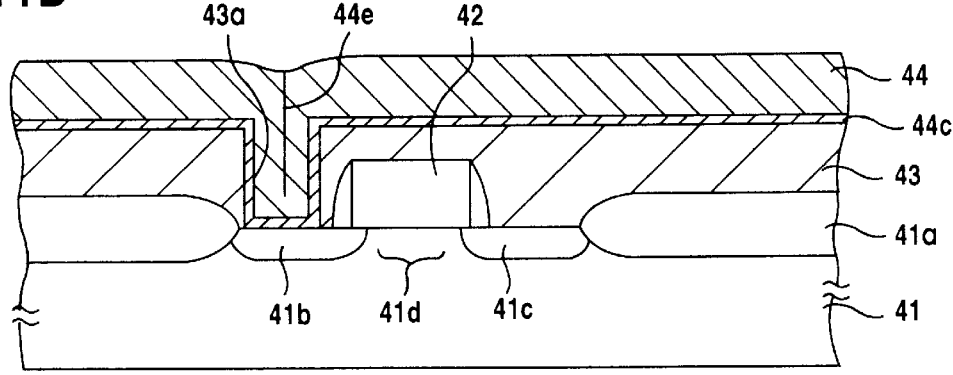

Next, in the step of FIG. 11C, the interlayer insulation film 43 thus planarized is formed with a contact hole 43a so as to expose the diffusion region 41b, and a TiN layer 44c and a W layer 44 are deposited on the structure of FIG. 11C consecutively by a sputtering process or a CVD process.

Figure 11E:
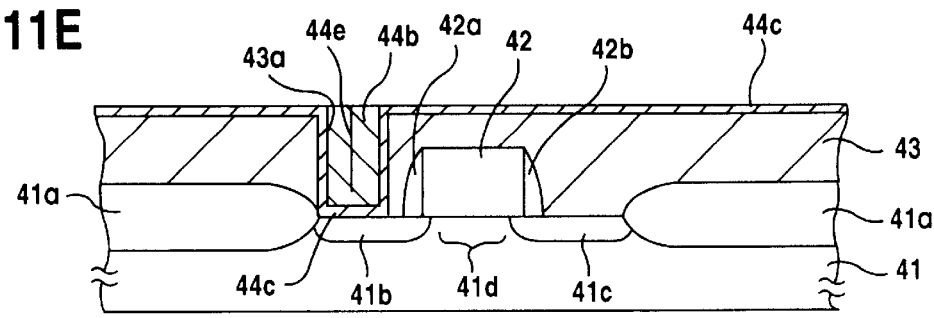

The W film 44 thus deposited is then removed in the step of FIG. 11E by a CMP process that uses $MnO_2$ abrasives, and a structure in which a W plug 44b fills the contact hole 43a is obtained as indicated in FIG. 11E. In the process of FIG. 11E, it should be noted that the TiN layer 44c remains more or less intact. While the W plug 44b thus formed includes a seam 44e at a central part thereof as a result of the lateral growth of the W layer in the contact hole 43a at the time of the deposition, the problem of erosion of the seam by a liquid oxidant such as $H_2O_2$ is successfully avoided by using the $MnO_2$ abrasives. It should be noted that the $MnO_2$ abrasives in the slurry acts as a solid oxidant and does not penetrate into the seam 44e even during the polishing process of the W layer 44.

Figure 11F:
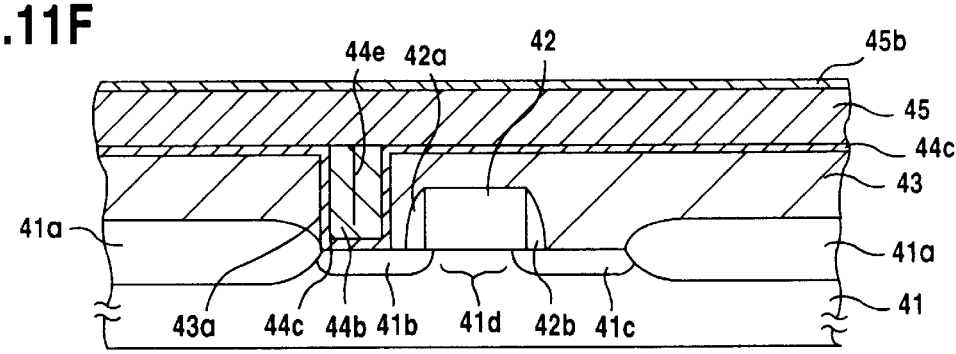

Next, in the step of FIG. 11F, a thin Ti film (not shown) is formed on the structure of FIG. 11E by a sputtering process or a CVD process, and a conductor layer 45 of Al or an Al alloy is formed on the structure of FIG. 11E. Further, a thin Ti layer (not shown) is deposited on the conductor layer 45, and a TiN layer 45b is formed further thereon by a sputtering process or a CVD process.

Figure 11G:
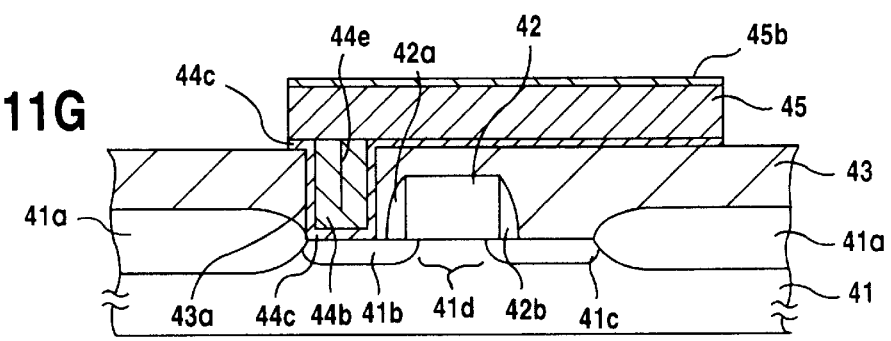
Figure 11H:
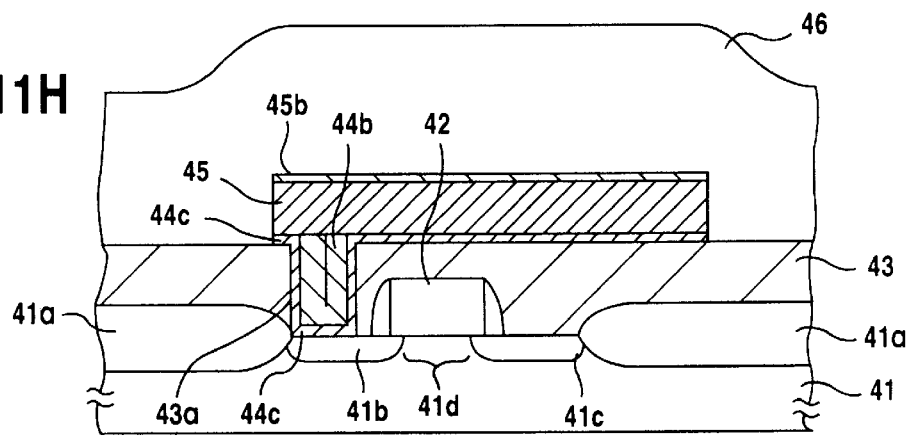

Next, in the step of FIG. 11G, the conductor layer 45 as well as the TiN layers 44c and 45b are patterned, and the structure thus obtained is covered by an interlayer insulation film 46 of typically $SiO_2$ in the step of FIG. 11H. It should be noted that the interlayer insulation film 46 thus formed shows a projection at the top surface thereof in correspondence to the foregoing conductor pattern 45.

Figure 11I:
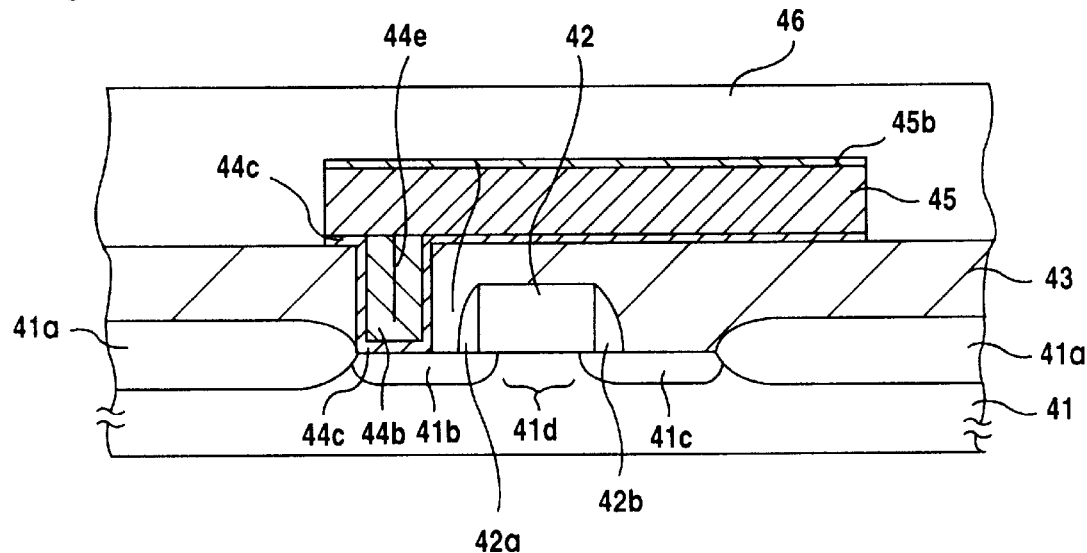
Figure 11J:
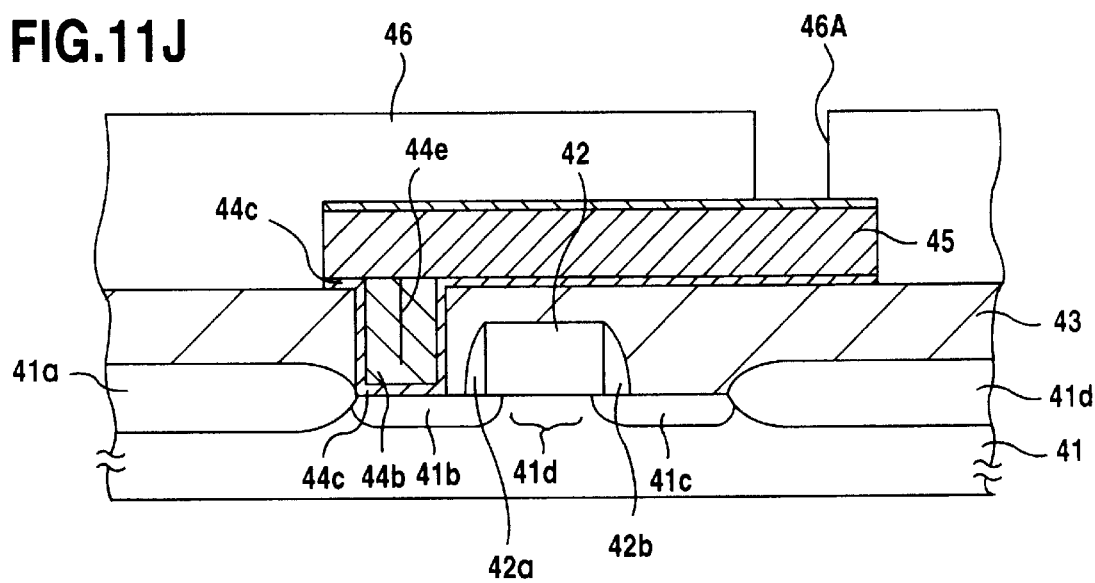
Figure 11K:
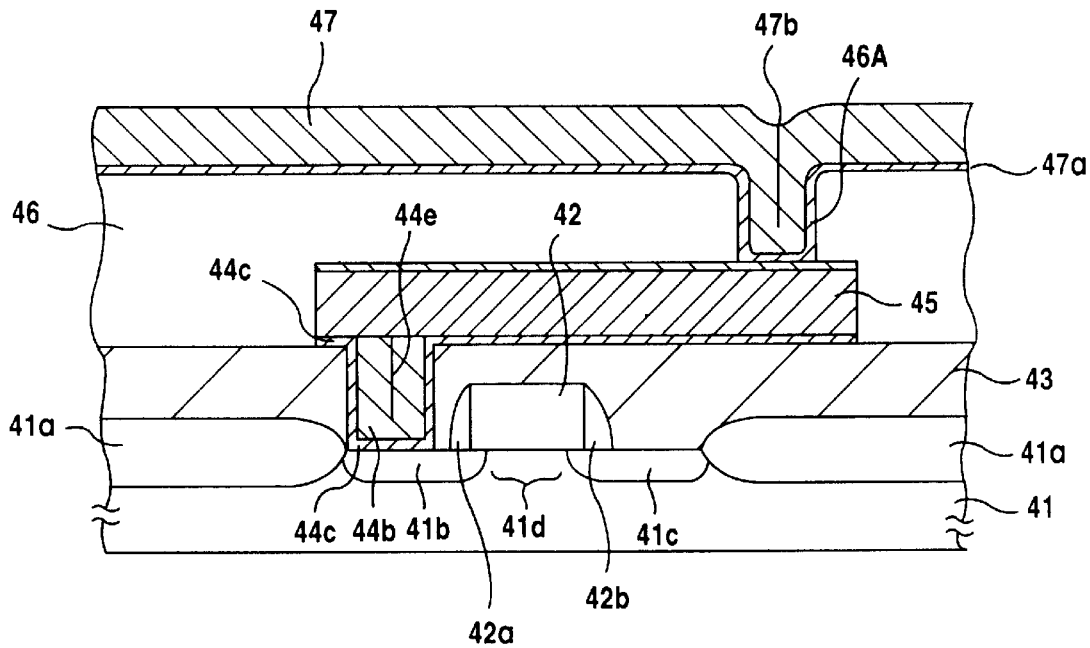
Figure 11L:
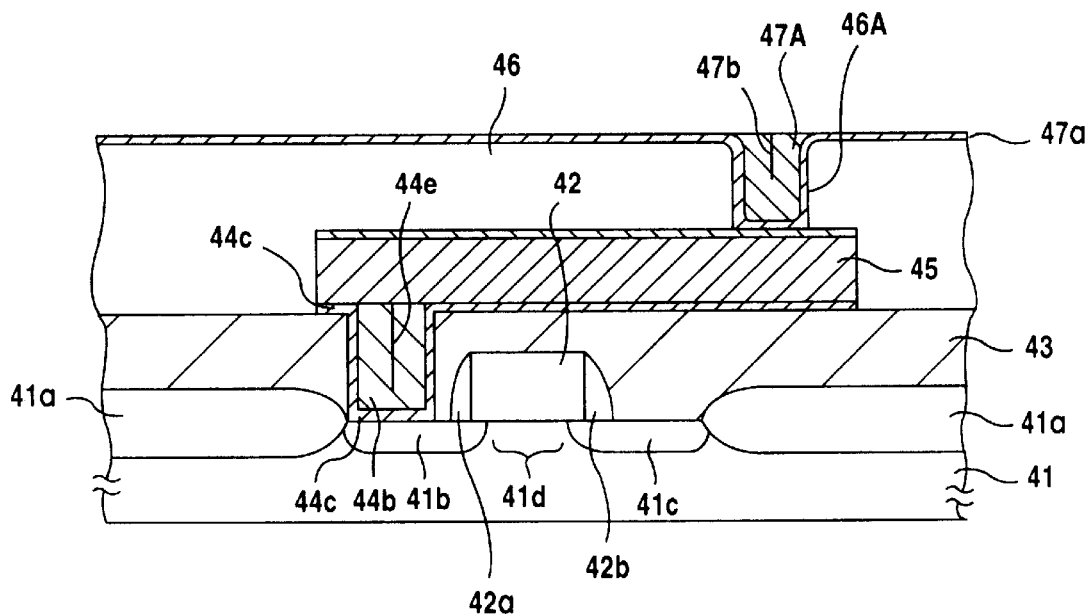

Next, in the step of FIG. 11I, the interlayer insulation film 46 is planarized by a CMP process that uses $Mn_2O_3$ or $Mn_3O_4$ abrasives in the slurry. Further, the interlayer insulation film 46 thus planarized is patterned in the step of FIG. 11J, wherein a contact hole 46A is formed so as to expose the conductor layer 45. Further, a TiN layer 47a and a W layer 47 are deposited consecutively on the interlayer insulation film 46 in the step of FIG. 11K so as to fill the contact hole 46, and a step of FIG. 11L is conducted in which the W layer 47 is removed by a CMP process that uses $MnO_2$ abrasives in the slurry. As a result of the polishing, a conductive plug 47A is formed so as to fill the contact hole 46A. Similarly as before, the conductive plug 47A may include a seam 47b at the central part thereof.

Further, another interconnection pattern or an interlayer insulation film may be provided on the structure of FIG. 11L.

In the foregoing fabrication process of the semiconductor device, it should be noted that a planarization is applied to the insulation film 43 or the interlayer insulation film 46 of $SiO_2$ in the step of FIG. 11B or FIG. 11I by a CMP process that uses abrasives of $Mn_2O_3$, $Mn_3O_4$ or a mixture thereof in the slurry. It is also possible to conduct the foregoing CMP process by a slurry that uses $MnO_2$ abrasives in combination with a solvent of which composition is adjusted fore realizing the oxidation-reduction potential and pH represented in the phase diagram of FIG. 8. Further, the removal of the conductor layer 44 or 47 of W is conducted in the step of FIG. 11E or FIG. 11L by a CMP process that uses $MnO_2$ abrasives.

As explained already, the abrasives of $MnO_2$, $Mn_2O_3$ or $Mn_3O_4$ are soluble to an acid, and thus, any residual abrasives remaining in the substrate (work) or in the polishing rig or apparatus can be removed easily by an acid cleaning process. For this purpose, a cleaning solution containing HCl, $H_2O_2$ and $H_2O$ with a volumetric ratio of 1:1:48 may be used as described already.

[Fourth Embodiment]

FIGS. 12A–12L are diagrams showing the fabrication process of a semiconductor device including a multilayer interconnection structure according to a fourth embodiment of the present invention.

Figure 12A:
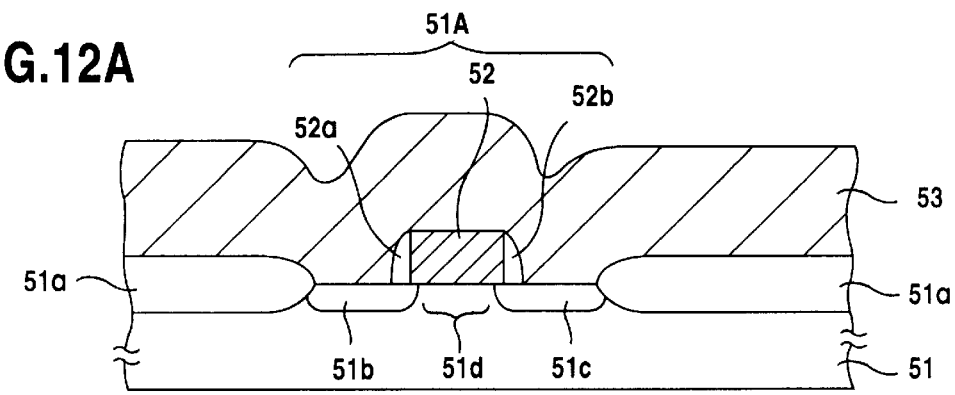
FIGS. 12A–12M are diagrams showing a fabrication process of a semiconductor device according to a fourth embodiment of the present invention.

Referring to FIG. 12A, a Si substrate 51 corresponding to the Si substrate 1 or 21 is defined with an active region 51A by a field oxide film 51a, and a gate electrode 52 is provided on the substrate 51 in the active region 51A, with a gate insulation film (not shown) intervening between the substrate 51 and the gate electrode 52. Further, the substrate 51 is formed with diffusion regions 51a and 51b at both sides of the gate electrode 52 and a channel region 51d is defined in the substrate 51 immediately below the gate electrode 22. The gate electrode 22 carries side wall oxide films 52a and 52b at both lateral side walls thereof, and an interlayer insulation film 53 typically of $SiO_2$ is provided on the substrate 51 by a CVD process such that the interlayer insulation film 53 covers the gate electrode 52 including the side wall oxide films 52a and 52b.

Figure 12B:
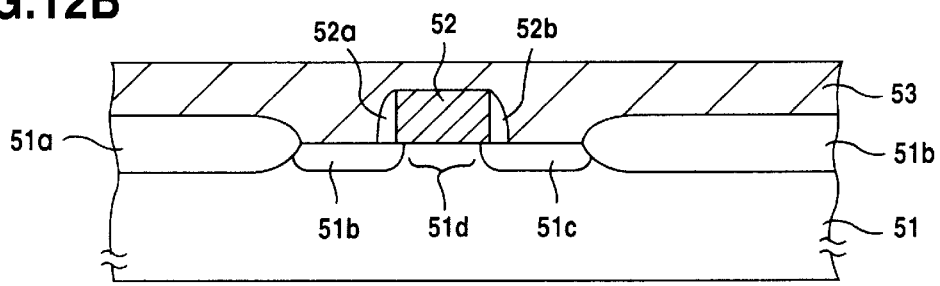

As will be noted from FIG. 12A, the interlayer insulation film 53 thus formed has a projection and depression at a top surface thereof in correspondence to the gate electrode 52, and thus, the structure of FIG. 12A is planarized in the step of FIG. 12B by polishing the interlayer insulation film by a CMP process that uses a slurry, in which abrasives of $Mn_2O_3$ or $Mn_3O_4$ are dispersed in a suitable solvent such as $H_2O$. As explained already with reference to TABLE II, a polishing rate of more than three times as large as the conventional polishing rate is achieved by using a slurry that contains $Mn_2O_3$ abrasives for this purpose. Further, a polishing rate of more than twice as large as the conventional polishing rate is obtained when a slurry that contains $Mn_3O_4$ abrasives is used for the same purpose.

Figure 12C:
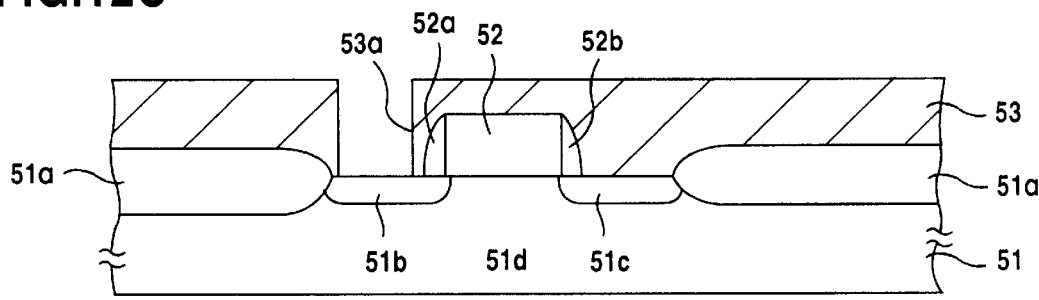
Figure 12D:
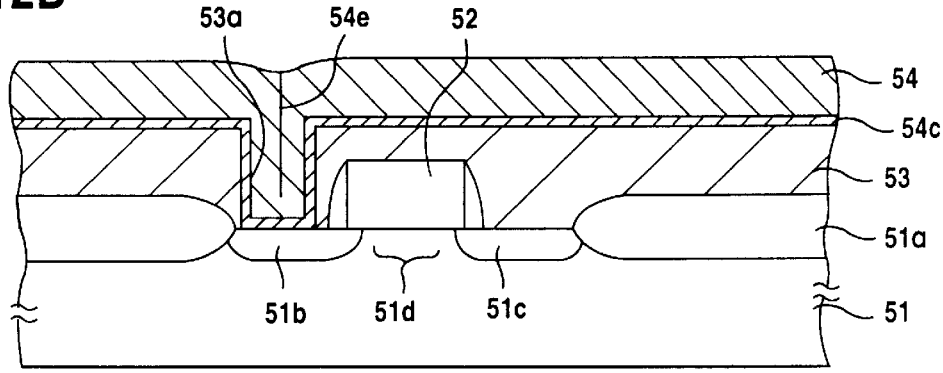

Next, in the step of FIG. 12C, the interlayer insulation film 53 thus planarized is formed with a contact hole 53a so as to expose the diffusion region 51b, and a TiN layer 54c and a W layer 54 are deposited on the structure of FIG. 12C consecutively by a sputtering process or a CVD process.

Figure 12E:
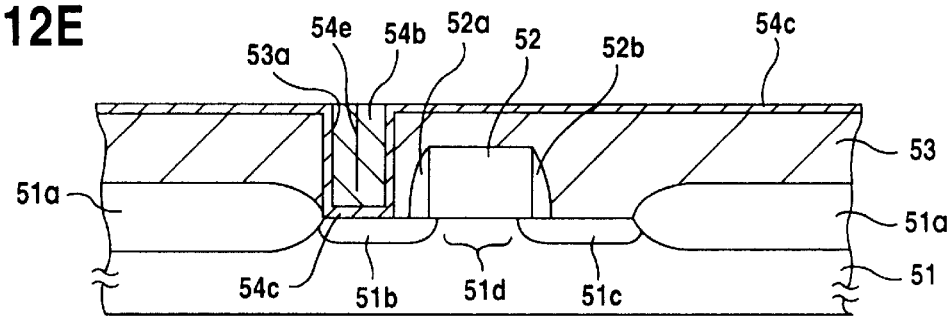

The W film 54 thus deposited is then removed in the step of FIG. 12E by a CMP process that uses $MnO_2$ abrasives, and a structure in which a W plug 54b fills the contact hole 53a is obtained as indicated in FIG. 12E. In the process of FIG. 12E, it should be noted that the TiN layer 54c remains more or less intact. While the W plug 54b thus formed includes a seam 54e at a central part thereof as a result of the lateral growth of the W layer in the contact hole 23a at the time of the deposition, the problem of erosion of the seam by a liquid oxidant such as $H_2O_2$ is successfully avoided by using the $MnO_2$ abrasives. It should be noted that the $MnO_2$ abrasives in the slurry acts as a solid oxidant and does not penetrate into the seam 54e even during the polishing process of the W layer 54.

Figure 12F:
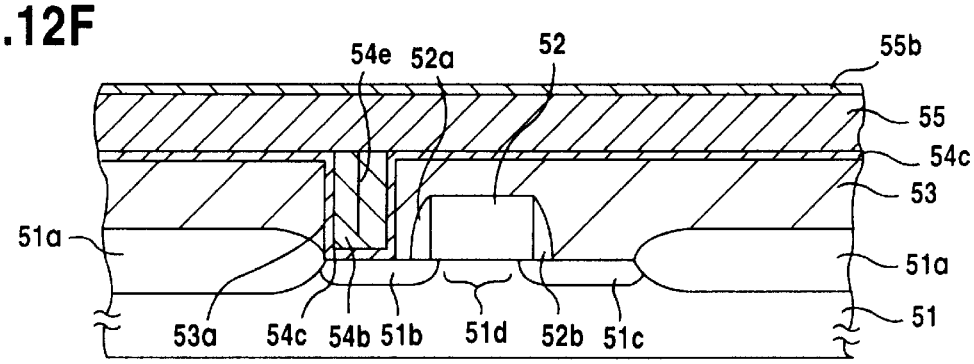

Next, in the step of FIG. 12F, a thin Ti film (not shown) is formed on the structure of FIG. 12E by a sputtering process or a CVD process, and a conductor layer 55 of Al or an Al alloy is formed on the structure of FIG. 12E. Further, a thin Ti layer (not shown) is deposited on the conductor layer 55, and a TiN layer 55b is formed further thereon by a sputtering process or a CVD process.

Figure 12G:
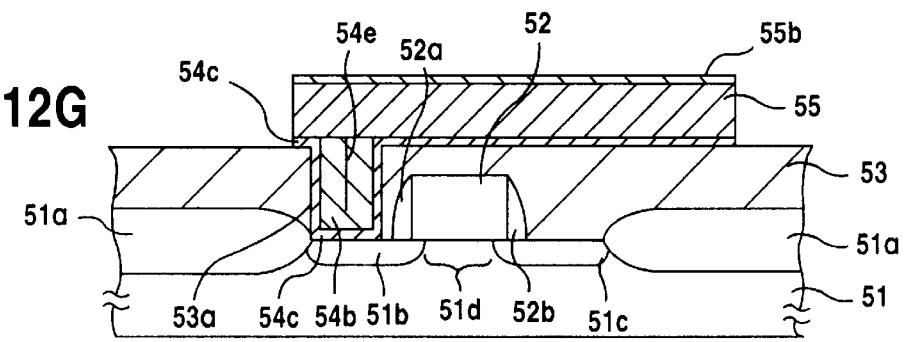
Figure 12H:
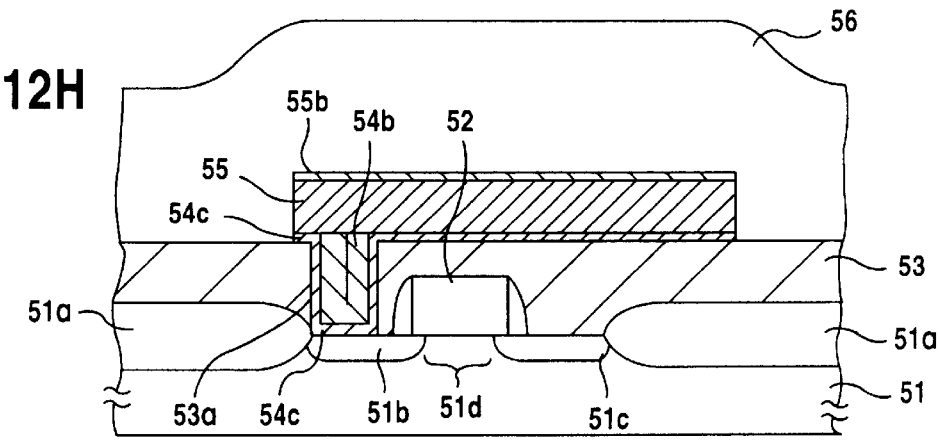

Next, in the step of FIG. 12G, the conductor layer 55 as well as the TiN layers 54c and 55b are patterned, and the structure thus obtained is covered by an interlayer insulation film 56 of typically $SiO_2$ in the step of FIG. 12H. It should be noted that the interlayer insulation film 56 thus formed shows a projection at the top surface thereof in correspondence to the foregoing conductor pattern 55.

Figure 12I:
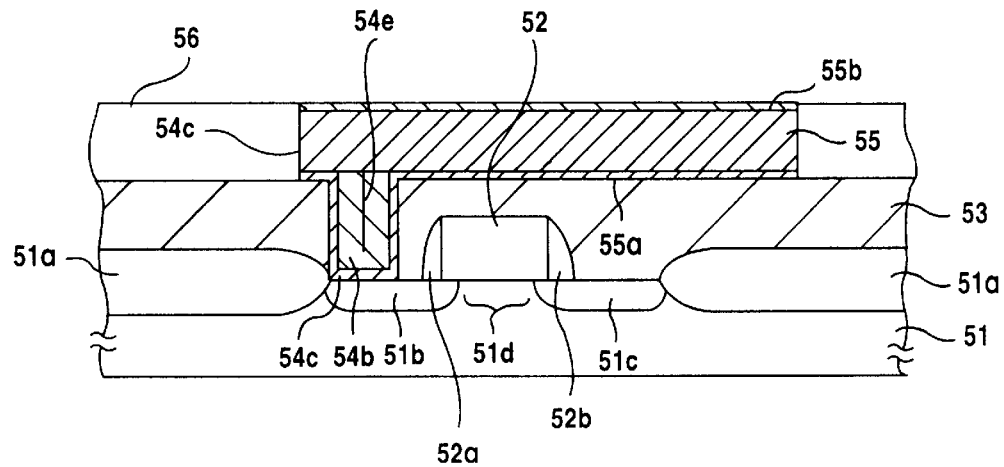

Thus, in the step of FIG. 12I, the interlayer insulation film 56 of FIG. 12H is planarized by a CMP process that uses $Mn_2O_3$ or $Mn_3O_4$ abrasives in the slurry, until the TiN layer 55b covering the conductor layer 55 is exposed.

TABLE IV

| $Mn_2O_3$ | $Mn_3O_4$ | silica |
|---|---|---|
| 0.2–0.25 $\mu$m/min | 0.15–0.20 $\mu$m/min | 0.065 $\mu$m/min |

TABLE IV represents the polishing rate of the slurry that uses $Mn_2O_3$ or $Mn_3O_4$ abrasives as applied to an $SiO_2$ film, wherein the polishing condition is given in TABLE III. For the sake of comparison, the polishing rate of a conventional colloidal silica slurry (SC112) for an $SiO_2$ film is also listed. As will be seen clearly in TABLE IV, the slurry that uses $Mn_2O_3$ abrasives provides a polishing rate of three or four times as large as the conventional polishing rate achieved by the colloidal silica slurry. Similarly, the slurry that uses $Mn_3O_4$ abrasives provides a polishing rate of two or three times as large as the foregoing conventional polishing rate. In TABLE IV, it should be noted that the polishing rates for the $Mn_2O_3$ slurry and the colloidal slurry correspond to the polishing rates in TABLE II.

As the polishing rate obtained by the slurry that uses $Mn_2O_3$ or $Mn_3O_4$ slurry is very large as compared with the polishing rate of the conventional colloidal silica slurry, the polishing of the interlayer insulation film 56 proceeds rapidly until the TiN layer 55b on the conductor layer 55 is exposed. Thereby, the thickness of the interlayer insulation film 56 remaining on the interlayer insulation film 53 is controlled exactly, in the state of FIG. 12I, by the thickness of the conductor layer 55. As the thickness of the conductor layer 55 can be controlled exactly at the time of the deposition, the thickness of the interlayer insulation film 56 is also controlled exactly. Further, it should be noted that the CMP process that uses the $Mn_2O_3$ or $Mn_3O_4$ abrasives in the slurry does not act substantially upon a nitride film such as the TiN film 55b. Thus, the TiN film 5b can be used as an effective polishing stopper. Further, the polishing stops more or less spontaneously even when the TiN film 55b is formed on the conductor layer 55 due to the very small polishing rate of the slurry with respect to the conductor layer 55, which may be formed of W. See TABLE II. It should be noted that a similar very large polishing rate is achieved also for the interlayer insulation film 56 when the interlayer insulation film 56 is formed of a silicate glass such as PSG or BPSG.

Figure 12J:
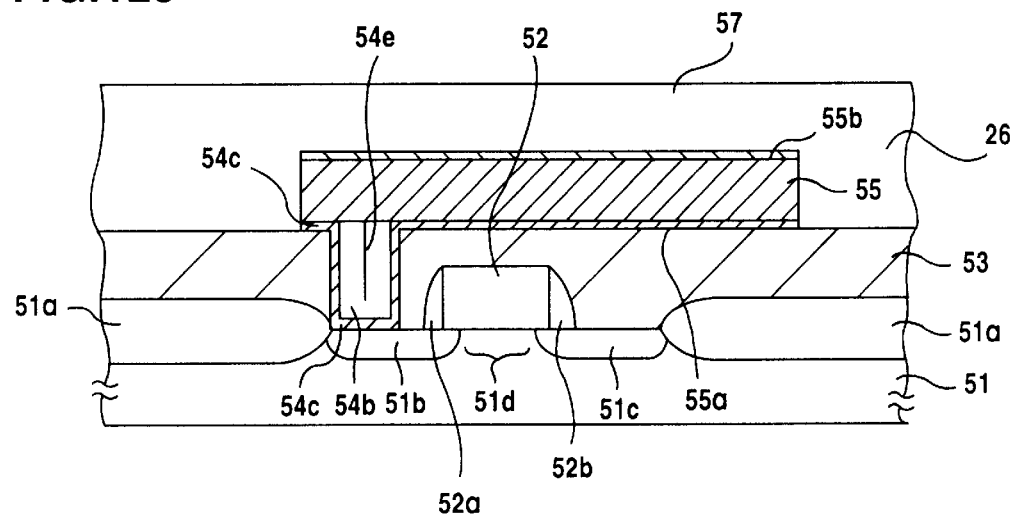

After the step of FIG. 12I, another interlayer insulation film 57 is formed on the interlayer insulation film 56 thus planarized in the step of FIG. 12J. As the interlayer insulation film 56 is excellently planarized, it is possible to form the insulation film 56 with an exact thickness by a CVD process or other similar deposition process.

Figure 12K:
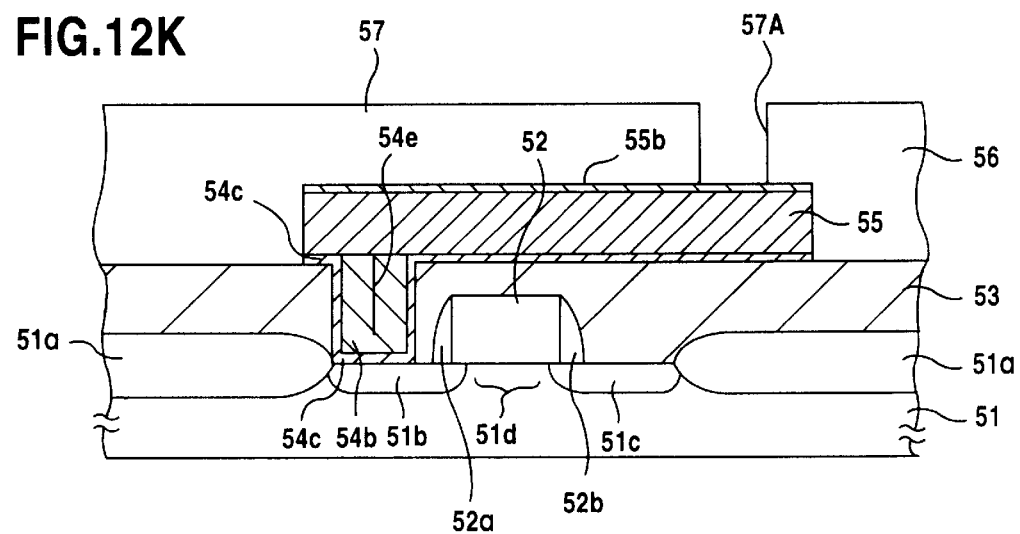
Figure 12L:
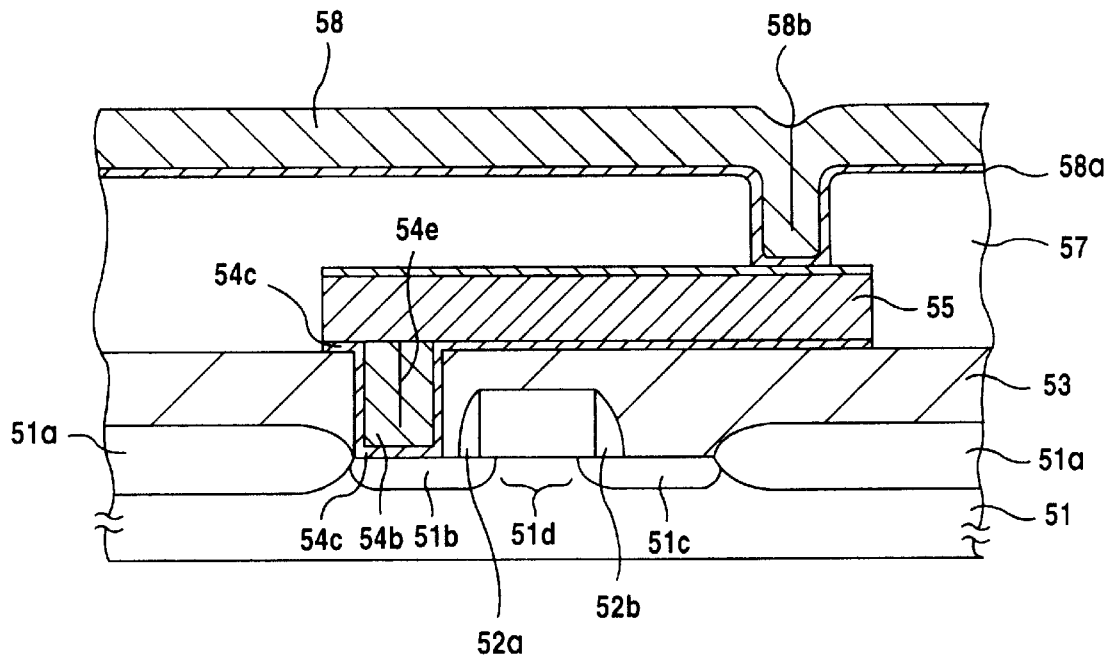

Next, in the step of FIG. 12K, a contact hole 57A is formed in the interlayer insulation film 57 so as to expose the conductor layer 55. Further, a TiN layer 58a and a W layer 58 are deposited consecutively on the interlayer insulation film 57 in the step of FIG. 12L so as to fill the contact hole 57A, and the step of FIG. 11M is conducted in which the W layer 58 is removed by a CMP process that uses $MnO_2$ abrasives in the slurry. As a result of the polishing, a conductive plug 58A is formed so as to fill the contact hole 57A. Similarly as before, the conductive plug 58A may include a seam 58b at the central part thereof, while no problem of corrosion of the seam occurs during the polishing process of FIG. 12M.

Figure 12M:
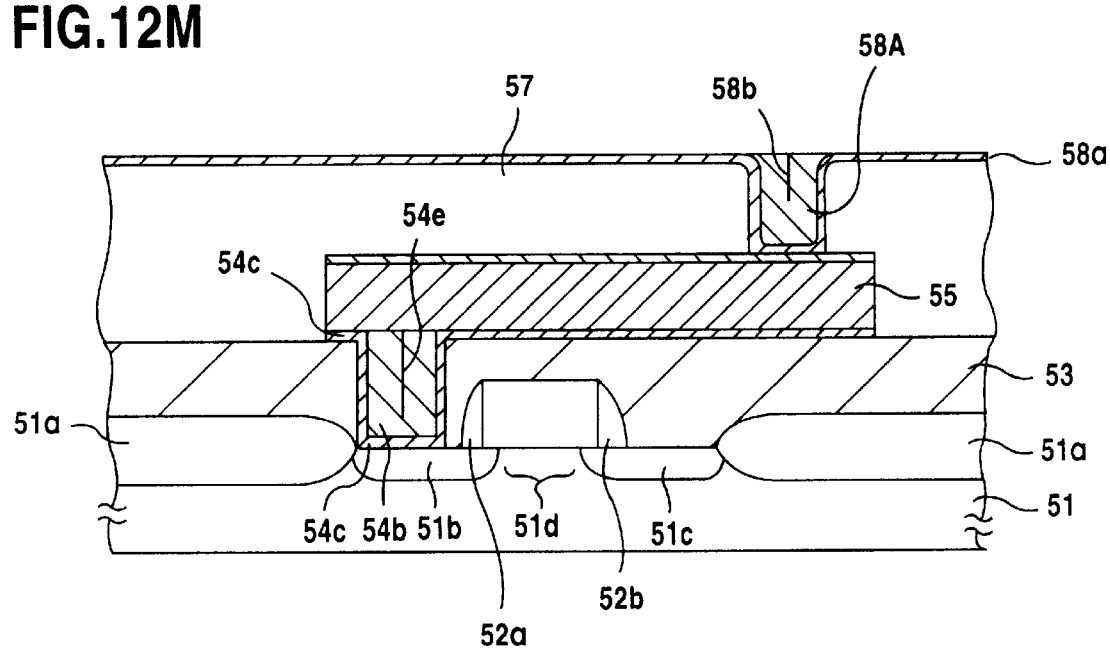

Further, another interconnection pattern or an interlayer insulation film may be provided on the structure of FIG. 12M.

The reason that the use of a slurry that includes $Mn_2O_3$ or $Mn_3O_4$ abrasives increases the polishing rate of an oxide film is understood as follows.

First, the manganese oxide causes a chemical reaction, when contacted with $SiO_2$ that forms the interlayer insulation film, to cut the chemical bond between Si and O atoms forming the film.

Further, as will be explained later, the $Mn_2O_3$ or $Mn_3O_4$ abrasives used in the present invention are formed by a thermal treatment of $MnO_2$. As a result of the thermal treatment, there occurs degassing of $O_2$ from $MnO_2$ and the $MnO_2$ is converted to $Mn_2O_3$ or $Mn_3O_4$. It should be noted that such a degassing of $O_2$ causes a formation of minute pores in the agglomerate of $Mn_2O_3$ or $Mn_3O_4$, and the agglomerate of $Mn_2O_3$ or $Mn_3O_4$ thus formed is easily crushed at the time of milling even when the proportion of zirconia balls is reduced in the mill. Further, the abrasives of $Mn_2O_3$ or $Mn_3O_4$ thus obtained include a large amount of pores and are easily crumbled at the time of polishing. Thereby, the area of contact between the work and the abrasives is increased during the polishing process.

[Fifth Embodiment]

Next, the process for producing the slurry of the first embodiment, which contains $MnO_2$ as a primary component of the abrasives, will be described as a fifth embodiment of the present invention.

Figure 13:
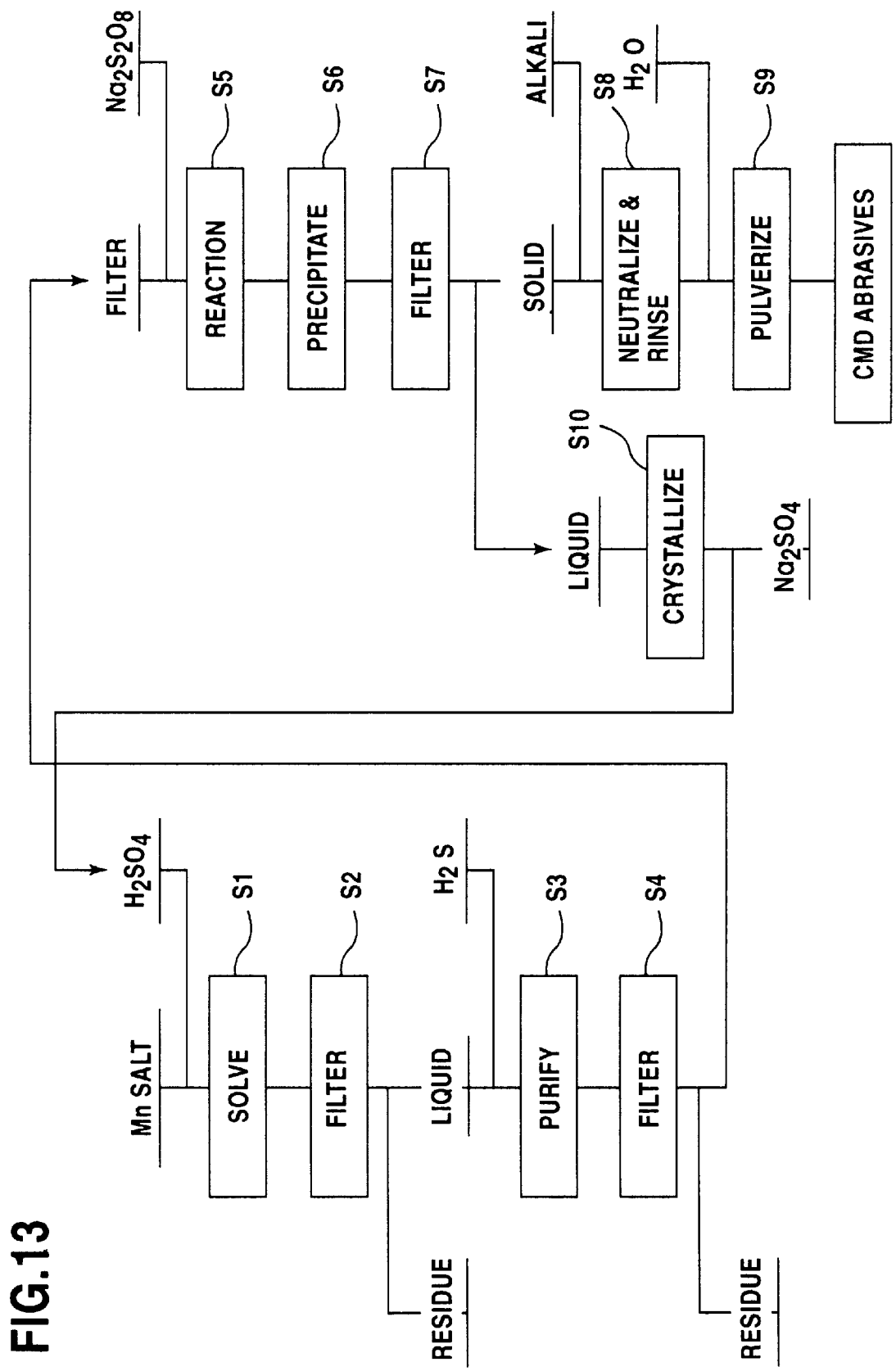
FIG. 13 is a flowchart showing a process for chemically synthesizing a $MnO_2$ slurry.

Conventionally, a process called CMD (chemically synthesized manganese dioxide) process is known as a production process of $MnO_2$, wherein FIG. 13 shows the case in which this known process is applied to the production of the $MnO_2$ abrasives of the present invention. Thus, the process of FIG. 13 itself is a new process.

Referring to FIG. 13, the process starts with a step S1 in which a manganese salt such as $MnSO_4$ or $MnCO_3$ is dissolved into a sulfuric acid ($H_2SO_4$), and the solution thus obtained is filtered in a step S2 for separation of any insoluble contaminants. After the step S2, the solution thus filtered is added with hydrogen sulfide ($H_2S$) such that metal contaminants such as Cu, W, Mo, and the like, are removed from the solution by causing a precipitation. The process of the step S3 may be omitted when a high purity source material is used in the step S1.

After the step S3, a filtering process is carried out in a step S4 for separation of any precipitates that has been formed in the step S3, and the process proceeds further to a step S5 in which sodium thiosulfate ($Na_2S_2O_8$) is introduced into the solution thus obtained in the step S4. Thereby, a reaction

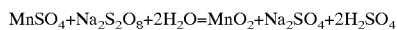
$MnSO_4+Na_2S_2O_8+2H_2O=MnO_2+Na_2SO_4+2H_2SO_4$ takes place in the solution in the step S4, and the manganese dioxide ($MnO_2$) thus formed causes a precipitation in a subsequent step S6.

After the step S6, the process proceeds to a filtering step S7, wherein $MnO_2$ product thus recovered as a result of the filtration process of the step S7 is neutralized in a step S8 by an alkali such as $Na_2CO_3$ or $NH_4OH$. The $MnO_2$ product thus neutralized is then rinsed by a pure water in the same step S8.

Further, the $MnO_2$ product is subjected, after the step S8, to a pulverizing process in a step S9 and the desired $MnO_2$ abrasives are obtained by applying a classification process to the $MnO_2$ particles obtained as a result of the pulverization On the other hand, the solution filtered in the step S7 is processed in a step S10 wherein $Na_2SO_4$ formed in the solution as a result of the foregoing reaction is removed by a crystallization process. Thereby, the solution contains $H_2SO_4$ after the step S10 and the solution thus obtained is supplied to the step S1 for reuse.

The inventors of the present invention discovered, however, that such CMD particles produced as a result of the CMD process does not provide the performance of the abrasive described heretofore.

After an investigation, it was discovered that the foregoing abrasive performance is obtained when the $MnO_2$ particles are produced by an electrolytic process or EMD process (EMD; electrolytic manganese dioxide). By suitably controlling the condition of the electrolytic process, it is possible to form the EMD precipitates on the electrode in the form of an aggregate of needle-like crystals each having a size of typically 1 μm in an elongating direction thereof. In such needle-like crystals, it is believed that release of oxygen occurs easily at the tip end of the crystal where the chemical bond between Mn and O atoms is relatively weak.

In the case of the CMD particles, on the other hand, the material obtained as a result of the CMD process is a mixture of τ-phase $MnO_2$ and β-phase $MnO_2$, and a substantial part of the τ-phase $MnO_2$ is formed of crystals other than the needle-like crystals.

Figure 14:
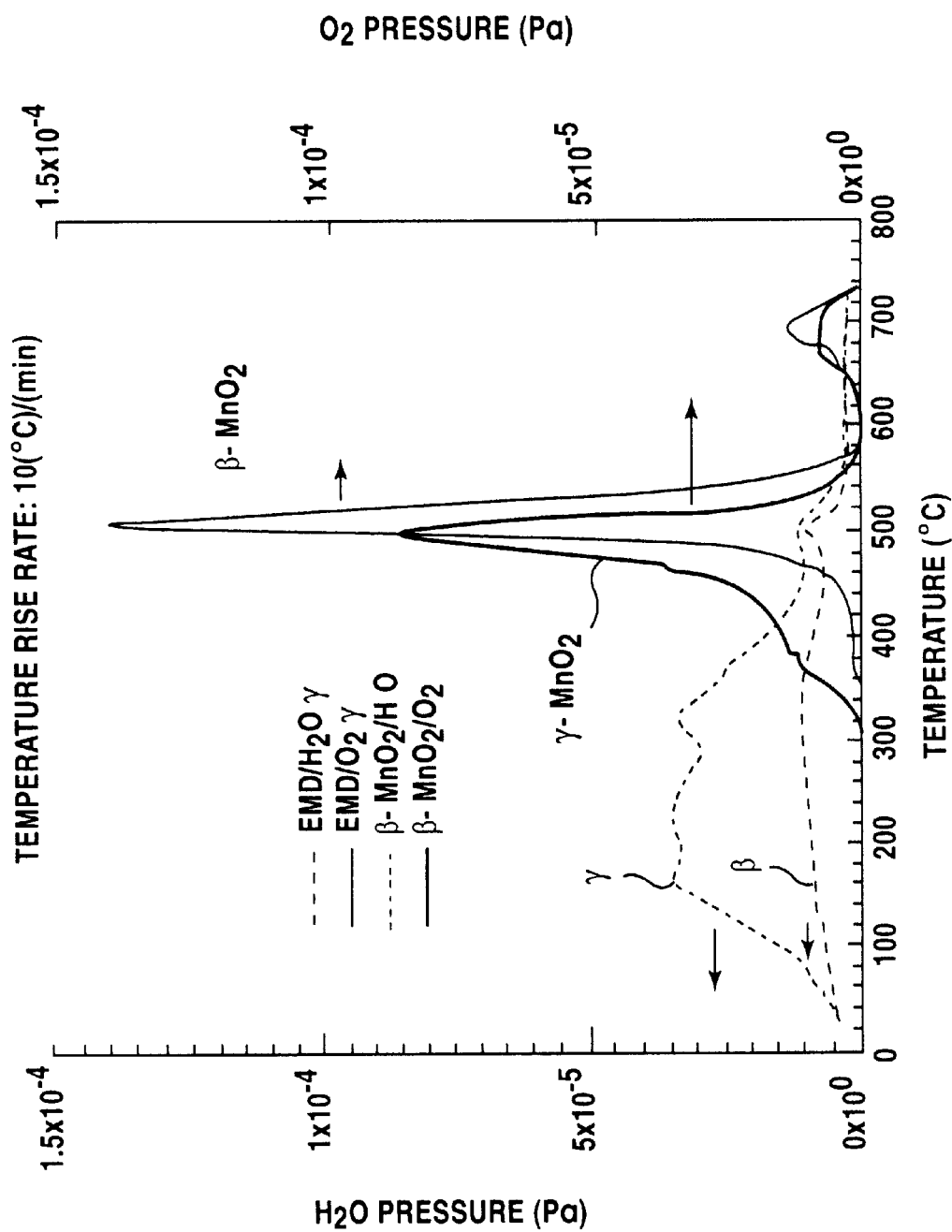
FIG. 14 is a diagram comparing the performance of solid oxidant for $\beta$- and $\tau$-phase $MnO_2$.

FIG. 14 compares the release characteristics of $O_2$ and $H_2O$ between a τ-phase EMD and β-phase EMD, wherein the horizontal axis represents the temperature and the vertical axis at the left represents the partial pressure of $O_2$ released as a result of heating, while the vertical axis at the right represents the partial pressure of $H_2O$ released as a result of heating. The heating was made with a rate of 10° C./min.

Referring to FIG. 14, it should be noted that the τ-phase EMD provides a higher $O_2$ partial pressure than the β-phase EMD in the temperature range lower than 500° C. In other words, τ-phase EMD acts as a superior solid oxidant to β-phase EMD in the temperature range used commonly in a CMP process. Further, it is confirmed that the dissociation of $O_2$ occurs at a lower temperature when the τ-phase $MnO_2$ is formed of needle-like crystals, rather than in the case in which $MnO_2$ crystals of other morphology are mixed into the τ-phase $MnO_2$.

It is of course not impossible to produce $MnO_2$ in the τ-phase by the CMD process explained with reference to FIG. 13. In this case, however, it is necessary to cause the precipitation of $MnO_2$ gradually, while such a gradual precipitation requires a very complex temperature control. An example of such a temperature control may include the steps of: raising the temperature from a room temperature to 50° C. in about 2 hours; holding the temperature at 50° C. for about 20 hours; raising the temperature from 50° C. to 75° C. in about 1 hour; holding the temperature at 75° C. for about 3 hours; raising the temperature from 75° C. to 85° C. in about 1 hour; holding the temperature at 85° C. for about 1 hour; raising the temperature from 85° C. to 100° C. in about 0.5 hours; holding the temperature at 100° C. for about 1.5 hours; and lowering the temperature from 100° C. to 20° C. in about 1 hour. However, such a complex temperature control obviously requires an extensive facility. Further, such a process does not guarantee that $MnO_2$ obtained as a result contains only the needle-like crystals.

Thus, in the present embodiment, an electrolytic process is employed to form high purity τ-phase $MnO_2$ suitable for the CMP process.

Figure 15:
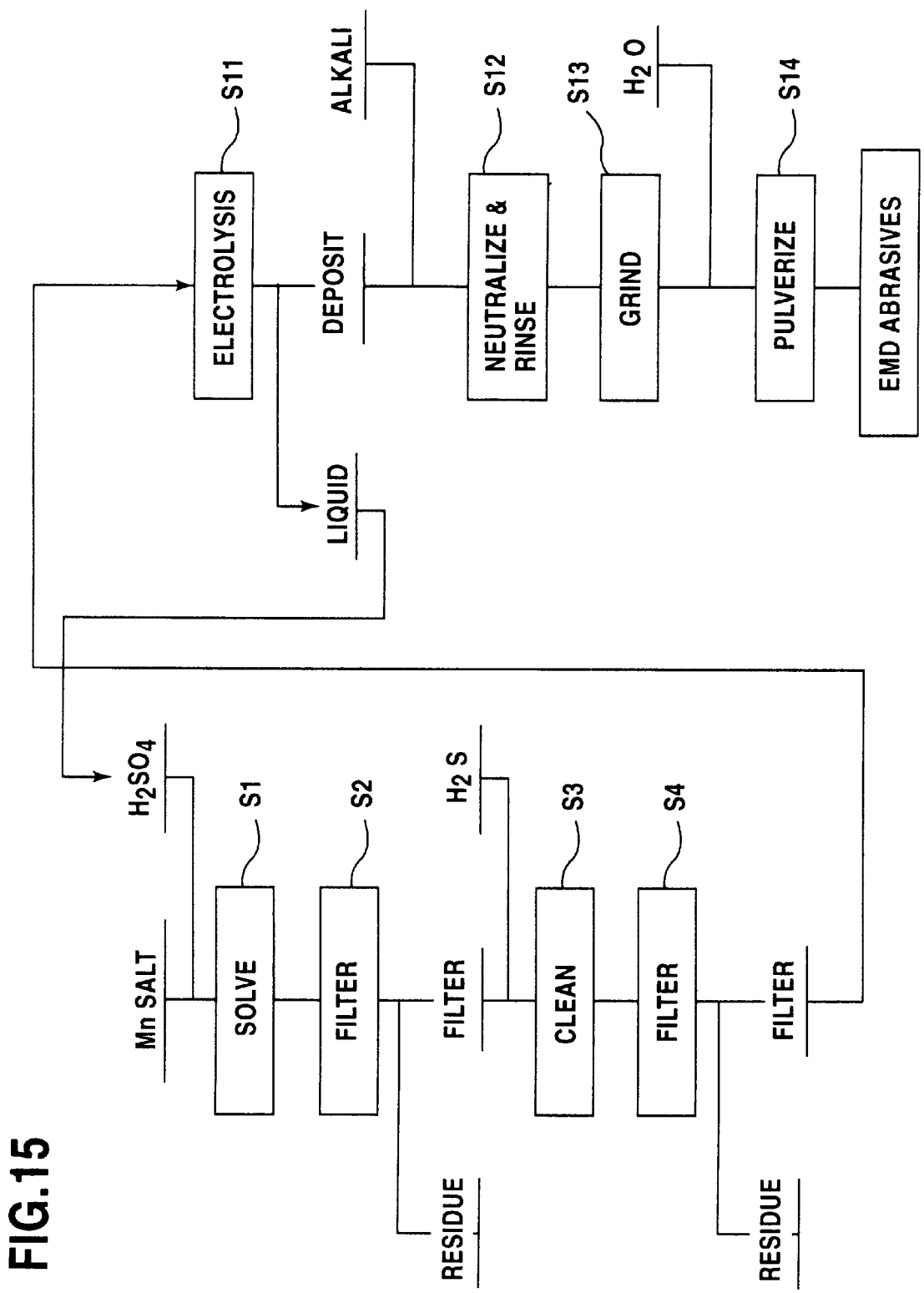
FIG. 15 is a flowchart showing a process of producing a slurry of $MnO_2$ according to a fifth embodiment of the present invention.

FIG. 15 shows the process of producing the EMD slurry according to the fifth embodiment of the present invention.

Referring to FIG. 15, the steps identical to the steps S1–S4 are carried out at first, wherein a manganese salt such as $MnSO_4$ or $MnCO_3$ is dissolved into $H_2SO_4$ in the step S1 to form an electrolytic solution. Next, the impurity components insoluble to the solution are separated in the step S2 by a filtration, and the electrolytic solution thus obtained is purified in the step S3 by introducing $H_2S$ into the solution.

Similarly as before, contaminants such as Cu, W, MO, and the like, cause a precipitation and the precipitates thus formed are removed in the filtration process in the step S4. When a high purity source material is used in the step S1, the steps S3 and S4 may be omitted.

In the present embodiment, an electrolysis is applied in a step S11 to the solution obtained in the step S4 at a temperature of typically 90° C. or more, wherein there occurs an electro-deposition of τ-phase $MnO_2$ (τ-phase EMD) on an anode electrode, which may be formed of Ti, Pb or a graphite. Typically, the solution contains $MnSO_4$ with a concentration of 0.5–1.2 mol/l and $H_2SO_4$ with a concentration of 0.5–1.2 mol/l, and the electrolysis is carried out at a temperature between 90° C. and 98° C. while supplying a current with a current density of 50–120 $A/m^2$. After the electrolysis in the step S11, the solution is reused in the step S1.

The τ-phase EMD precipitates thus obtained on the anode electrode is then neutralized by $NH_4OH$ in a subsequent step S12, and a coarse grinding process is applied thereto in a step S13 to form aggregates of the τ-phase EMD. Further, the aggregates are pulverized in a subsequent step S14 to form abrasives of the τ-phase EMD having a diameter of 1–0.1 $\mu$m or less.

As explained already, the present embodiment enables an efficient polishing by using the τ-phase EMD for the abrasives. For example, a slurry containing the EMD abrasives formed by the electrolytic process shows a polishing rate of 0.10 $\mu$m/min when applied to a W layer. When applied to a thermal oxide film, on the other hand, the same slurry shows a polishing rate of 0.20 $\mu$m/min. The foregoing polishing rates are substantially larger than the corresponding polishing rates obtained by slurry containing the CMD abrasives formed according to the process of FIG. 13. When the latter slurry containing the CMD abrasives is applied to the W layer, a polishing rate of 0.07 $\mu$m/min was observed, while the same slurry shows a polishing rate of 0.15 $\mu$m/min when applied to the thermal oxide film under the same polishing condition. The foregoing difference arises due to the difference in the ability of solid oxidant of the $MnO_2$ particles used for the abrasives.

Table V below compares the content of impurity elements in a CMD abrasive and in an EMD abrasive.

TABLE V

|  | Na | K | Fe | Al | W |
| --- | --- | --- | --- | --- | --- |
| CMD $MnO_2$ | 390 | 1080 | 2900 | 2430 | 27 |
| EMD $MnO_2$ | 15 | 17 | 25 | <5 | 25 |

The result of Table V clearly indicates that the EMD abrasives produced by the electrolytic process is superior to the CMD abrasives in terms of the purity. Particularly, it is noted that the content of Na and K is very small in the EMD abrasives, while this preferable feature is attributed to the electrolytic process that does not use alkalis such as thiosulfate.

[Sixth Embodiment]

Figure 16:
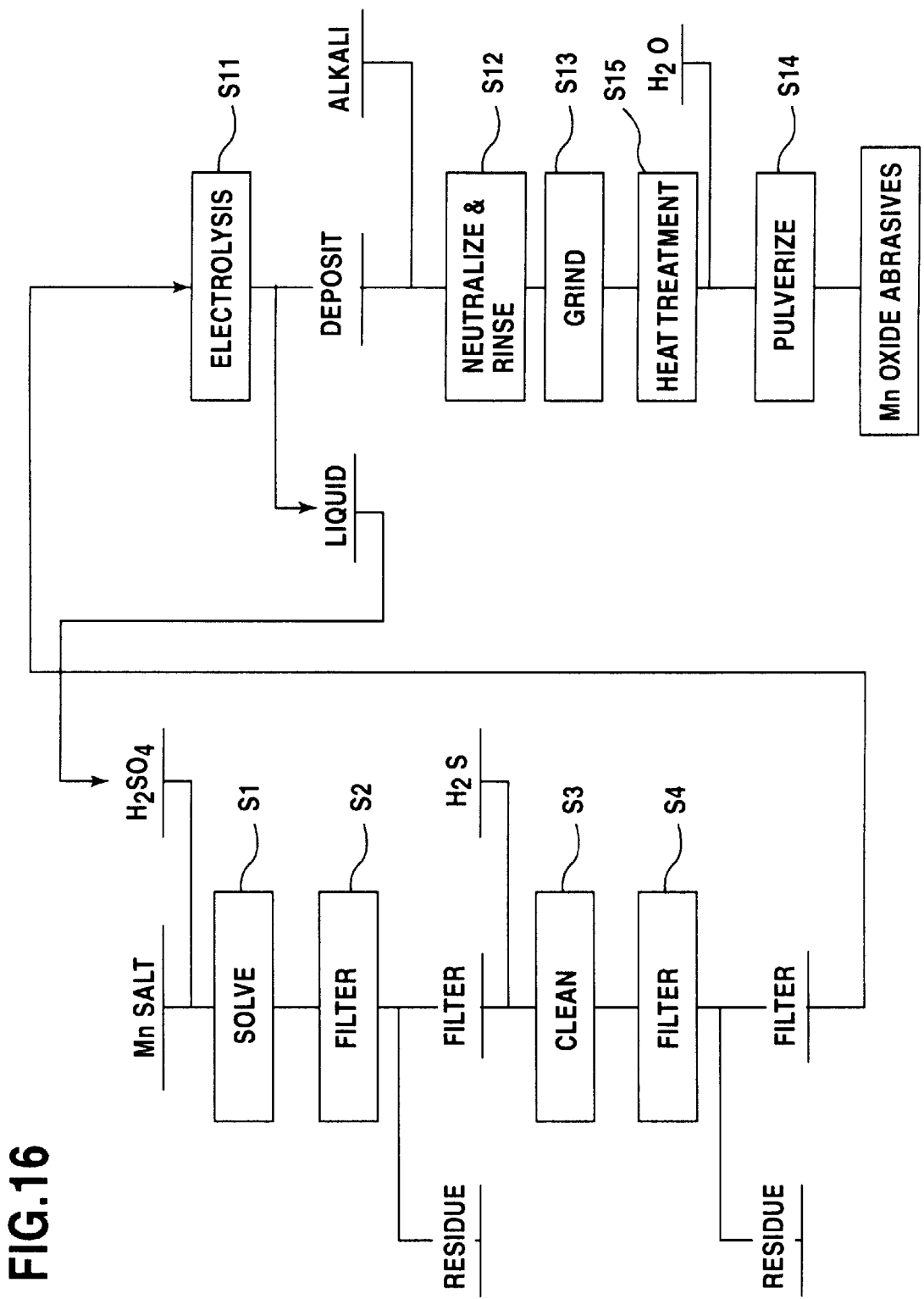
FIG. 16 is a flowchart showing a process of producing a slurry of $Mn_2O_3$ or $Mn_3O_4$ according to a sixth embodiment of the present invention.

FIG. 16 shows the process of producing a slurry containing abrasives of $Mn_2O_3$ or $Mn_3O_4$ according to a sixth embodiment of the present invention in the form of a flowchart, wherein those steps described previously are designated by the same numerals and the description thereof will be omitted.

Referring to FIG. 16, the present embodiment includes a heat treatment process in a step S15 after the grinding process in the step S13 but before the pulverizing process in the step S14 for applying a heat treatment to the τ-phase $MnO_2$ processed in the grinding step S13. In the heat treatment process of the step S15, the τ-phase $MnO_2$ is annealed in the air for 5–10 minutes, typically about 7 minutes, wherein such a heat treatment causes a calcination in the annealed $MnO_2$ and the material changes from $MnO_2$ to $Mn_2O_3$ or $M_3O_4$. When forming $Mn_2O_3$ abrasives, it is preferable to set the annealing temperature between 500–900° C. in the step S15, while when it is desired to form $Mn_3O_4$ abrasives, the annealing temperature should be set between 900–1200° C. in the step S15.

Figure 17A:
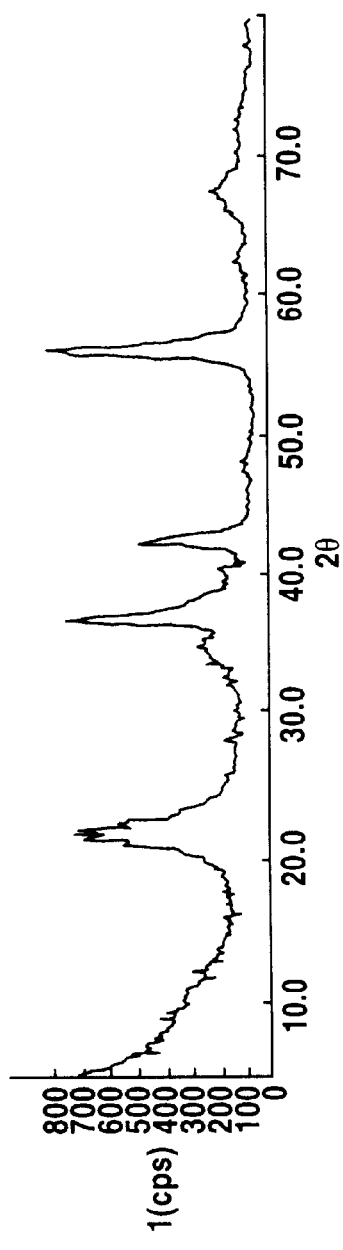
FIGS. 17A–17C show the phase change taking place in a Mn oxide during a heat treatment carried out in the sixth embodiment.
Figure 17B:
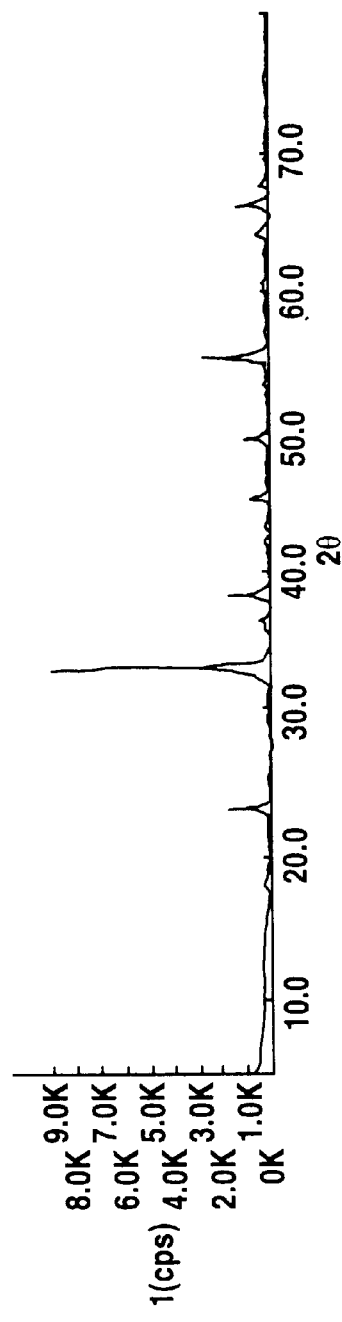
Figure 17C:
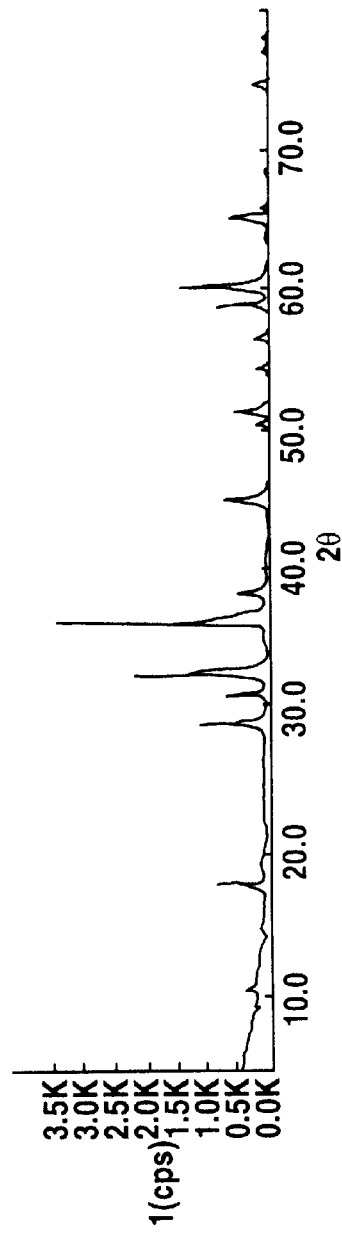

FIGS. 17A–17C show the change of the powder X-ray diffraction pattern of the manganese oxide caused as a result of the annealing process.

Referring to FIGS. 17A–17C, the diffraction pattern of the τ-phase $MnO_2$ shown in FIG. 17A changes to the diffraction pattern of $Mn_2O_3$ shown in FIG. 17B after a heat treatment in the air at 500–900° C. Further, the diffraction pattern changes further to the pattern of $Mn_3O_4$ shown in FIG. 17C after a heat treatment in the air at 900–1200° C.

Figure 18:
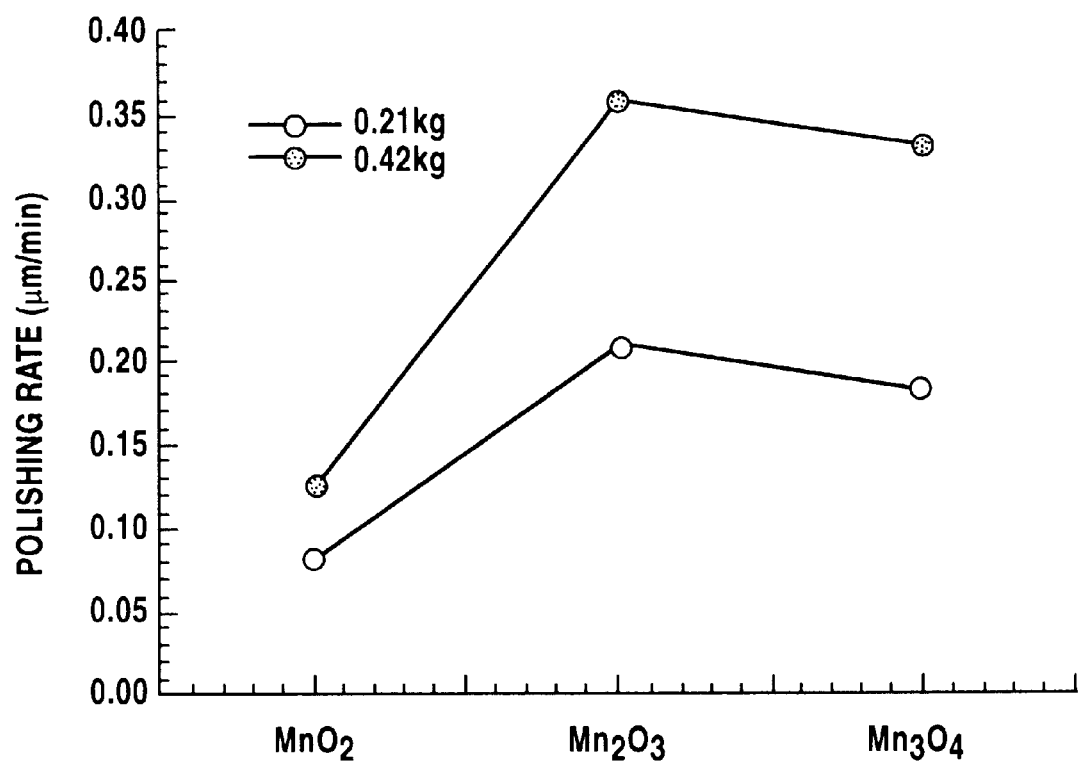
FIG. 18 compares the polishing rate for various manganese oxide slurries.

It should be noted that the X-ray diffraction patterns of FIGS. 17A–17C clearly indicate that the $MnO_2$ abrasives are formed predominantly of $MnO_2$, the $Mn_2O_3$ abrasives are formed predominantly of $Mn_2O_3$ and the $Mn_3O_4$ abrasives are formed predominantly of $Mn_3O_4$, FIG. 18 shows the polishing rate observed when the slurries of the present invention are used for polishing an $SiO_2$ film, wherein the data represented by open circles show the result when the urging force at the time of polishing is set to 0.21 kg while the data represented by solid circles show the result in which the urging force is set to 0.42 kg.

As will be understood clearly from FIG. 18, a very large polishing rate is obtained for the $SiO_2$ film when the $Mn_2O_3$ or $Mn_3O_4$ abrasives are used for the slurry rather than using the τ-phase $MnO_2$ abrasives. In other words, the slurry of the present invention that uses $Mn_2O_3$ or $Mn_3O_4$ abrasives is particularly useful for planarization of the interlayer insulation film in the fabrication process of a semiconductor device. When polishing an $SiO_2$ film by the $MnO_2$ abrasives, it is not necessary that the $MnO_2$ abrasives are formed of τ-phase $MnO_2$. However, use of τ-phase EMD for this purpose is still advantageous in view of high purity of the EMD thus obtained.

[Seventh Embodiment]

In conventional CMP processes that uses $SiO_2$ or $Al_2O_3$ slurries, recycling or reuse of the used abrasives is not practiced commonly, due to the difficulty of recovering the used abrasives by a simple sedimentation process. It should be noted that the abrasives of a slurry are required to show an excellent dispersion in a dispersion medium and do not cause a sedimentation easily. When abrasives show a high sedimentation rate, the concentration of the abrasives in the slurry may change with time and the control of the polishing rate would become difficult. Further, even when some of the abrasives are recovered, such used abrasives are generally contaminated by various impurity elements and the reuse of the same in a CMP process is thought to be difficult.

On the other hand, the slurry described heretofore that uses a manganese oxide for the abrasives opens the possibility of recycling and reusing the abrasives.

Figure 19:
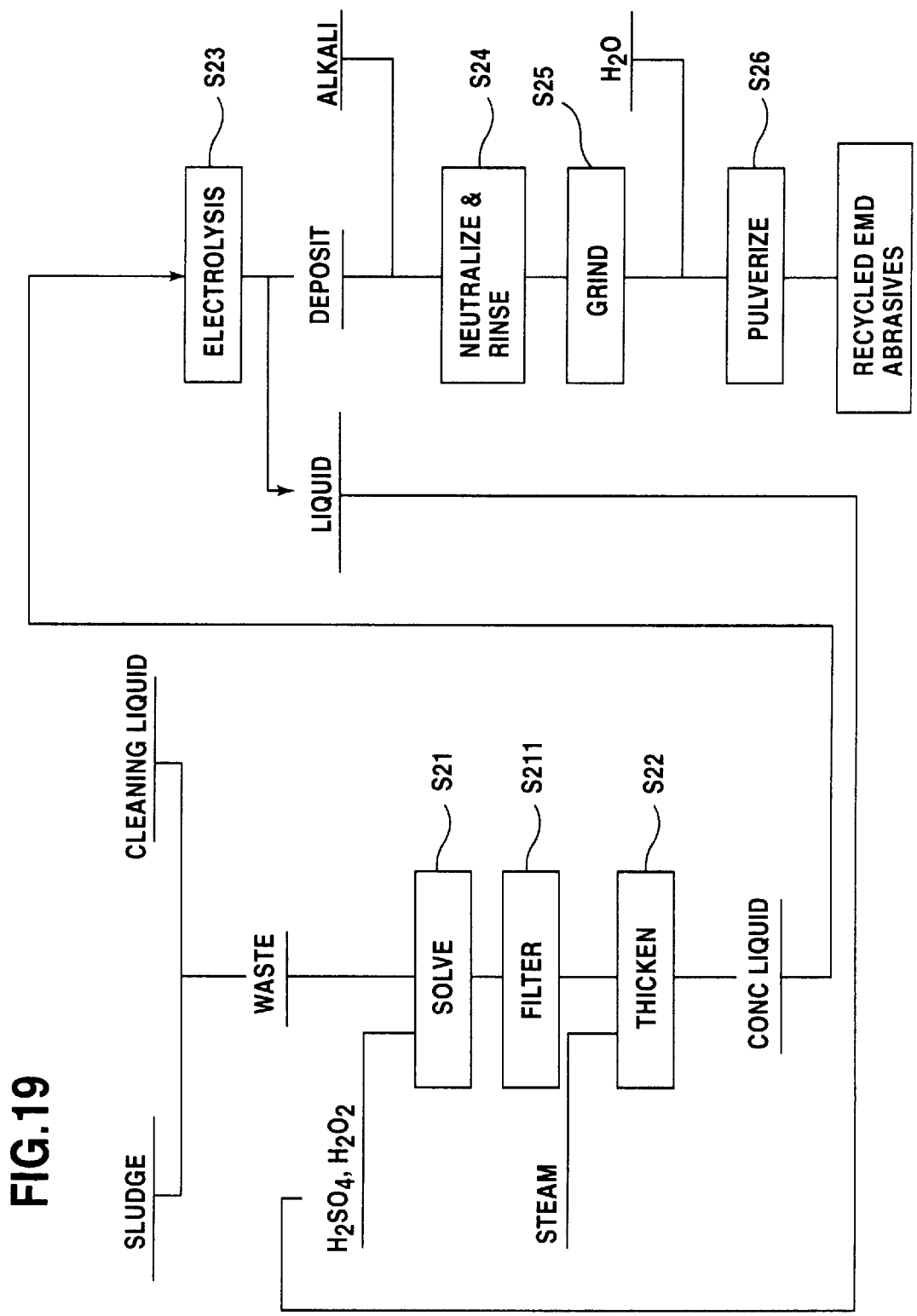
FIG. 19 is a flowchart showing a process for recycling a $MnO_2$ slurry according to a seventh embodiment of the present invention.

FIG. 19 shows a seventh embodiment of the present invention for recycling the $MnO_2$ abrasives.

Referring to FIG. 19, the abrasives as well as the cleaning liquid used in the CMP process are recovered as a sludge, wherein it should be noted that the sludge thus recovered contains various impurity elements constituting the conductor layer or the insulation layer to which the CMP process has been applied. Similar impurities are formed also when carrying out the CMP process by using the slurries containing the $Mn_2O_3$ or $Mn_3O_4$ abrasives.

The sludge thus recovered is then dissolved into a solution of $H_2SO_4$ and $H_2O_2$ in a step S21, and the solution thus dissolved the sludge is filtered in a step S211 for removal of any particulate impurities. After the filtration, the solution is heated as necessary in a step S22 by contacting with a coiled heat exchanger through which a high temperature steam is supplied, such that the concentration of $Mn^{2+}$ in the sludge increases to about 10%. Generally, a sludge thus recovered is diluted by a large amount of cleaning liquids and solutions as a result of various cleaning processes and contains the solid phase material by only about 1–2%. Thus, it is generally necessary to carry out the concentration step of S22 prior to the electrolytic process that is to be carried out in a subsequent step S23.

After the step of S22, the step S23 is conducted as noted above, in which the solution thus concentrated is subjected to an electrolytic process corresponding to the process of the step S11, and the precipitates obtained as a result of the electrolysis is then neutralized and cleaned by $NH_4OH$ in a step S24 corresponding to the step S11 described previously. Further, a grinding process is applied in a step S25 corresponding to the step S13, and the $MnO_2$ aggregates thus grounded is pulverized by a milling process conducted in a step S26, which corresponds to the step S14, by using water as a grinding medium. Thereby, $MnO_2$ abrasives are obtained with the particle diameter of 0.1–1 $\mu$m.

On the other hand, the liquid containing primarily $H_2SO_4$ formed in the step S23 is returned to the step S21 for reuse.

Further, a step for introducing $H_2S$ into the electrolytic solution similar to the step S3 of FIG. 13 or FIG. 15 may be added between the step S21 and the step S22 for removing impurity metal elements such as W, Cu or Mo.

[Eighth Embodiment]

A similar recovery and recycling process of the abrasives is applicable also to the of $Mn_2O_3$ or $Mn_3O_4$ abrasives.

Figure 20:
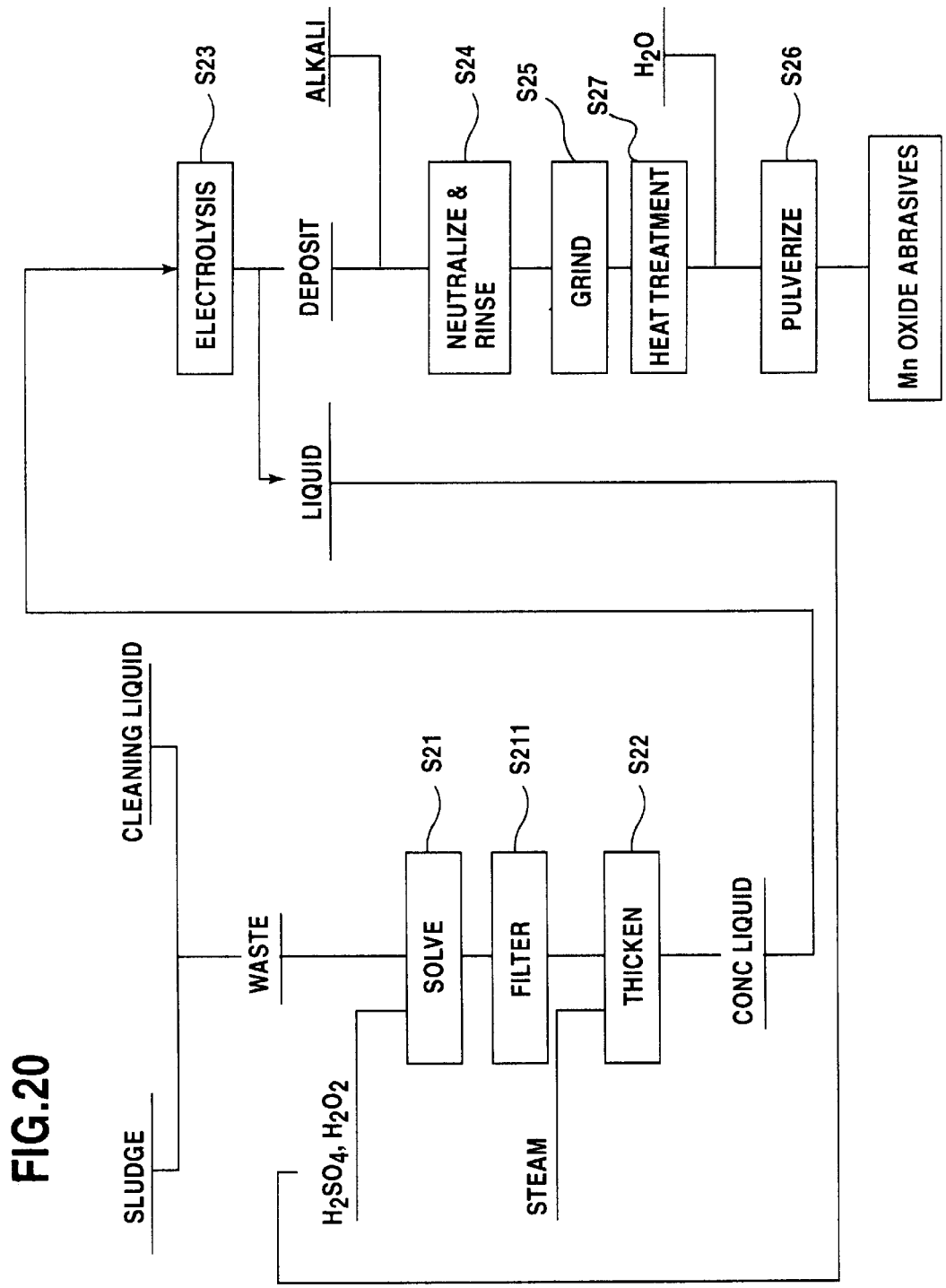
FIG. 20 is a flowchart showing a process for recycling a $Mn_2O_3$ or $Mn_3O_4$ slurry according to an eighth embodiment of the present invention.

FIG. 20 shows a flowchart of such a recovery and recycling process according to an eighth embodiment of the present invention for the $Mn_2O_3$ or $Mn_3O_4$ abrasives, wherein those steps described previously are designated by the same reference numerals and the description thereof will be omitted.

Referring to FIG. 20, a process similar to the process of FIG. 19 is carried out also when recycling the $Mn_2O_3$ or $Mn_3O_4$ abrasives, except that a heat treatment step S27 is provided between the grinding step S25 and the pulverizing step S26. The heat treatment step S27 corresponds to the heat treatment step S15 and is conducted in the air at a temperature of 500–900° C. for several minutes when the $Mn_2O_3$ abrasives are to be reproduced. When the $Mn_3O_4$ abrasives are to be reproduced, on the other hand, the $\tau$-phase $MnO_2$ aggregates obtained in the electrolytic process is heated in the air at the temperature of 900–1200° C. for several minutes.

Figure 21:
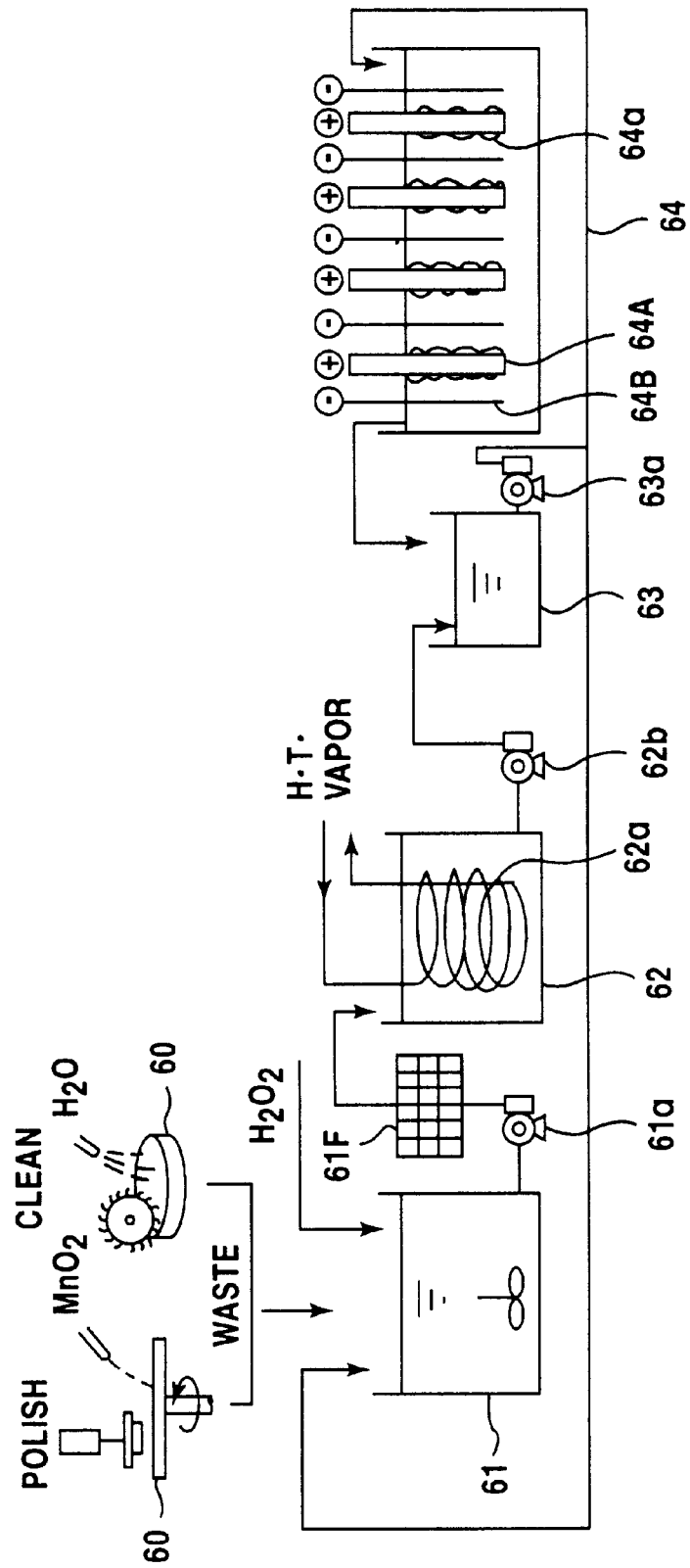
FIG. 21 is a diagram showing an apparatus used in the seventh or eighth embodiment of the present invention for recycling.

FIG. 21 shows the construction for carrying out the process of FIG. 19 or FIG. 20.

Referring to FIG. 21, the waste slurry or sludge formed as a result of the polishing step or cleaning step of a wafer 60 is recovered in a tank 61 that contains an aqueous solution of $H_2SO_4$ and $H_2O_2$, wherein the manganese oxide abrasives in the sludge is dissolved into the foregoing aqueous solution. The aqueous solution thus dissolved the recovered abrasives is then supplied by a pump 61a to a concentration tank 62 via a filter 61F for removal of the particulate impurities, wherein the aqueous solution is concentrated in the tank 62 by an evaporation process of $H_2O$ caused by a coiled heat exchanger 62a to which a high temperature steam is supplied. Alternatively, it is possible to use a filter such as a rotary filter press in place of the concentration tank 62.

The solution thus concentrated is then supplied to a tank 63 and further therefrom to an electrolytic bath 64 for electrolysis. As indicated in FIG. 21, the electrolytic bath 64 is provided with anode electrodes 64A of Ti, Pb or a graphite and further with cathode electrodes 64B of a graphite, such that the anode electrodes 64A and the cathode electrodes 64B are arranged alternately. As a result of the electrolysis, a precipitate 64a of $\tau$-$MnO_2$ is formed on the anode electrode 64A.

After the electrolysis, the electrolytic solution in the bath 64, primarily containing $H_2SO_4$, is returned to the tank 13 and is resupplied to the bath 64 together with a solution newly supplied to the tank 63. Further, a part of the aqueous solution in the tank 63 is returned to the tank 61 for reuse.

By carrying out the process of FIG. 19 or 20 in the facility of FIG. 21, it is possible to form a high purity $\tau$-$MnO_2$ which is substantially free from Na and K. As the solution remaining in the electrolytic bath 64 after the electrolysis therein contains $H_2SO_4$ as a primary component, such a system is advantageous to construct a closed system that returns the used solution to the tank 61 as indicated by the step S21 in the process of FIG. 17 or 18.

The following Table VI compares the impurity concentration in a CMD (chemically synthesized $MnO_2$) abrasive with the impurity concentration in an EMD (electrolytic $\tau$-$MnO_2$) abrasive obtained according to the process of the present invention before and after the use.

TABLE VI

|  | Na | K | Fe | Al | W |
| --- | --- | --- | --- | --- | --- |
| CMD (fresh) | 1020 | 1870 | 3200 | 3870 | 450 |
| EMD (fresh) | 80 | 77 | 67 | 12 | 438 |
| CMD (used) | 560 | 1480 | 3010 | 2430 | 100 |
| EMD (used) | 20 | 20 | 27 | 7 | 25 |

Referring to Table VI, it should be noted that the impurity concentration level is lower after the use in any of the CMD and EMD abrasives.

In the process of FIG. 21, it should be noted that the reproducing of the abrasives using the tanks 61–64 can be implemented in a separate plant. In such a case, however, it is necessary to transport the recovered sludge from the plant in which the production of semiconductor devices is made to the plant in which the reproducing of the abrasives is made.

In order to reduce the cost of the transportation, it is advantageous to use a trap shown in FIG. 22.

Referring to FIG. 22, it should be noted that the trap is formed in a large sedimentation tank 70 divided into a plurality of sedimentation cells 73A–73D by a plurality of compartment walls 72. Thus, the recovered sludge, which is typically diluted by a large amount of cleaning liquids as noted already, is introduced first into the sedimentation cell 73A through an inlet 71. The recovered slurry thus introduced then flows consecutively by overflowing the compartments 72 and runs out from an outlet 74d. Thereby, the used abrasives are recovered in each of the cells 73A–73D in the form of sludges 73a–73d. By recovering the sludges, it is possible to reduce the cost of transportation substantially.

[Ninth Embodiment]

Next, a pulverizing process according to a ninth embodiment of the present invention will be described, wherein it should be noted that the pulverization process of the present embodiment may be used in any of the preceding embodiments for pulverizing the manganese oxide aggregates.

As already noted with reference to the processes of FIGS. 15 and 16 or the processes of FIGS. 19 and 20, the pulverizing step S14 or the pulverizing step S26 carries out the pulverizing of the already ground manganese oxide aggregates in a ball mill using alumina beads or zirconia beads typically having a diameter of about 1 mm in the presence of water acting as a dispersion medium, such that the obtained manganese oxide abrasives have a diameter of 0.1–1 μm.

In the experimentation of the pulverizing step, the inventor of the present invention discovered that the obtained manganese oxide abrasives including those formed of $MnO_2$, $Mn_2O_3$ and $Mn_3O_4$, show a poor dispersion in a solvent forming a slurry when the proportion of the solid phase in the ball mill is excessive with respect to the water. It is believed that the manganese oxide particles cause a coagulation when the pulverization is conducted with a high proportion of the solid phase. Once coagulated, it is extremely difficult to disperse the particles.

When the proportion of the solid phase is reduced at the time of milling, on the other hand, the probability of the alumina or zirconia beads to cause a contact with each other increases substantially, and the attrition of the beads becomes excessive.

Thus, in the present embodiment, a high proportion is used for the concentration of the solid phase in the initial period of the milling process for decreasing the attrition of the beads and simultaneously increasing the efficiency of the milling. Further, in order to prevent the coagulation of the pulverized manganese oxide abrasives, the present embodiment decreases the proportion of the solid phase in the final period of the milling process.

FIG. 23 shows the change of the solid phase in a suspension according to a ninth embodiment of the present invention, in which the $MnO_2$ abrasives are suspended with the concentrations of 50 wt %, 40 wt %, 30 wt %, 15 wt %, 10 wt % and 5 wt %, wherein the horizontal axis represents the elapsed time from the preparation of the suspension while the vertical axis represents the relative change of the solid phase proportion in the suspension with respect to the initial state of the suspension.

In the experiment of FIG. 23, it should be noted that the pulverization was conducted such that the average diameter of the $MnO_2$ abrasives is about 0.1 μm, and the suspension was prepared by adding a suitable amount of water for those abrasives in which the pulverization was made with the solid phase proportion of 50 wt %, 40 wt %, 30 wt % and 15 wt %, such that the suspension contains the solid phase abrasives with the proportion of 10 wt %. On the other hand, those abrasives pulverized with the solid phase proportion of 10 wt % and 5 wt % were used as they are in the experiment of FIG. 23.

As will be seen clearly in FIG. 23, the $MnO_2$ abrasives cause a rapid sedimentation when the solid phase concentration is set to 30 wt % or more in the final period of the milling process, while this leads to a large change of concentration of the suspended abrasives in the slurry with time. This means that the slurry produced as such has a short lifetime and provides an unstable polishing characteristic that changes rapidly with time.

When the solid phase concentration is set to be 15 wt % or less in the final period of the milling process, on the other hand, the suspension contains more than 50% of the abrasives in the suspended state after 80 hours from the preparation, indicating that the abrasives thus produced provide a stable polishing characteristic for a prolonged duration when used in a slurry. Particularly, it is noted that the proportion of the suspended $MnO_2$ abrasives exceeds 60% the initial proportion when the pulverization is conducted with the solid phase proportion of 10 wt % or 5 wt % in the milling process. On the other hand, use of excessively low solid phase proportion in the milling process causes a decrease of efficiency of the milling process. Thus, it is concluded that the pulverization is conducted with the solid phase proportion of about 15 wt %.

In the actual CMP process, the slurry experiences a continuous agitation. Thus, the solid phase proportion in the slurry is maintained substantially constant in the actual CMP process when the solid phase proportion in the milling process is selected to be about 15 wt % or less.

It should be noted that the relationship for FIG. 23 holds also when pulverizing $Mn_2O_3$ abrasives or $Mn_3O_4$ abrasives.

Further, the present invention is not limited to the embodiments described heretofore, but various variations and modifications may be made without departing from the scope of the invention.

What is claimed is:

1. A method of fabricating a semiconductor device, comprising the steps of:
   forming an insulation layer on a substrate;
   forming a depression on said insulation layer;
   depositing a conductor layer on said insulation layer so as to fill said depression;
   polishing said conductor layer until said insulation layer is exposed,
   said step of polishing being carried out by a slurry consisting essentially of $MnO_2$ abrasive particles; and
   cleaning said substrate layer by dissolving said abrasive particles in an acid, said cleaning process being conducted after said step of polishing.

2. The method as claimed in claim 1, wherein said cleaning step is conducted in a mixture of said acid and an oxidant.

3. The method as claimed in claim 1, wherein said acid is selected from the group consisting of HCl, $HNO_2$, $H_2SO_4$ and HF.

4. A method of polishing an insulation film, comprising the step of:
   polishing said insulation film by a slurry comprising abrasive particles and a solvent,
   said abrasive particles being selected from the group consisting of $Mn_2O_3$, $Mn_3O_4$ and a mixture thereof.

5. A method as claimed in claim 4, wherein said insulation film is an $SiO_2$ film.

6. A method as claimed in claim 4, wherein said insulation film is a silicate glass.

7. A method as claimed in claim 6, wherein said step of polishing is conducted selectively with respect to a conductor layer or a semiconductor layer provided underneath said insulation film.

8. A method as claimed in claim 7, wherein said conductor layer is a W layer or a TiN layer.

9. A method as claimed in claim 7, wherein said semiconductor layer is a Si layer or a Si substrate.

10. A method of fabricating a semiconductor device including a polishing step, comprising the step of:
    polishing an insulation film provided on an underlying layer by a slurry with respect to said underlying layer, said underlying layer being one of a conductor layer and a semiconductor layer;

said slurry comprising: abrasive particles of manganese oxide, selected from the group consisting of $Mn_2O_3$, $Mn_3O_4$ and a mixture thereof; and a solvent in which said abrasive particles are dispersed.

11. The method as claimed in claim 10, wherein said method further comprises the steps of:

forming a groove on a semiconductor substrate; and providing said insulation film on said semiconductor substrate so as to fill said groove;

wherein said polishing step is conducted such that said insulation film is removed from a surface of said semiconductor substrate.

12. The method as claimed in claim 11, wherein said polishing step is conducted such that said surface of said substrate is exposed as a result of said polishing step.

13. The method as claimed in claim 11, wherein said polishing step is conducted such that said surface of said substrate forms a flush, planarized surface with a surface of said insulation film.

14. The method as claimed in claim 11, wherein said insulation film is an $SiO_2$ film.

15. The method as claimed in claim 11, wherein said substrate is a Si substrate.

16. The method as claimed in claim 10, wherein said method comprises the steps of:

forming an interconnection pattern on a substrate; and providing said insulation film on said substrate so as to cover said interconnection pattern;

wherein said polishing step is conducted so as to planarize said insulation film.

17. The method as claimed in claim 16, wherein said polishing step is conducted until said interconnection pattern is exposed.

18. The method as claimed in claim 16, wherein said step of forming said interconnection pattern is conducted such that said interconnection pattern is covered by a TiN layer.

19. The method as claimed in claim 10, wherein the method comprises the steps of;

providing a first insulation layer on said substrate;

forming a groove in said first insulation layer;

providing a conductor layer on said first insulation layer so as to fill said groove;

polishing said conductor layer by a slurry that contains $MnO_2$ abrasives, until said first insulation layer is exposed, said conductor layer filling said groove thereby forming a conductive pattern embedded in said groove;

providing a second insulation layer on said first insulation layer including said conductive pattern, as said insulation film;

wherein said polishing step, conducted on said insulation film by said slurry that contains manganese oxide abrasives selected from the group consisting of $Mn_2O_3$, $Mn_3O_4$ and a mixture thereof, is conducted on said second insulation layer.

20. A method as claimed in claim 16, wherein said insulation film is an $SiO_2$ film.

21. The method as claimed in claim 16, wherein said insulation film is a silicate glass film.

22. The method as claimed in claim 10, further comprising the step of, after said polishing step of said insulation film by said slurry that contains manganese oxide abrasives selected from the group consisting of $Mn_2O_3$, $Mn_3O_4$ and a mixture thereof, dissolving said manganese oxide abrasives by an acid bath.

23. The method as claimed in claim 22, wherein said acid bath contains an acid selected from the group consisting of HCl, $HNO_2$, $H_2SO_4$ and HF.

24. The method as claimed in claim 23 which further comprises the step of dissolving said manganese oxide abrasives by said acid bath.

25. The method as claimed in claim 10, wherein said slurry includes $MnO_2$, and wherein said polishing step is conducted in a solvent having an oxidation-reduction potential and pH set such that $MnO_2$ changes to $Mn_2O_3$ or $Mn_3O_4$.

* * * * *